United States Patent
Kakehata et al.

(10) Patent No.: US 8,895,388 B2
(45) Date of Patent: Nov. 25, 2014

(54) METHOD OF MANUFACTURING A SEMICONDUCTOR DEVICE AND A NON-VOLATILE SEMICONDUCTOR STORAGE DEVICE INCLUDING THE FORMATION OF AN INSULATING LAYER USING A PLASMA TREATMENT

(75) Inventors: Tetsuya Kakehata, Isehara (JP); Tomokazu Yokoi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1857 days.

(21) Appl. No.: 11/826,229

(22) Filed: Jul. 13, 2007

(65) Prior Publication Data
US 2008/0020528 A1    Jan. 24, 2008

(30) Foreign Application Priority Data
Jul. 21, 2006    (JP) ................. 2006-199740

(51) Int. Cl.
*H01L 21/336* (2006.01)
*H01L 21/28* (2006.01)
(Continued)

(52) U.S. Cl.
CPC ....... *H01L 21/02238* (2013.01); *H01L 27/1203* (2013.01); *H01L 21/28273* (2013.01); *H01L 27/12* (2013.01); *H01L 29/785* (2013.01); *H01L 21/31662* (2013.01); *H01L 27/11526* (2013.01); *H01L 27/105* (2013.01); *H01L 27/11546* (2013.01); *H01L 21/02252* (2013.01); *H01L 21/84* (2013.01); *H01L 27/1214* (2013.01)
USPC ........... 438/259; 438/211; 438/263; 438/786; 257/59; 257/213; 257/E29.3

(58) Field of Classification Search
USPC ........... 257/347, 413, 325, 316, 623, 59, 213, 257/E29.3, 66; 438/30, 769, 158, 160, 211, 438/263, 786, 775
See application file for complete search history.

(56) References Cited

U.S. PATENT DOCUMENTS 5,272,361 A    12/1993    Yamazaki
6,015,762 A    1/2000    Yamazaki et al.
(Continued)

FOREIGN PATENT DOCUMENTS

EP    1840950 A    10/2007
JP    60-170238 A    9/1985
(Continued)

OTHER PUBLICATIONS
Mitani.Y et al., "Defect Creations at Si/SiO2 interface and bulk SiO2", Workshop on Gate Stack Technology and Physics—Physics of Material, Process, and Evaluation—, Feb. 2, 2007, pp. 67-72.

*Primary Examiner* — Mark A Laurenzi
(74) *Attorney, Agent, or Firm* — Eric J. Robinson; Robinson Intellectual Property Law Office, P.C.

(57) ABSTRACT

An object is to provide a technique for manufacturing an insulating layer with favorable withstand voltage. Another object is to provide a technique for manufacturing a semiconductor device having an insulating layer with favorable withstand voltage. By subjecting a semiconductor layer or semiconductor substrate mainly containing silicon to a high density plasma treatment, an insulating layer is formed on a surface of the semiconductor layer or a top surface of the semiconductor substrate. At this time, the high density plasma treatment is performed by switching a supply gas in the middle of the treatment from a gas containing a rare gas, oxygen, and hydrogen, to a gas containing a rare gas and oxygen.

30 Claims, 27 Drawing Sheets

(51) Int. Cl.
*H01L 21/02* (2006.01)
*H01L 21/316* (2006.01)
*H01L 27/115* (2006.01)
*H01L 27/105* (2006.01)
H01L 27/12 (2006.01)
H01L 29/78 (2006.01)
H01L 21/84 (2006.01)

(56) References Cited

U.S. PATENT DOCUMENTS

| | | |
|---|---|---|
| 6,818,852 B2 | 11/2004 | Ohmi et al. |
| 6,975,018 B2 * | 12/2005 | Ohmi et al. .................. 257/629 |
| 7,875,322 B2 | 1/2011 | Kobayashi et al. |
| 2002/0020497 A1 | 2/2002 | Ohmi et al. |
| 2002/0048864 A1 * | 4/2002 | Yamazaki et al. ............ 438/151 |
| 2004/0050494 A1 | 3/2004 | Ohmi et al. |
| 2004/0070046 A1 * | 4/2004 | Niimi .......................... 257/510 |
| 2004/0135193 A1 * | 7/2004 | Lee et al. ..................... 257/315 |
| 2005/0136597 A1 * | 6/2005 | Shinada et al. .............. 438/263 |
| 2005/0202183 A1 * | 9/2005 | Matsuda et al. .............. 427/569 |
| 2006/0133171 A1 * | 6/2006 | Tonda .......................... 365/210 |
| 2006/0246633 A1 | 11/2006 | Arai et al. |
| 2006/0246640 A1 | 11/2006 | Kuwashima et al. |
| 2006/0246644 A1 | 11/2006 | Isobe et al. |
| 2006/0246738 A1 | 11/2006 | Isobe et al. |
| 2006/0270066 A1 | 11/2006 | Imahayashi et al. |
| 2006/0275710 A1 | 12/2006 | Yamazaki et al. |
| 2007/0037352 A1 | 2/2007 | Suzawa et al. |
| 2007/0228420 A1 | 10/2007 | Takano et al. |
| 2009/0258479 A1 | 10/2009 | Takano et al. |
| 2011/0095354 A1 | 4/2011 | Takano et al. |
| 2012/0037978 A1 | 2/2012 | Takano et al. |

FOREIGN PATENT DOCUMENTS

| | | |
|---|---|---|
| JP | 03-036769 A | 2/1991 |
| JP | 2000-036484 A | 2/2000 |
| JP | 2002-170820 | 6/2002 |
| JP | 2004-111506 A | 4/2004 |
| JP | 2006-190877 A | 7/2006 |

* cited by examiner 422  424     426  428

640  642  644     646  648  650

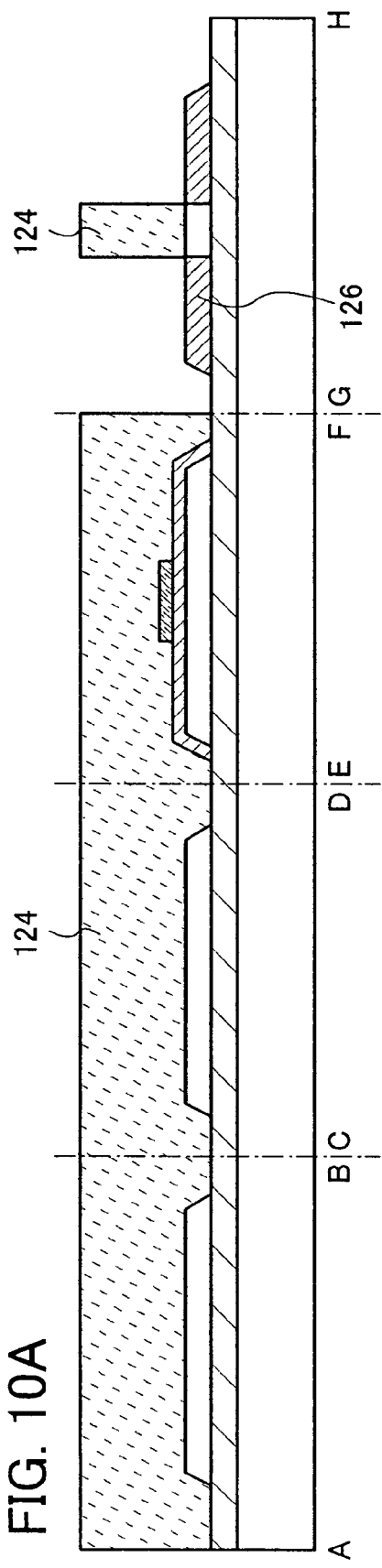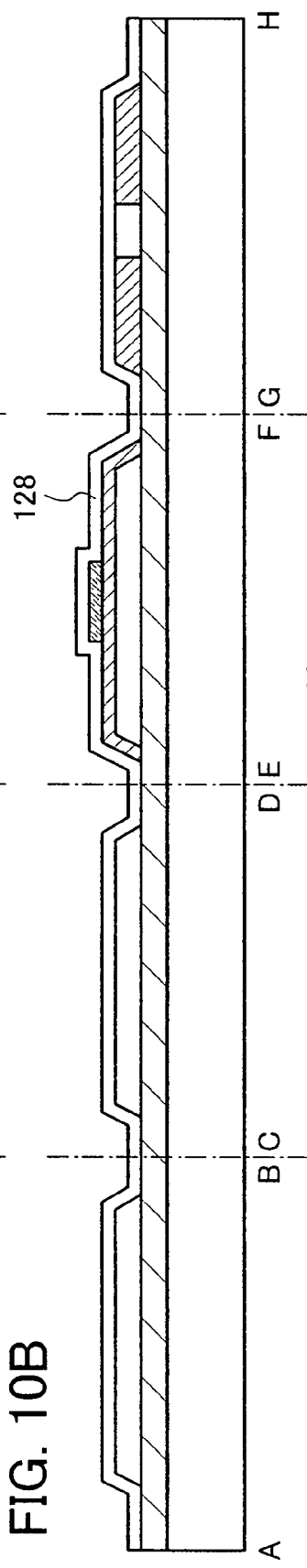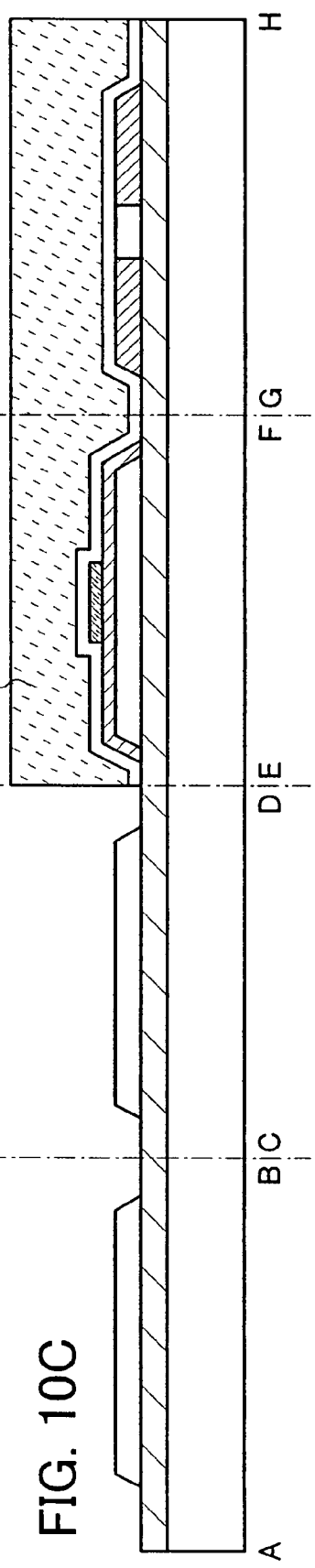
FIG. 10A
FIG. 10B
FIG. 10C

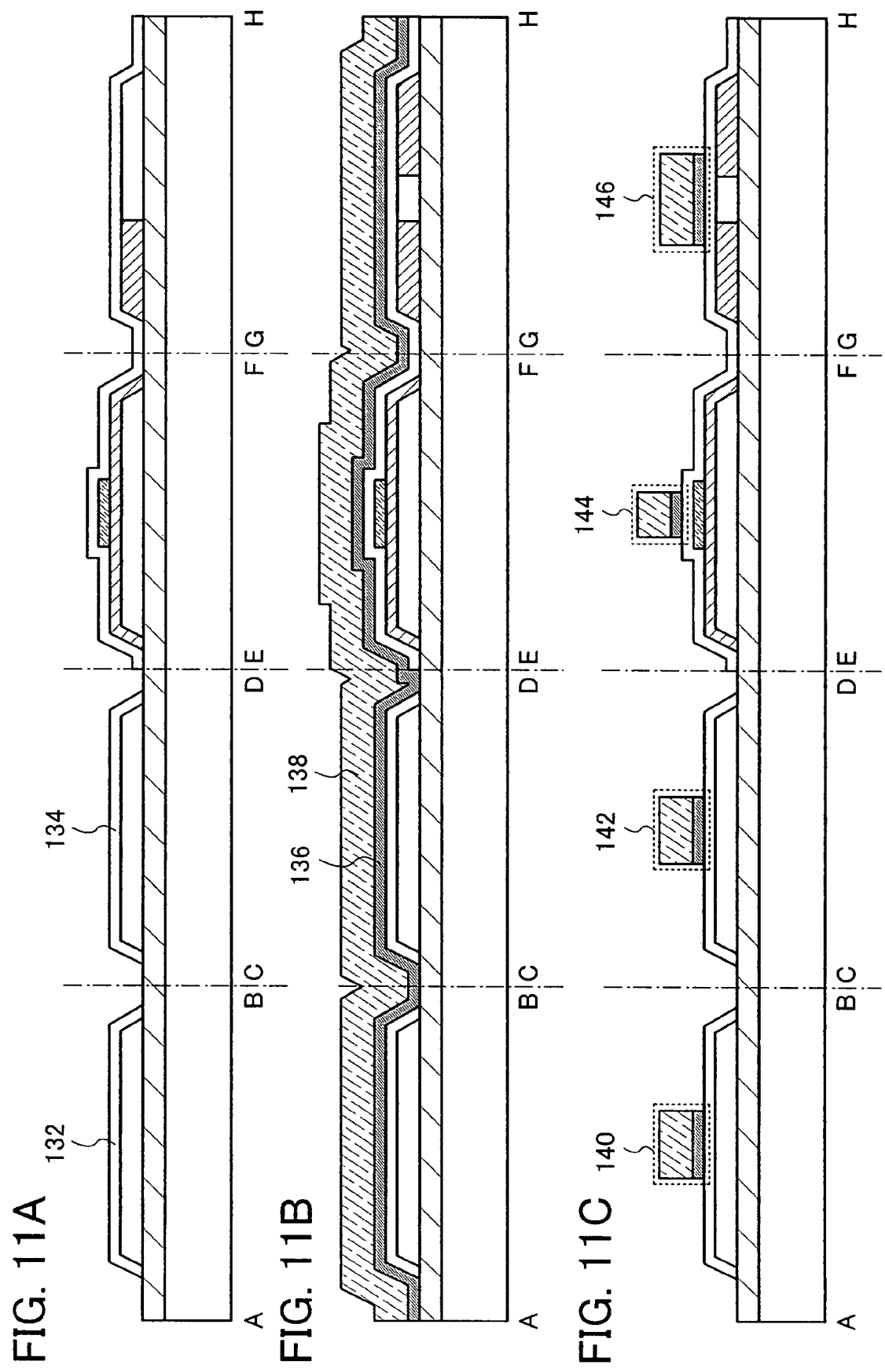

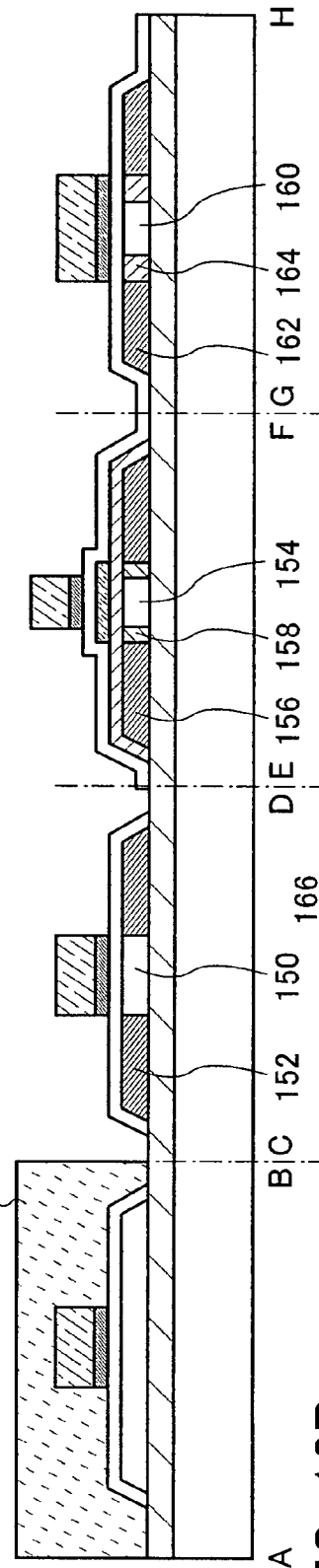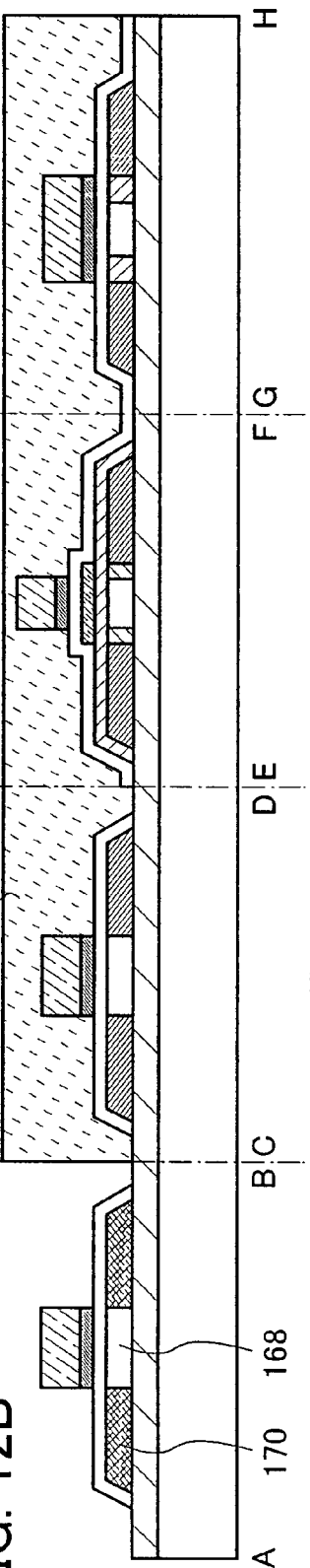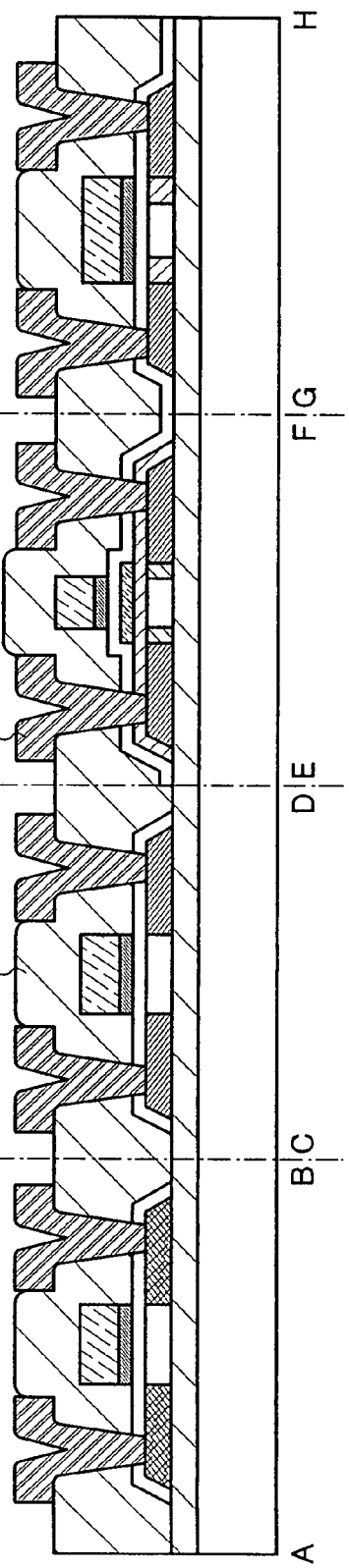

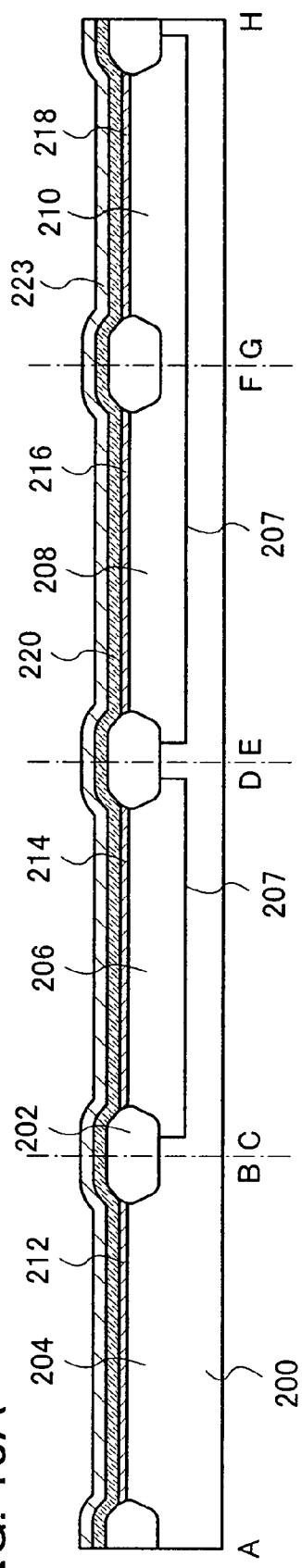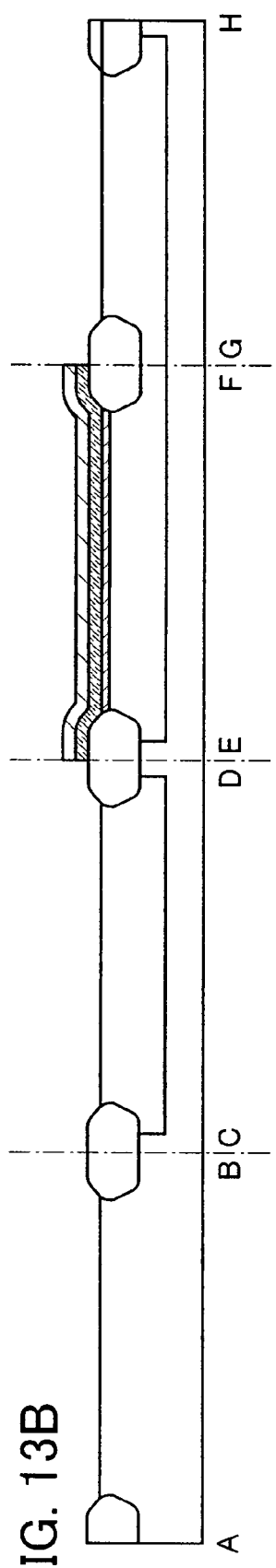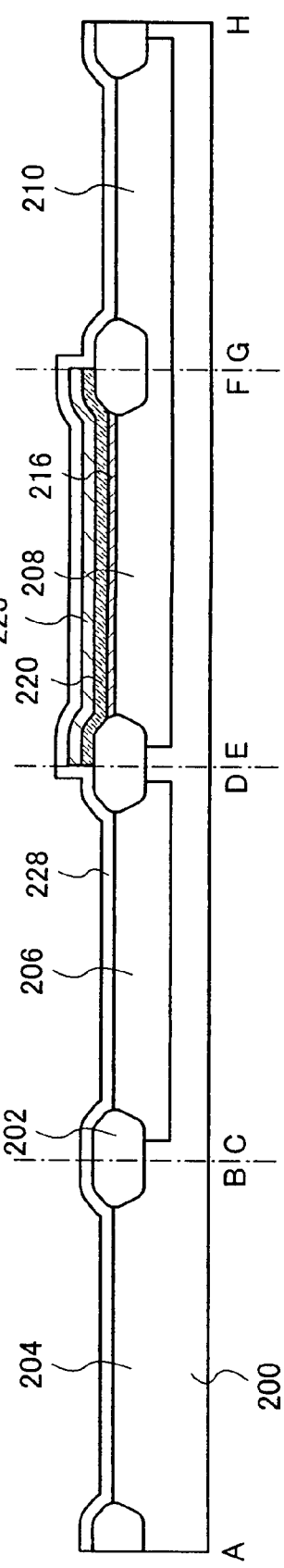

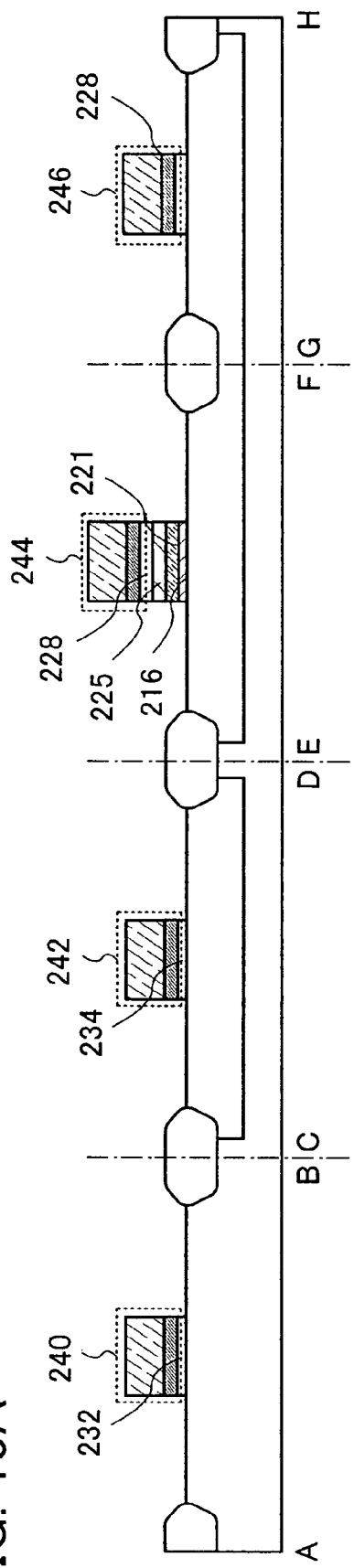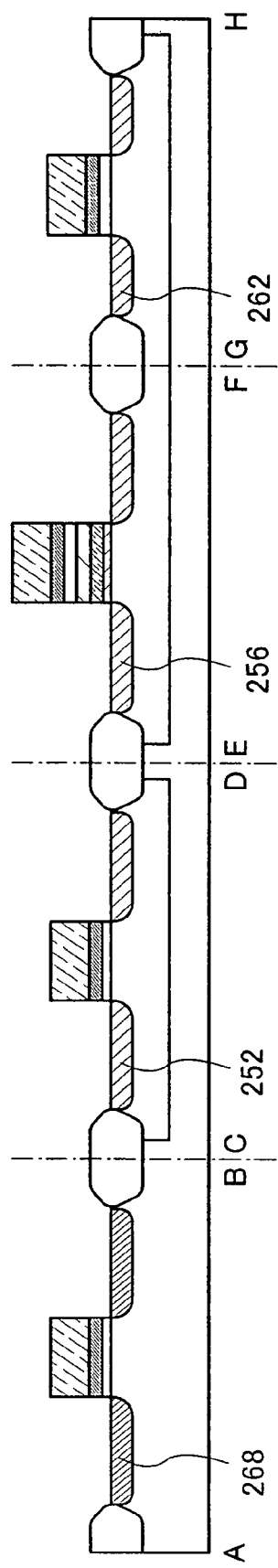

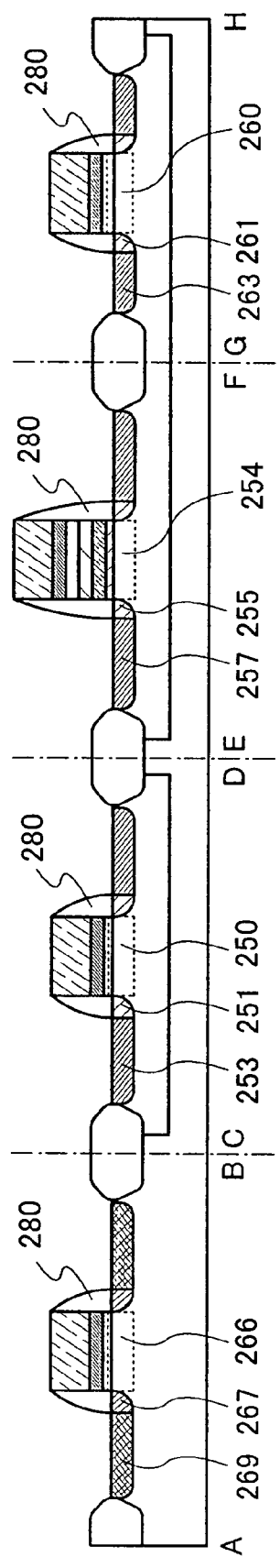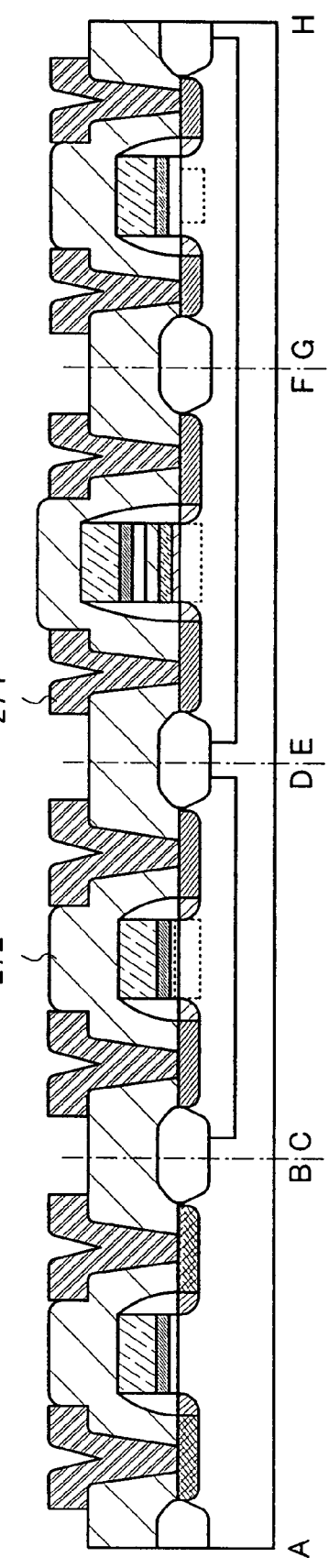
FIG. 16A
FIG. 16B

FIG. 17
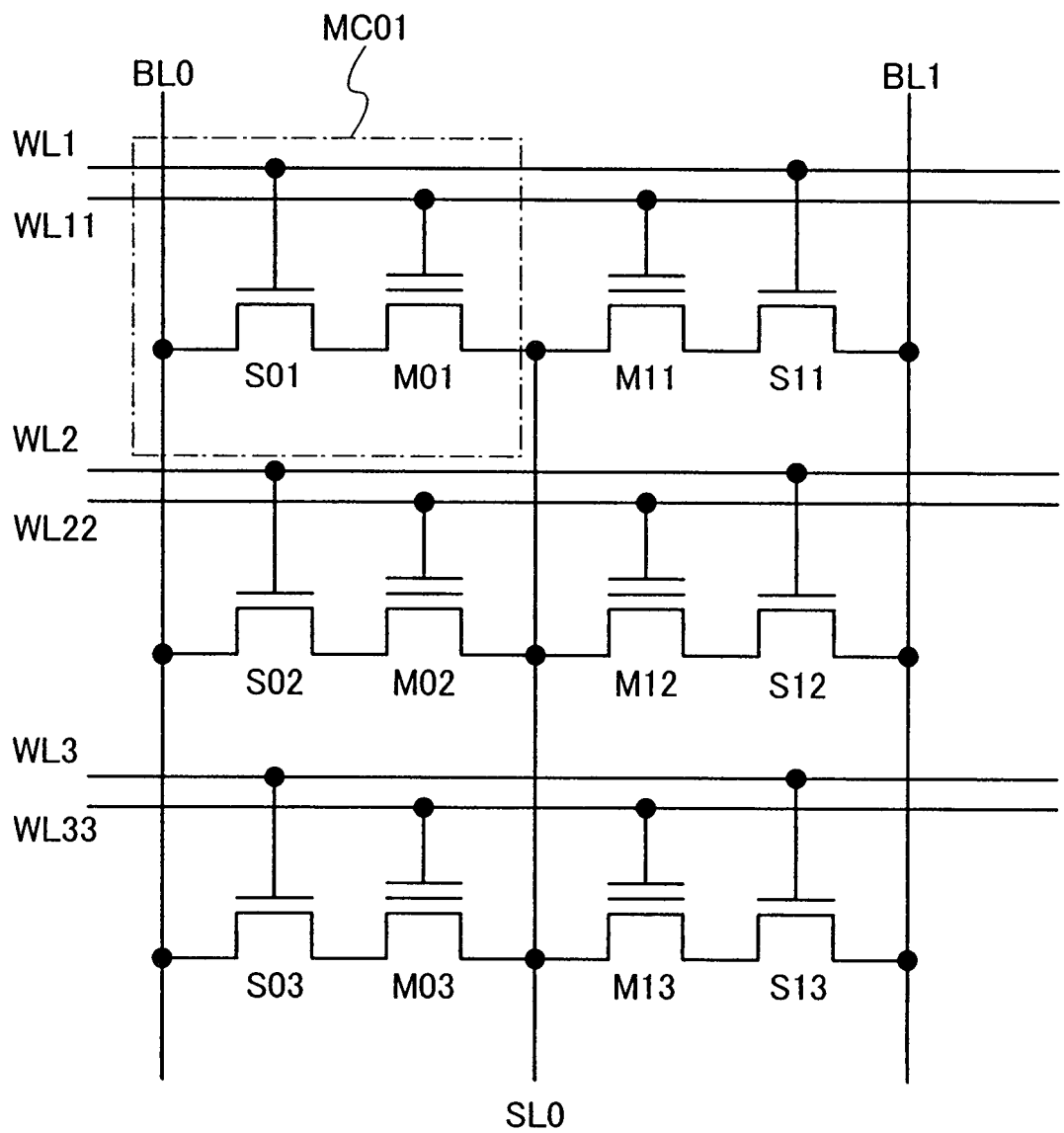
 memory cell

"0" writing

"1" writing erasing reading

METHOD OF MANUFACTURING A SEMICONDUCTOR DEVICE AND A NON-VOLATILE SEMICONDUCTOR STORAGE DEVICE INCLUDING THE FORMATION OF AN INSULATING LAYER USING A PLASMA TREATMENT

BACKGROUND OF THE INVENTION

1. Field of the Invention

The present invention relates to a method of manufacturing a semiconductor device or a nonvolatile semiconductor storage device. The present invention particularly relates to a method of manufacturing an insulating layer composing the semiconductor device or the nonvolatile semiconductor storage device.

2. Description of the Related Art

In recent years, along with the development of integrated circuits, a variety of high-function elements, and the like, miniaturization of the elements has also progressed. Consequently, thinning of insulating layers typified by gate insulating layers of transistors has also been considered. However, when the gate insulating layers are thinned, the effect of dielectric breakdown of the gate insulating layers becomes significant. Therefore, there is demand for insulating layers with favorable withstand voltage.

In general, it is known that favorable insulating layers can be obtained using a thermal oxidation method; however, since a high temperature treatment at about 1000° C. is necessary, glass substrates which are weak against heat cannot be used.

Accordingly, a technique in which thin insulating layers are manufactured by a relatively low temperature treatment using an oxygen radical has been researched. For example, in Patent Document 1: Japanese Published Patent Application No. 2002-170820, it is mentioned that using a high-frequency wave such as a microwave, high-density oxygen plasma is generated using a mixed gas containing at least oxygen, and an insulating films is formed on a silicon film surface using the oxygen radical generated by the oxygen plasma. It is also mentioned in Patent Document 1 that oxidation rate of the oxygen plasma can be increased by using a gas containing a rare gas, water ($H_2O$), or the like in addition to oxygen.

SUMMARY OF THE INVENTION

However, when an insulating layer is formed using a mixed gas containing oxygen and a rare gas, it is difficult to form a film with a thickness of about 10 nm. Also, when an insulating layer is formed using a mixed gas containing oxygen, a rare gas, and hydrogen, withstand voltage of the insulating layer is poor.

In view of the foregoing, an object of the present invention is to form an insulating layer with favorable withstand voltage and a desirable film thickness.

In regards to dielectric breakdown of a gate insulating layer, it is known that there are three types of dielectric breakdown modes, which are A mode, B mode, and C mode. Specifically, A mode is dielectric breakdown with a dielectric breakdown electric field of less than or equal to 1 MV/cm that is caused by a short circuit due to a pinhole or the like; B mode is dielectric breakdown with a dielectric breakdown electric field of less than 8 MV/cm that is caused by a defect of electrical weakness such as a local leak current or the like; and C mode is dielectric breakdown with a dielectric breakdown electric field of more than or equal to 8 MV/cm that is caused by an intrinsic dielectric breakdown of the insulating layer itself. Malfunction in the A mode becomes a large factor in reducing yield, and malfunction in the B mode becomes a large factor in reducing reliability. Accordingly, one feature of the present invention is to manufacture a semiconductor device having a withstand voltage with which dielectric breakdown, particularly those in the A mode and the B mode, does not occur. A specific method will hereinafter be described.

One feature of the present invention is to form an insulating layer on a surface of a semiconductor layer or a top surface of a semiconductor substrate, by subjecting the semiconductor layer or the semiconductor substrate mainly containing silicon to a high density plasma treatment. Another feature of the present invention is that the high density plasma treatment is performed by switching a supply gas in the middle of the treatment from a gas containing a rare gas, oxygen, and hydrogen, to a gas containing a rare gas and oxygen.

In the high density plasma treatment, it is preferable to use plasma that is excited by a high frequency wave and which has an electron density of more than or equal to $1 \times 10^{11}$ cm$^{-3}$ and an electron temperature of lower than or equal to 1.5 eV. Specifically, the plasma treatment is preferably performed by using plasma that is excited by a high frequency wave such as a microwave (typically 2.45 GHz) and which has an electron density of more than or equal to $1 \times 10^{11}$ cm$^{-3}$ and less than or equal to $1 \times 10^{13}$ cm$^{-3}$, and an electron temperature of higher than or equal to 0.5 eV and lower than or equal to 1.5 eV.

Also, in the high density plasma treatment, the supply gas may be switched from a gas containing a rare gas, oxygen, and hydrogen to a gas containing a rare gas and oxygen while the high frequency wave is input to continuously generate the plasma. Alternatively, the supply gas may be switched after temporarily stopping the plasma generation by stopping the input of the high frequency wave, and then the input of the high frequency wave may be started again. Note that when the gas is switched in the high density plasma treatment, it is preferably performed continuously without exposure to the atmosphere.

One feature of a specific structure of the present invention is that a semiconductor layer mainly containing silicon is formed over a substrate, and the semiconductor layer is subjected to a high density plasma treatment using a gas containing a rare gas, oxygen, and hydrogen as a supply gas, and then to a high density plasma treatment in which the supply gas is switched to a gas containing a rare gas and oxygen, thereby forming an insulating layer on a surface of the semiconductor layer.

One feature of another structure of the present invention is that a semiconductor substrate mainly containing silicon is subjected to a high density plasma treatment using a gas containing a rare gas, oxygen, and hydrogen as a supply gas, and then to a high density plasma treatment in which the supply gas is switched to a gas containing a rare gas and oxygen, thereby forming an insulating layer on a top surface of the semiconductor substrate.

One feature of yet another structure of the present invention is that a plurality of grooves are provided in a semiconductor substrate mainly containing silicon, a first insulating layer is formed over the grooves and the semiconductor substrate, the first insulating layer is ground until a top surface of the semiconductor substrate is exposed, a second insulating layer for element isolation is formed, and the semiconductor substrate is subjected to a high density plasma treatment using a gas containing a rare gas, oxygen, and hydrogen as a supply gas, and then to a high density plasma treatment in which the supply gas is switched to a gas containing a rare gas and oxygen, thereby forming a third insulating layer on the top surface of the semiconductor substrate.

Also, one feature of the present invention is that the insulating layer formed on the surface of the semiconductor layer or the top surface of the semiconductor substrate is silicon oxide layer.

Further, one feature of the present invention is that the high density plasma treatment is performed using plasma that is excited by a high frequency wave and which has an electron density of more than or equal to $1\times10^{11}$ cm$^{-3}$ and an electron temperature of lower than or equal to 1.5 eV.

Furthermore, one feature of the present invention is that when the supply gas is switched, the high density plasma treatment is continuously performed without exposure to the atmosphere.

Also, one feature of a structure of the present invention is that a semiconductor layer mainly containing silicon is formed over a substrate; a first insulating layer is formed on a surface of the semiconductor layer by subjecting the semiconductor layer to a high density plasma treatment using a gas containing a rare gas, oxygen, and hydrogen as a supply gas, and then to a high density plasma treatment in which the supply gas is switched to a gas containing a rare gas and oxygen; a first gate electrode is formed over the semiconductor layer with the first insulating layer therebetween; a second insulating layer is formed over the first gate electrode; a second gate electrode is formed over the first gate electrode with the second insulating layer therebetween; and an impurity element is added using the second gate electrode as a mask, thereby forming an impurity region in the semiconductor layer.

Further, one feature of another structure is that a first insulating layer is formed over a top surface of a semiconductor substrate mainly containing silicon by subjecting the semiconductor substrate to a high density plasma treatment using a gas containing a rare gas, oxygen, and hydrogen as a supply gas, and then to a high density plasma treatment in which the supply gas is switched to a gas containing a rare gas and oxygen; a first gate electrode is formed over the semiconductor substrate with the first insulating layer therebetween; a second insulating layer is formed over the first gate electrode; a second gate electrode is formed over the first gate electrode with the second insulating layer therebetween; and an impurity element is added using the second gate electrode as a mask, thereby forming an impurity region in the semiconductor substrate.

Furthermore, one feature of yet another structure is that a plurality of grooves are provided in a semiconductor substrate mainly containing silicon; a first insulating layer is formed over the grooves and the semiconductor substrate; the first insulating layer is ground until a top surface of the semiconductor substrate is exposed; a second insulating layer for element isolation is formed; a third insulating layer is formed on the top surface of the semiconductor substrate by subjecting the semiconductor substrate to a high density plasma treatment using a gas containing a rare gas, oxygen, and hydrogen as a supply gas, and then to a high density plasma treatment in which the supply gas is switched to a gas containing a rare gas and oxygen; a first gate electrode is formed over the semiconductor substrate with the third insulating layer therebetween; a fourth insulating layer is formed over the first gate electrode; a second gate electrode is formed over the first gate electrode with the fourth insulating layer therebetween; and an impurity element is added using the second gate electrode as a mask; thereby forming an impurity region in the semiconductor substrate.

Also, in the present invention, the insulating layer formed on the surface of the semiconductor layer or the top surface of the semiconductor substrate is a silicon oxide layer.

Further, one feature of the present invention is that the high density plasma treatment is performed using plasma that is excited by a high frequency wave, and which has an electron density of more than or equal to $1\times10^{11}$ cm$^{-3}$ and an electron temperature of lower than or equal to 1.5 eV is used.

Furthermore, one feature of the present invention is that when the supply gas is switched, the high density plasma treatment is continuously performed without exposure to the atmosphere.

In addition, one feature of the present invention is that the first gate electrode serves as a floating gate electrode and the second gate electrode serves as a control gate electrode.

By using the present invention, an insulating layer with favorable withstand voltage can be formed. Accordingly, by forming the insulating layer with high withstand voltage as a gate insulating layer, a semiconductor device or a nonvolatile semiconductor storage device that is highly reliable can be manufactured. Also, yield of the semiconductor device or the nonvolatile semiconductor storage device can be improved.

BRIEF DESCRIPTION OF DRAWINGS

In the accompanying drawings:

FIGS. 10A to 10C show an example of a manufacturing method of a nonvolatile semiconductor storage device of the present invention;

FIGS. 11A to 11C show an example of a manufacturing method of a nonvolatile semiconductor storage device of the present invention;

FIGS. 12A to 12C show an example of a manufacturing method of a nonvolatile semiconductor storage device of the present invention;

FIGS. 13A to 13C show an example of a manufacturing method of a nonvolatile semiconductor storage device of the present invention;

FIGS. 15A and 15B show an example of a manufacturing method of a nonvolatile semiconductor storage device of the present invention;

FIGS. 16A and 16B show an example of a manufacturing method of a nonvolatile semiconductor storage device of the present invention;

FIG. 17 shows an example of an equivalent circuit of a nonvolatile memory cell array;

DETAILED DESCRIPTION OF THE INVENTION

Figure 1A:
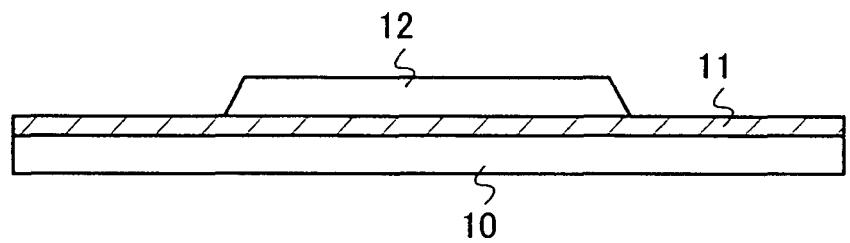
FIGS. 1A to 1C show an example of a manufacturing method of an insulating layer of the present invention.

Embodiment modes and an embodiment of the present invention will be explained below with reference to the drawings. However, it is to be easily understood by those skilled in the art that the present invention is not limited to the description below and the modes and details of the present invention can be changed in various ways without departing from the spirit and scope of the present invention. Therefore, the present invention should not be interpreted as being limited to the description of the embodiment modes and the embodiment below. Note that in the following description of the present invention, reference numerals denoting identical portions may be used in common in different drawings.

Embodiment Mode 1

In the present invention, when a semiconductor layer or a semiconductor substrate mainly containing silicon is subjected to a high density plasma treatment to form an insulating layer on a surface of the semiconductor layer or the semiconductor substrate, a supply gas is switched. Here, an example of performing a high density plasma treatment on a semiconductor layer is described with reference to FIGS. 1A to 1C.

First, a semiconductor layer 12 is formed over a substrate 10 with a base insulating layer 11 therebetween (see FIG. 1A). As the substrate 10, a substrate having an insulating surface is used. For example, a glass substrate, a quartz substrate, a sapphire substrate, a ceramic substrate, a metal substrate with an insulating layer formed over a surface, or the like can be used.

The base insulating layer 11 is formed by a CVD method or a sputtering method using an insulating material such as silicon oxide ($SiO_x$), silicon nitride ($SiN_x$), silicon oxynitride ($SiO_xN_y$) (x>y>0), or silicon nitride oxide ($SiN_xO_y$) (x>y>0). The base insulating layer 11 may have a single-layer structure or a stacked-layer structure. The base insulating layer 11 serves as a blocking layer that prevents contamination of the semiconductor layer 12 by diffusion of an impurity such as an alkali metal to the semiconductor layer 12 from the substrate 10. In addition, the base insulating layer 11 can also serve as a layer for planarization when a surface of the substrate 10 is uneven. Note that the base insulating layer 11 does not need to be formed if impurity diffusion from the substrate 10 or unevenness of the substrate 10 is not a problem.

The semiconductor layer 12 is formed by a CVD method or a sputtering method using a material mainly containing silicon. For example, as the material mainly containing silicon, silicon (Si) or silicon germanium ($Si_xGe_{(1-x)}$) is used. For example, as the semiconductor layer 12, an island-shaped semiconductor layer can be formed by forming an amorphous semiconductor layer using the material mainly containing silicon, and then selectively etching a crystalline semiconductor layer which is the amorphous semiconductor layer that is crystallized. Crystallization of the amorphous semiconductor layer can be performed by a laser crystallization method, a thermal crystallization method using RTA or an annealing furnace, a thermal crystallization method using a metal element that promotes crystallization, a method combining these methods, or the like.

Next, an insulating layer is formed on a surface of the semiconductor layer 12 by subjecting the semiconductor layer 12 to a high density plasma treatment. In the present invention, first, the high density plasma treatment is performed using a gas containing a rare gas, oxygen, and hydrogen as a supply gas to form an insulating layer 14 (see FIG. 1B). Then, the supply gas is switched to a gas containing a rare gas and oxygen and the high density plasma treatment is performed to form an insulating layer 16 (see FIG. 1C).

Figure 2:
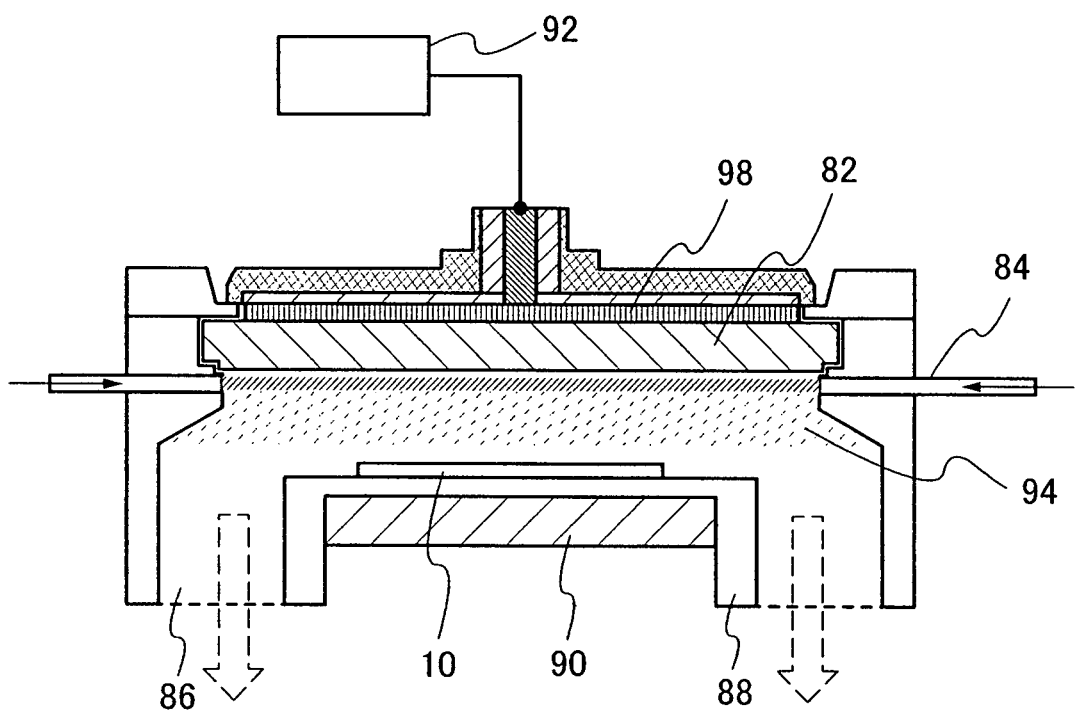
FIG. 2 shows an example of an apparatus for manufacturing an insulating layer of the present invention.

Here, a structure example of a plasma treatment apparatus 80 for performing the high density plasma treatment is shown in FIG. 2. The plasma treatment apparatus 80 includes a supporting base 88; a gas supplying portion 84 for supplying gas; an exhaust opening 86 that is connected to a vacuum pump for venting the gas; an antenna 98; a dielectric plate 82; and a high frequency wave supplying portion 92 for inputting a high frequency wave for plasma generation. The substrate 10 is held by the supporting base 88. Also, by providing a temperature controlling portion 90 for the supporting base 88, temperature of the substrate 10 can be controlled.

A specific example of forming an insulating layer on a semiconductor layer surface, using the plasma treatment apparatus 80 shown in FIG. 2, is described below.

First, a treatment chamber of the plasma treatment apparatus 80 shown in FIG. 2 is evacuated. Then, a gas containing a rare gas, oxygen, and hydrogen (hereinafter also referred to as a "first supply gas") is supplied from the gas supplying portion 84. The first supply gas is preferably supplied with a flow rate of rare gas:oxygen:hydrogen that is in a range of 100:1:1 to 200:1:1 inclusive.

The substrate 10 is heated at room temperature or at a temperature in a range of 100° C. to 500° C. inclusive by the temperature controlling portion 90. A distance between the substrate 10 and the dielectric plate 82 (hereinafter also referred to as a "electrode distance") is about 20 mm to 200 mm inclusive (preferably, 20 mm to 60 mm inclusive).

Next, a high frequency wave is input from the high frequency wave supplying portion 92 to the antenna 98. Here, a microwave (frequency of 2.45 GHz) is input as the high frequency wave. Then, by inputting the microwave to the treatment chamber from the antenna 98 via the dielectric plate 82, plasma 94 is generated, and an oxygen radical is generated by the plasma 94. At the time, the plasma 94 is generated by the first supply gas that is supplied.

Figure 1B:
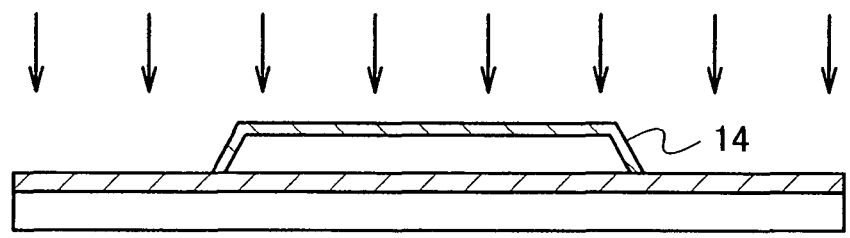

By generating the plasma 94 by inputting the microwave, plasma with a low electron temperature (less than or equal to 3 eV, preferably less than or equal to 1.5 eV) and a high electron density (more than or equal to $1 \times 10^{11}$ cm$^{-3}$) can be generated. Specifically, plasma with an electron temperature of 0.5 eV to 1.5 eV inclusive, and an electron density of $1 \times 10^{11}$ cm$^{-3}$ to $1 \times 10^{13}$ cm$^{-3}$ inclusive is preferably generated. Note that in this specification, plasma with low electron temperature and high electron density generated by inputting the microwave is also called "high density plasma." Then, by the oxygen radical generated by the plasma 94, the insulating layer 14 is formed on the surface of the semiconductor layer 12 as shown in FIG. 1B. In the high density plasma treatment performed here using the gas containing a rare gas, oxygen, and hydrogen, the insulating layer 14 is preferably formed to have a film thickness of more than or equal to 8 nm.

Then, supply of hydrogen gas from the gas supplying portion 84 is stopped, and the supply gas is switched to a gas containing a rare gas and oxygen (hereinafter also referred to as a "second supply gas"). The second supply gas is preferably supplied with a flow rate of rare gas:oxygen that is in a range of 100:1 to 200:1 inclusive. Further, the second supply gas may contain hydrogen as long as it is in an amount that is less than or equal to 1/5 of an amount of oxygen. In this case, the amount of hydrogen of the second supply gas is less than that of the first supply gas.

Figure 1C:
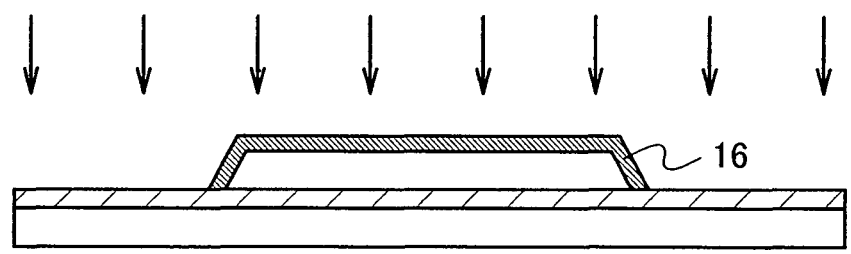

Next, the plasma 94 is generated by inputting the microwave, and an oxygen radical is generated by the plasma 94. At this time, the plasma 94 is generated by the second supply gas that is supplied. Then, by the oxygen radical, the insulating layer 16 is formed on the surface of the semiconductor layer 12 as shown in FIG. 1C. The plasma treatment using the second supply gas is preferably performed for 60 seconds or longer. By the high density plasma treatment performed here using the gas containing a rare gas and oxygen, the insulating layer 16, which is the insulating layer 14 with an improved film quality, can be obtained. Specifically, the insulating layer 16 that has favorable withstand voltage can be obtained. Note that by the high density plasma treatment using the second supply gas, there is a case where film thickness of the insulating layer is increased. It is preferable that the insulating layer 16 is ultimately formed to have a film thickness of 8 nm to 20 nm inclusive.

Note that the supply gas may be switched from the first supply gas to the second supply gas while the microwave is input from the high frequency wave supplying portion 92 to continuously generate the plasma. Alternatively, the supply gas may be switched after temporarily stopping the plasma generation by stopping supply of the microwave after stopping supply of hydrogen gas from the gas supplying portion 84, and then input of the microwave may be started to generate the plasma again. Note that when the supply gas is switched, the high density plasma treatment is preferably performed continuously without exposure to the atmosphere.

For a rare gas supply source used for the supply gas, at least one of helium (He), neon (Ne), argon (Ar), krypton (Kr), and xenon (Xe) is used. For an oxygen supply source, oxygen ($O_2$), ozone ($O_3$), nitrous oxide ($N_2O$), nitric oxide (NO), or nitrogen dioxide ($NO_2$) is used. For a hydrogen supply source, hydrogen ($H_2$), water ($H_2O$), or hydrogen peroxide ($H_2O_2$) is used. Note that when a rare gas is used for the supply gas, there is a case where an insulating layer that is formed contains the rare gas.

For example, when the high density plasma treatment is performed using a gas containing argon (Ar), oxygen ($O_2$), and hydrogen ($H_2$) as the first supply gas and using a gas containing argon (Ar) and oxygen ($O_2$) as the second supply gas, a high density plasma using the first supply gas (Ar gas, $O_2$ gas, and $H_2$ gas) is generated by the microwave. In the high density plasma, Ar gas is excited by the microwave that is input, and an argon radical is generated. In a similar manner, $H_2$ gas is excited and a hydrogen radical is generated. Then by the argon radical or the hydrogen radical colliding with an $O_2$ molecule, an oxygen radical (may contain a hydroxyl (OH) radical) is generated. Then, the oxygen radical that is generated reaches the surface of the semiconductor layer 12, the surface of the semiconductor layer 12 is oxidized, and the insulating layer 14 is formed as shown in FIG. 1B.

Next, when the supply gas is switched from the first supply gas to the second supply gas, high density plasma using the second supply gas (Ar gas and $O_2$ gas) is generated by the microwave. In the high density plasma, Ar gas is excited and an argon radical is generated by the microwave that is introduced. By the argon radical colliding with an $O_2$ molecule, an oxygen radical is generated. Then, the oxygen radical that is generated reaches the surface of the semiconductor layer 12 or the insulating layer 14, and the insulating layer 16 is formed as shown in FIG. 1C.

Note that for the insulating layers 14 and 16 shown in FIGS. 1B and 1C, respectively, an oxide of a material composing the semiconductor layer 12 is formed. For example, when the semiconductor layer 12 is formed using silicon (Si), a silicon oxide layer is formed as the insulating layers 14 and 16.

By the foregoing process, an insulating layer can be formed on the surface of the semiconductor layer. In this manner, by forming the insulating layer on the surface of the semiconductor layer by subjecting the semiconductor layer to a high density plasma treatment, poor coverage of an end portion of the semiconductor layer can be prevented. Further, by switching the supply gas from a gas containing a rare gas, oxygen and hydrogen to a gas containing a rare gas and oxygen while the surface of the semiconductor layer is subjected to the high density plasma treatment, an insulating layer with favorable withstand voltage having a desired film thickness can be formed.

Note that although a method of manufacturing an insulating layer on a surface of a semiconductor layer is described in this embodiment mode, it is needless to say that in a case of forming an insulating layer on a surface of a semiconductor substrate, the insulating layer can be formed in a similar manner. In this case, by subjecting the semiconductor substrate to the above-mentioned high density plasma treatment, an insulating layer can be formed on a top surface of the semiconductor substrate.

Embodiment Mode 2

In this embodiment mode, an example of a manufacturing method of a semiconductor device using the present invention is described. Here, a case of manufacturing a gate insulating layer of a thin film transistor (hereinafter also referred to as a "TFT") using the present invention is described with reference to FIGS. 3A to 3E.

Figure 3A:
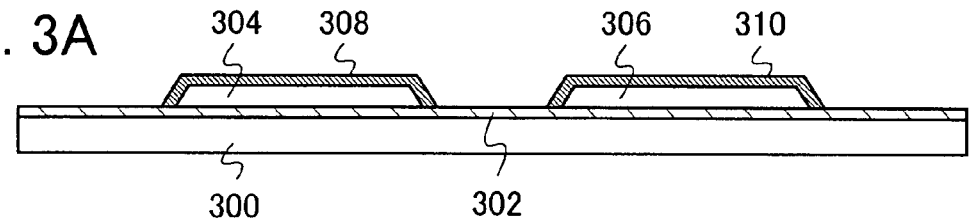
FIGS. 3A to 3E show an example of a manufacturing method of a semiconductor device of the present invention.

First, a semiconductor layer 304 and a semiconductor layer 306 are formed over a substrate 300 with an insulating layer 302 therebetween (see FIG. 3A). As the substrate 300, a glass substrate, a quartz substrate, a ceramic substrate, a metal substrate, or the like can be used. Further, a plastic substrate of polyethylene terephthalate (PET), polyethylene naphthalate (PNT), polyethersulfone, acrylic, or the like can be used. Alternatively, a substrate can be used as long as the substrate can at least withstand heat that is generated during a process. Here, a glass substrate is used as the substrate 300.

The insulating layer 302 is formed by a CVD method or a sputtering method using a material such as silicon oxide ($SiO_x$), silicon nitride ($SiN_x$), silicon oxynitride ($SiO_xN_y$) (x>y>0), or silicon nitride oxide ($SiN_xO_y$) (x>y>0). The insulating layer 302 may have a single-layer structure or a stacked-layer structure. The insulating layer 302 serves as a base insulating layer and can prevent diffusion of an impurity to the semiconductor layers 304 and 306 from the substrate 300. In addition, the insulating layer 302 can also planarize unevenness of the substrate 300. It is needless to say that the insulating layer 302 does not need to be formed if impurity diffusion from the substrate 300 or unevenness of the substrate 300 is not a problem.

Also, the insulating layer 302 may be formed by forming an insulating layer by a CVD method or a sputtering method, and then subjecting the insulating layer to a high density plasma treatment. In this case, the high density plasma treatment is performed under an oxygen atmosphere or a nitrogen atmosphere, using plasma that is excited by a high frequency wave and which has an electron density of more than or equal to $1 \times 10^{11}$ cm$^{-3}$ and an electron temperature of less than or equal to 1.5 eV. Specifically, it is preferable to use plasma with an electron density of $1 \times 10^{11}$ cm$^{-3}$ to $1 \times 10^{13}$ cm$^{-3}$ inclusive, and an electron temperature of 0.5 eV to 1.5 eV inclusive. Also, in the case of performing the high density plasma treatment under the oxygen atmosphere, at least oxygen is used for the supply gas, and a rare gas (includes at least one of He, Ne, Ar, Kr, and Xe), hydrogen, or the like may be used in addition. Further, for an oxygen supply source used for the supply gas, ozone ($O_3$), nitrous oxide ($N_2O$), nitric oxide (NO), or nitrogen dioxide ($NO_2$) can be used besides oxygen. Furthermore, for a hydrogen supply source, water ($H_2O$) or hydrogen peroxide ($H_2O_2$) can be used besides hydrogen. In the case of performing the high density plasma treatment under the nitrogen atmosphere, at least nitrogen or ammonia is used for the supply gas, and a rare gas (includes at least one of He, Ne, Ar, Kr, and Xe), or the like may be used in addition.

The semiconductor layer 304 and the semiconductor layer 306 can be formed by forming an amorphous semiconductor layer using a material mainly containing silicon (for example, Si, $Si_xGe_{(1-x)}$, or the like), and then selectively etching a crystalline semiconductor layer which is the amorphous semiconductor layer that is crystallized. The amorphous semiconductor layer can be formed by a CVD method or a sputtering method. Further, the amorphous semiconductor layer does not have to be crystallized. In that case, after the amorphous semiconductor layer is formed, the amorphous semiconductor layer is selectively etched to form the semiconductor layers 304 and 306 that are island-shaped.

In a case of crystallizing the amorphous semiconductor layer, crystallization can be performed by a laser crystallization method, a thermal crystallization method using RTA or an annealing furnace, a thermal crystallization method using a metal element that promotes crystallization, a method combining these methods, or the like.

When the semiconductor layer is crystallized or recrystallized by laser light irradiation, a second harmonic (wavelength of 532 nm) of a semiconductor laser (LD) pumped continuous wave (CW) laser ($YVO_4$) can be used as a light source of the laser light. It is not necessary to limit to the second harmonic in particular; however, the second harmonic is superior to other higher harmonics in terms of energy efficiency. When a semiconductor layer is irradiated with a CW laser, the semiconductor layer can receive energy continuously. Therefore, once the semiconductor layer is in a melted state, the melted state can be continued. Moreover, a solid-liquid interface of the semiconductor layer can be moved by scanning the CW laser, and a crystal grain which is long in one direction along this moving direction can be formed. In addition, a solid-state laser is used because highly stable output and stable processing are expected as compared with a gas laser or the like. It is to be noted that not only a CW laser but also a pulsed laser with a repetition rate of more than or equal to 10 MHz can be used. With a pulsed laser having a high repetition rate, when the pulse interval of the laser is shorter than a period for the melted semiconductor layer to solidify, the semiconductor layer can constantly be in the melted state, which enables the semiconductor layer to have a crystal grain that is long in one direction by the movement of the solid-liquid interface. Other CW lasers and pulsed lasers with repetition rates of more than or equal to 10 MHz can be used. For example, an Ar laser, a Kr laser, a $CO_2$ laser, or the like can be used as a gas laser. Moreover, a metal vapor laser such as a helium-cadmium laser is given as a gas laser. A YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like can be used as a solid-state laser. Moreover, among the solid-state lasers, a YAG laser, a $Y_2O_3$ laser, a $GdVO_4$ laser, a $YVO_4$ laser, or the like can also be used as a ceramic laser. It is preferable to emit laser light with TEM$_{00}$ (single transverse mode) from a laser oscillator because a linear beam spot on a surface to be irradiated can have more homogeneous energy. Besides those above, a pulsed excimer laser may be used. Here, crystalline silicon is used to form the semiconductor layers 304 and 306.

Next, the semiconductor layers 304 and 306 are subjected to a high density plasma treatment, and an insulating layer 308 and an insulating layer 310 are formed (see FIG. 3A). The high density plasma treatment is performed by first using the first supply gas containing a rare gas, oxygen, and hydrogen, and then switching the supply gas to the second supply gas containing a rare gas and oxygen. The first supply gas is preferably supplied with a flow rate of rare gas:oxygen:hydrogen that is in a range of 100:1:1 to 200:1:1 inclusive. Also, by the high density plasma treatment using the first supply gas, an insulating layer with a film thickness of more than or equal to 8 nm is preferably formed. The second supply gas is preferably supplied with a flow rate of rare gas:oxygen that is in a range of 100:1 to 200:1 inclusive. Further, the second supply gas may contain hydrogen as long as it is in an amount that is less than or equal to ⅓ of an amount of oxygen. Also, the high density plasma treatment using the second supply gas is preferably performed for 60 seconds or longer. By the high density plasma treatment performed here using the second supply gas, film quality of the insulating layer formed by the high density plasma treatment using the first supply gas is improved, and the insulating layers 308 and 310 can be obtained. Specifically, an insulating layer that has favorable withstand voltage can be obtained. Note that by the high density plasma treatment using the second supply gas, there is a case where film thickness of the insulating layer formed using the first supply gas is increased. It is preferable that the insulating layers 308 and 310 are ultimately formed to have a film thickness of more than or equal to 8 nm.

In the high density plasma treatment, plasma that is excited by a high frequency wave such as a microwave (typically, 2.54 GHz), and which has an electron density of more than or equal to $1 \times 10^{11}$ cm$^{-3}$ and an electron temperature of lower than or equal to 1.5 eV is used. Specifically, it is preferable to use plasma with an electron density of $1 \times 10^{11}$ cm$^{-3}$ to $1 \times 10^{13}$ cm$^{-3}$ inclusive, and an electron temperature of 0.5 eV to 1.5 eV inclusive.

For a rare gas supply source used for the supply gas, at least one of helium (He), neon (Ne), argon (Ar), krypton (Kr), and xenon (Xe) can be used. For an oxygen supply source, oxygen ($O_2$), ozone ($O_3$), nitrous oxide ($N_2O$), nitric oxide (NO), or nitrogen dioxide ($NO_2$) can be used. For a hydrogen supply source, hydrogen ($H_2$), water ($H_2O$), or hydrogen peroxide ($H_2O_2$) can be used. Note that when a rare gas is used for the supply gas, there is a case where an insulating layer that is formed contains the rare gas.

In this embodiment mode, the high density plasma treatment is performed by supplying Ar gas in a range of 500 sccm to 1000 sccm inclusive, 5 sccm of $O_2$ gas, and 5 sccm of $H_2$ gas as the first supply gas, so that an insulating layer with a film thickness of more than or equal to 8 nm is formed. Then, the high density plasma treatment is performed for 60 seconds or longer by supplying Ar gas in a range of 500 sccm to 1000 sccm inclusive and 5 sccm of $O_2$ gas as the second supply gas, and the insulating layers 308 and 310 containing silicon oxide is formed with a film thickness of 8 nm to 20 nm inclusive.

By performing a high density plasma treatment by switching a supply gas in the foregoing manner, an insulating layer with favorable withstand voltage can be formed. Also, since the electron temperature of the plasma is as low as in 1.5 eV or lower, an oxidation treatment of an object to be treated can be performed at a lower temperature compared to a conventional plasma treatment or a thermal oxidation method. For example, an insulating layer that is in contact with a surface of a semiconductor layer can be formed at a temperature that is at least 100° C. lower than a strain point of a glass substrate. Also, by performing the high density plasma treatment, poor coverage of an end portion of the semiconductor layer by the insulating layer can be prevented. Note that the insulating layers 308 and 310 serve as gate insulating layers of TFTs that are completed later.

Also, after forming insulating layers by the high density plasma treatment on surfaces of the semiconductor layers 304 and 306 an additional insulating layer may be formed over each of the insulating layers by a CVD method or a sputtering method.

Figure 3B:
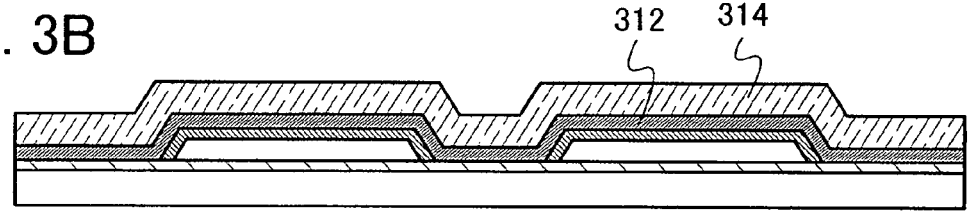

Next, a conductive layer is formed so as to cover the insulating layers 308 and 310 (see FIG. 3B). Here, an example in which the conductive layer has a stacked-layer structure of a conductive layer 312 and a conductive layer 314 is described. Naturally, the conductive layer may be formed as a single layer, or formed to have a stacked-layer structure including three or more layers.

Each of the conductive layers 312 and 314 can be formed using an element selected from tantalum (Ta), tungsten (W), titanium (Ti), molybdenum (Mo), aluminum (Al), copper (Cu), chromium (Cr), niobium (Nb), and the like; an alloy material mainly containing the element; or a compound material mainly containing the element. Alternatively, each of the conductive layers 312 and 314 can be formed of a metal nitride film using a nitride of the element. In addition, each of the conductive layers 312 and 314 can be formed of a semiconductor material typified by polycrystalline silicon doped with an impurity element such as phosphorus. The conductive layers 312 and 314 can be formed by a CVD method, a sputtering method, or the like using these materials.

Here, the conductive layer 312 is formed using tantalum nitride, and the conductive layer 314 is formed over the conductive layer 312 using tungsten. Alternatively, a single-layer film formed using a material selected from tungsten nitride, molybdenum nitride, and titanium nitride, or stacked-layer films thereof can be used for the conductive layer 312, and a single-layer film formed using a material selected from tantalum, molybdenum, and titanium, or stacked-layer films thereof can be used for the conductive layer 314.

Figure 3C:
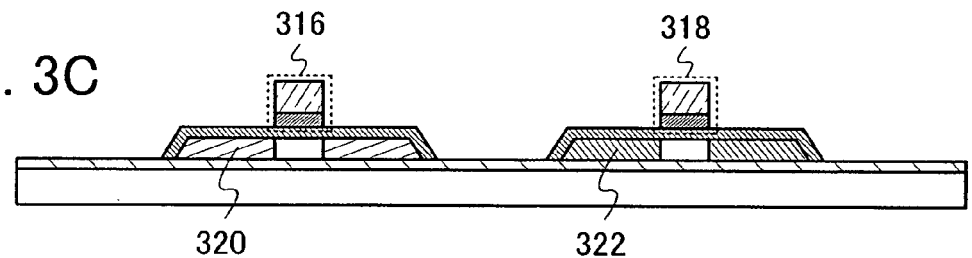

Next, by selectively etching the conductive layers 312 and 314, the conductive layers 312 and 314 are left over the semiconductor layers 304 and 306, and a gate electrode 316 and a gate electrode 318 are formed (see FIG. 3C). Here, the gate electrodes 316 and 318 are formed so that side portions of two layers of conductive layers forming each of the gate electrodes 316 and 318 are roughly aligned with each other.

Note that when each gate electrode is to have a stacked-layer structure with two layers of conductive layers, a conductive layer of a lower layer may be formed so that a width thereof (a direction in which carriers flow in a channel forming region (a length in a direction almost parallel to a direction in which a source region and a drain region are connected with each other)) is wider than that of a conductive layer of an upper layer.

Then, a low concentration impurity element is selectively added to the semiconductor layers 304 and 306 using the gate electrodes 316 and 318 as masks, respectively, to form an impurity region 320 and an impurity region 322 (see FIG. 3C). Here, impurity elements with different conductivity types are added to the semiconductor layer 304 and the semiconductor layer 306. Specifically, a low concentration impurity element imparting n-type conductivity is added to the semiconductor layer 304 to form the impurity region 320, and a low concentration impurity element imparting p-type conductivity is added to the semiconductor layer 306 to form the impurity region 322. For the impurity element imparting n-type conductivity, phosphorus (P), arsenic (As), or the like can be used. For the impurity element imparting p-type conductivity, boron (B), aluminum (Al), gallium (Ga), or the like can be used. Note that in a portion of each of the impurity regions 320 and 322, an LDD (lightly doped drain) region is formed later.

Figure 3D:
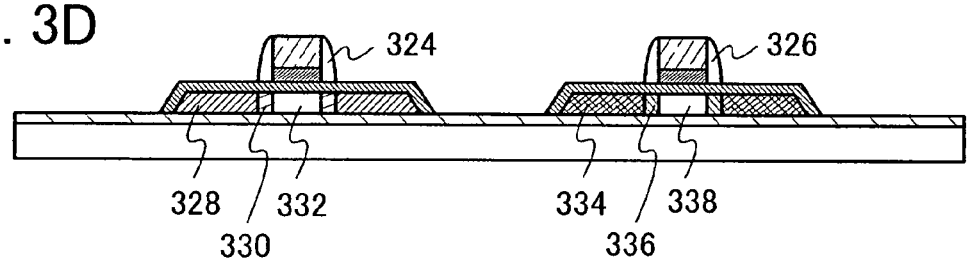

Next, an insulating layer 324 and an insulating layer 326 in contact with side surfaces of the gate electrode 316 and the gate electrode 318, respectively, are formed (see FIG. 3D). The insulating layers 324 and 326 are also called "sidewalls". For each of the insulating layers 324 and 326, an insulating layer including a single layer film or stacked-layer films is formed using an inorganic material such as silicon oxide ($SiO_x$), silicon nitride ($SiN_x$), silicon oxynitride ($SiO_xN_y$) (x>y>0), or silicon nitride oxide ($SiN_xO_y$) (x>y>0), or an organic material such as an organic resin, by a CVD method or a sputtering method. Then, the insulating layers are selectively etched by anisotropic etching mainly in a perpendicular direction, and the insulating layers 324 and 326 can be formed to be in contact with the side surfaces of the gate electrodes 316 and 318, respectively. Note that the insulating layers 324 and 326 are used as masks for doping, when the LDD regions are formed.

Then, a high concentration impurity element is selectively added to the semiconductor layer 304 using the gate electrode 316 and the insulating layer 324 as masks, as well as to the semiconductor layer 306 using the gate electrode 318 and the insulating layer 326 as masks. Accordingly, an impurity region 328 serving as a source region or drain region, a low concentration impurity region 330 serving as an LDD region, and a channel forming region 332 are formed in the semiconductor layer 304. Also, an impurity region 334 serving as a source region or drain region, a low concentration impurity region 336 serving as an LDD region, and a channel forming region 338 are formed in the semiconductor layer 306 (see FIG. 3D). Here, a high concentration impurity element imparting n-type conductivity is added to the semiconductor layer 304, and a high concentration impurity element imparting p-type conductivity is added to the semiconductor layer 306. For the impurity element imparting n-type conductivity, phosphorus (P), arsenic (As), or the like can be used. For the impurity element imparting p-type conductivity, boron (B), aluminum (Al), gallium (Ga), or the like can be used.

Figure 3E:
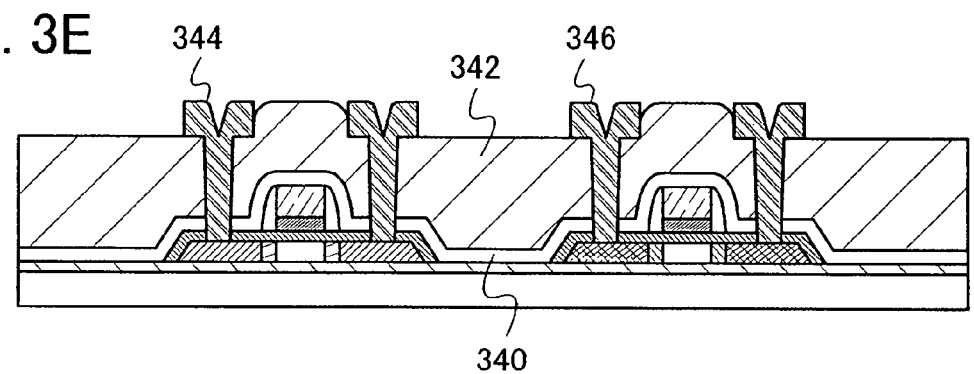

An insulating layer is formed so as to cover the insulating layer 308, the insulating layer 310, the gate electrodes 316 and 318, the insulating layers 324 and 326, and the like (see FIG. 3E). Here, stacked-layer films of an insulating layer 340 and an insulating layer 342 are formed as the insulating layer. Note that the insulating layer may be formed as a single-layer film or stacked-layer films of three or more layers.

Each of the insulating layers 340 and 342 can be formed using an inorganic material containing oxygen or nitrogen, such as silicon oxide ($SiO_x$), silicon nitride ($SiN_x$), silicon oxynitride ($SiO_xN_y$) (x>y>0), or silicon nitride oxide ($SiN_xO_y$) (x>y>0); a material containing carbon such as DLC (diamond-like carbon); an organic material such as epoxy, polyimide, polyamide, polyvinylphenol, benzocyclobutene, or acrylic; or a siloxane material such as a siloxane resin. Note that a siloxane material corresponds to a material containing a Si—O—Si bond. A skeletal structure of siloxane is composed of a bond between silicon (Si) and oxygen (O). For a substituent, an organic group containing at least hydrogen (for example, an alkyl group or aromatic hydrocarbon) is used. For the substituent, a fluoro group can also be used. Alternatively, both the organic group containing at least hydrogen and the fluoro group can be used for the substituent. The insulating layers 340 and 342 can be formed using these materials by a CVD method, a sputtering method, a coating method, or the like. Also, by forming the insulating layers using the organic material or the siloxane material, a step due to the semiconductor layers, the gate electrodes, or the like can be planarized. However, an insulating layer formed using the organic material or the siloxane material easily absorbs and allows penetration of moisture. Therefore, it is preferable to form over the semiconductor layers, gate insulating layers, gate electrodes, and the like an insulating layer using an inorganic material having high moisture blocking effect, and then form the insulating layer using the organic material or the siloxane material over the insulating layer using the inorganic material. Here, the insulating layer 340 is formed using silicon nitride or silicon nitride oxide, and the insulating layer 342 is formed using acrylic or a siloxane resin.

Also, the insulating layers 340 and 342 may be formed by forming an insulating layer by a CVD method or a sputtering method, and then subjecting the insulating layer to a high density plasma treatment. In this case, the high density plasma treatment is performed under an oxygen atmosphere or a nitrogen atmosphere using plasma that is excited by a high frequency wave and which has an electron density of more than or equal to $1 \times 10^{11}$ cm$^{-3}$ and an electron temperature of less than or equal to 1.5 eV. Specifically, it is preferable to use plasma with an electron density of $1 \times 10^{11}$ cm$^{-3}$ to $1 \times 10^{13}$ cm$^{-3}$ inclusive, and an electron temperature of 0.5 eV to 1.5 eV inclusive. Also, in the case of performing the high density plasma treatment under the oxygen atmosphere, at least oxygen is used for the supply gas, and a rare gas (includes at least one of He, Ne, Ar, Kr, and Xe), hydrogen, or the like may be used in addition. Further, for an oxygen supply source, ozone ($O_3$), nitrous oxide ($N_2O$), nitric oxide (NO), or nitrogen dioxide ($NO_2$) can be used besides oxygen. For a hydrogen supply source, water ($H_2O$) or hydrogen peroxide ($H_2O_2$) can be used besides hydrogen. In the case of performing the high density plasma treatment under the nitrogen atmosphere, at least nitrogen or ammonia is used for the supply gas, and a rare gas (includes at least one of He, Ne, Ar, Kr, and Xe), or the like may be used.

Next, opening portions are provided in the insulating layers 340 and 342 that reach the impurity region 328 formed in the semiconductor layer 304 and the impurity region 334 formed in the semiconductor layer 306. Then, a conductive layer 344 and a conductive layer 346 electrically connected to the impurity regions 328 and 334, respectively, are formed (FIG. 3E). Here, although an example in which the conductive layers are formed as single layers is shown, it is needless to say that they can be formed to have a stacked-layer structure of two or more layers. Note that each of the conductive layers 344 and 346 serves as a source wiring or drain wiring of a TFT.

Each of the conductive layers 344 and 346 can be formed using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material mainly containing the element; or a compound material mainly containing the element, by a CVD method or a sputtering method. For example, as an alloy material mainly containing aluminum, a material mainly containing aluminum that also contains nickel, an alloy material mainly containing aluminum that also contains nickel and one or both of carbon and silicon, or the like can be given. For the conductive layers 344 and 346, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer, may be employed. Note that the barrier layer corresponds to a thin film made of titanium, a nitride of titanium, molybdenum, or a nitride of molybdenum. Since aluminum and aluminum-silicon have low resistance values and are inexpensive, they are most suitable for materials for forming the conductive layers 344 and 346. Also, by providing a barrier layer in each of an upper layer and a lower layer, generation of hillock of aluminum or aluminum-silicon can be prevented. Further, by forming a barrier layer made of titanium which is a highly reducible element, even if a thin, natural oxide film is formed on a crystalline semiconductor layer, this natural oxide film can be reduced, and favorable contact with the crystalline semiconductor layer can be made.

By the foregoing process, a semiconductor device provided with an n-channel thin film transistor formed using the semiconductor layer 304 and a p-channel thin film transistor formed using the semiconductor layer 306 can be obtained. Note that the structure of a TFT described in this embodiment mode is one example, and it is not limited to the structure shown in the figures. For example, a TFT structure may be a inversely-staggered structure, a double-gate structure, or the like. Also, the structure may be that in which the LDD regions are not formed.

By forming an insulating layer serving as a gate insulating layer using the present invention, a gate insulating layer with favorable withstand voltage can be realized. In particular, a gate insulating layer having withstand voltage that has little defect in initial withstand voltage in the A mode and the B mode can be realized. Also, a gate insulating layer with a favorable film characteristic can be realized. Further, poor coverage in an end portion of a semiconductor layer can also be prevented. Accordingly, a defect in withstand voltage of the gate insulating layer can be prevented, and a highly reliable semiconductor device can be manufactured. Also, yield of the semiconductor device can be improved.

Note that this embodiment mode can be appropriately combined with other embodiment modes described in this specification.

Embodiment Mode 3

In this embodiment mode, an example of a manufacturing method of a semiconductor device using the present invention is described. Here, using the present invention, an example of manufacturing a MOS transistor over a semiconductor substrate is described with reference to FIGS. 4A to 5B.

Figure 4A:
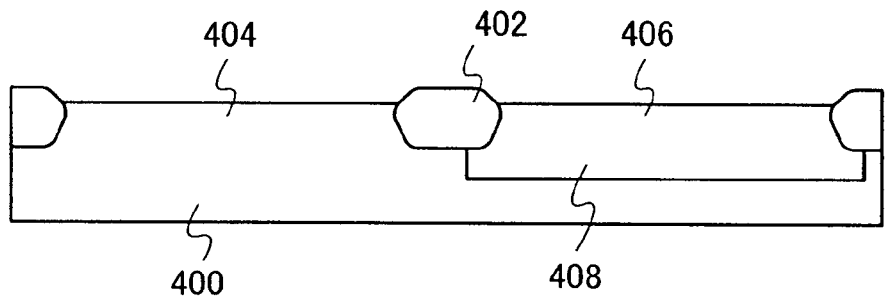
FIGS. 4A to 4D show an example of a manufacturing method of a semiconductor device of the present invention.

First, a region 404 and a region 406 of a divided element (hereinafter also referred to as "regions 404 and 406") are formed in a semiconductor substrate 400 (see FIG. 4A). The regions 404 and 406 provided in the semiconductor substrate 400 are divided by an insulating layer 402 (also called a "field oxide film"). Also, here, an example of using a monocrystalline Si substrate having n-type conductivity as the semiconductor substrate 400 and providing a p-well 408 provided in the region 406 of the semiconductor substrate 400 is shown.

For the substrate 400, a substrate that can be used is not particularly limited as long as it is a semiconductor substrate. For example, a monocrystalline Si substrate having n-type or p-type conductivity; a compound semiconductor substrate (such as a GaAs substrate, an InP substrate, or a SiC substrate); an SOI (silicon-on-insulator) substrate manufactured using a bonding method or a SIMOX (separation by implanted oxygen) method; or the like can be used.

For the element division regions 404 and 406, a local-oxidation-of-silicon (LOCOS) method, a trench isolation method, or the like can be appropriately used.

The p-well 408 formed in the region 406 of the semiconductor substrate 400 can be formed by selectively adding an impurity element imparting p-type conductivity to the semiconductor substrate 400. For the impurity element imparting p-type conductivity, boron (B), aluminum (Al), gallium (Ga), or the like can be used.

Note that in this embodiment mode, since a semiconductor substrate having n-type conductivity is used as the semiconductor substrate 400, an impurity element is not added to the region 404; however, an n-well may be formed in the region 404 by adding an impurity element imparting n-type conductivity. For the impurity element imparting n-type conductivity, phosphorus (P), arsenic (As), or the like can be used. On the other hand, when a semiconductor substrate having p-type conductivity is used, it may be that an n-well is formed in the region 404 by adding an impurity element imparting n-type conductivity, and not adding an impurity element to the region 406.

Figure 4B:
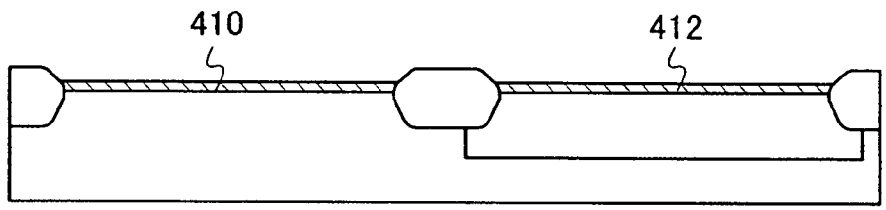

Next, an insulating layer 410 and an insulating layer 412 are formed on the regions 404 and 406 of the substrate 400, respectively (see FIG. 4B).

The insulating layers 410 and 412 are formed by subjecting the regions 404 and 406 provided in the semiconductor substrate 400 to a high density plasma treatment. The high density plasma treatment is performed by first using the first supply gas containing a rare gas, oxygen, and hydrogen, and then switching the supply gas to the second supply gas containing a rare gas and oxygen. The first supply gas is preferably supplied with a flow rate of rare gas:oxygen:hydrogen that is in a range of 100:1:1 to 200:1:1 inclusive. Also, by the high density plasma treatment, using the first supply gas, an insulating layer with a film thickness of more than or equal to 8 nm is preferably formed. The second supply gas is preferably supplied with a flow rate of rare gas:oxygen that is in a range of 100:1 to 200:1 inclusive. Further, the second supply gas may contain hydrogen as long as it is in an amount that is less than or equal to ⅕ of an amount of oxygen. In this case, the amount of hydrogen of the second supply gas is less than that of the first supply gas. Also, the high density plasma treatment using the second supply gas is preferably performed for 60 seconds or longer.

In the high density plasma treatment, plasma that is excited by a high frequency wave such as a microwave (typically 2.45 GHz) and which has an electron density of more than or equal to $1 \times 10^{11}$ cm$^{-3}$ and an electron temperature of lower than or equal to 1.5 eV is used. Specifically, it is preferable to use plasma with an electron density of $1 \times 10^{-11}$ cm$^{-3}$ to $1 \times 10^{13}$ cm$^{-3}$ inclusive, and an electron temperature of 0.5 eV to 1.5 eV inclusive.

For a rare gas supply source used for the supply gas, at least one of helium (He), neon (Ne), argon (Ar), krypton (Kr), and xenon (Xe) can be used. For an oxygen supply source, oxygen ($O_2$), ozone ($O_3$), nitrous oxide ($N_2O$), nitric oxide (NO), or nitrogen dioxide ($NO_2$) can be used. For a hydrogen supply source, hydrogen ($H_2$), water ($H_2O$), or hydrogen peroxide ($H_2O_2$) can be used. Note that when a rare gas is used for the supply gas, there is a case where an insulating layer that is formed contains the rare gas.

In this embodiment mode, the high density plasma treatment is performed by supplying Ar gas in a range of 500 sccm to 1000 sccm inclusive, 5 sccm of $O_2$ gas, and 5 sccm of $H_2$ gas as the first supply gas and forming an insulating layer with a film thickness of more than or equal to 8 nm. Also, the high density plasma treatment is performed by supplying Ar gas in a range of 500 sccm to 1000 sccm inclusive and 5 sccm of $O_2$ gas as the second supply gas, for 60 seconds or longer. Then the insulating layers 410 and 412 containing silicon oxide are ultimately formed each with a film thickness of 8 nm to 20 nm inclusive.

In the foregoing manner, by performing the high density plasma treatment by switching the supply gas, an insulating layer with favorable withstand voltage can be formed. Each of the insulating layers 410 and 412 serve as a gate insulating layer of a transistor that is completed later.

Figure 4C:
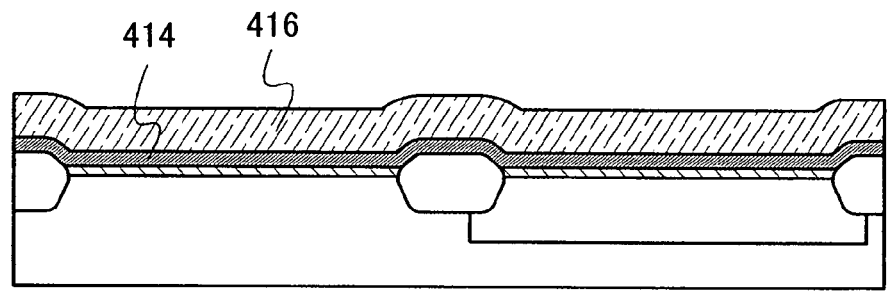

Next, a conductive layer is formed so as to cover the insulating layers 410 and 412 that are formed on the regions 404 and 406, respectively (see FIG. 4C). Here, an example in which the conductive layer is formed by stacking a conductive layer 414 and a conductive layer 416 in this order is shown. Naturally, the conductive layer can be formed as a single layer or so as to have a stacked-layer structure of three or more layers.

For each of the conductive layers 414 and 416, an element selected from tantalum (Ta), tungsten (W), titanium (Ti), molybdenum (Mo), aluminum (Al), copper (Cu), chromium (Cr), niobium (Nb), and the like; or an alloy material or compound material mainly containing the element can be used. Alternatively, a metal nitride that is a nitride of the element can also be used. In addition, a semiconductor material typified by polycrystalline silicon doped with an impurity element such as phosphorus can also be used.

Here, the conductive layer 414 is formed using tantalum nitride, and the conductive layer 416 is formed thereover using tungsten to form a stacked-layer structure. Alternatively, a single layer film of tungsten nitride, molybdenum nitride, or titanium nitride or stacked layer films thereof can be used as the conductive layer 414, and a single layer film of tantalum, molybdenum, or titanium or stacked layer films thereof can be used as the conductive layer 416.

Figure 4D:
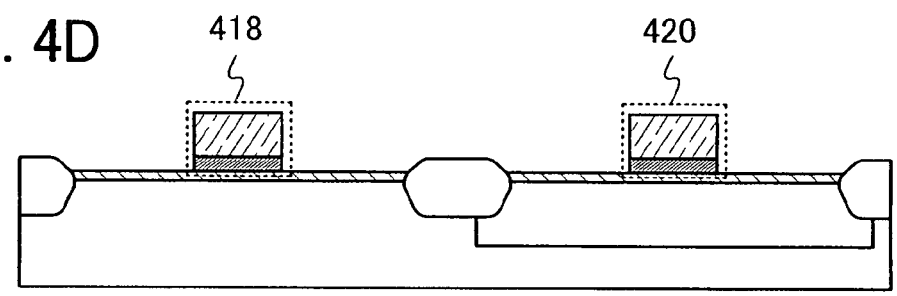
Figure 5A:
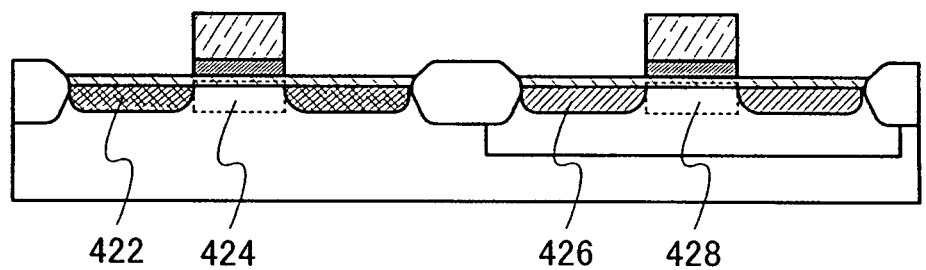
FIGS. 5A and 5B show an example of a manufacturing method of a semiconductor device of the present invention.
Figure 5B:
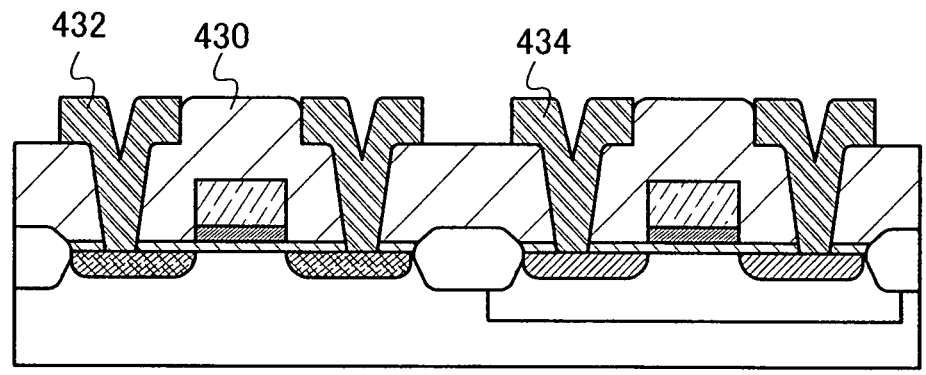

Next, by selectively etching the conductive layers 414 and 416 that are stacked, the conductive layers 414 and 416 are left over the regions 404 and 406, and a gate electrode 418 and a gate electrode 420 are formed (see FIG. 4D). Here, the gate electrodes 418 and 420 are formed so that side portions of two layers of conductive layers forming each of the gate electrodes 418 and 420 are roughly aligned with each other. Note that when each gate electrode is to have a stacked-layer structure with two layers of conductive layers, a conductive layer of a lower layer may be formed so that a width thereof is wider than that of a conductive layer of an upper layer.

Next, an impurity element is selectively added to each of the regions 404 and 406 using the gate electrodes 418 and 420 as masks, respectively. Accordingly, an impurity region 422 serving as a source region or drain region, and a channel forming region 424 are formed in the region 404, and an impurity region 426 serving as a source region or drain region, and a channel forming region 428 are formed in the region 406 (see FIG. 5A). Here, impurity elements with different conductivity types are added to the region 404 and the region 406. Specifically, an impurity element imparting p-type conductivity is added to the region 404, and an impurity element imparting n-type conductivity is added to the region 406. For the impurity element imparting n-type conductivity, phosphorus (P), arsenic (As), or the like can be used, and for the impurity element imparting p-type conductivity, boron (B), aluminum (Al), gallium (Ga), or the like can be used.

Next, an insulating layer 430 is formed so as to cover the insulating layers 410 and 412, and the gate electrodes 418 and 420. Then, over the insulating layer 430, a conductive layer 432 that is electrically connected to the impurity region 422 formed in the region 404, and a conductive layer 434 that is electrically connected to the impurity region 426 formed in the region 406, are formed (see FIG. 5B).

The insulating layer 430 can be provided to have a single layer structure or a stacked-layer structure by a CVD method, a sputtering method, or the like, using an inorganic material containing oxygen or nitrogen such as silicon oxide ($SiO_x$), silicon nitride ($SiN_x$), silicon oxynitride ($SiO_xN_y$) (x>y), silicon nitride oxide ($SiN_xO_y$) (x>y); a material containing carbon such as DLC (diamond-like carbon); an organic material such as epoxy, polyimide, polyamide, polyvinylphenol, benzocyclobutene, acrylic; or a siloxane material such as a siloxane resin. Note that a siloxane material corresponds to a material containing a Si—O—Si bond. A skeletal structure of siloxane is composed of a bond between silicon (Si) and oxygen (O). For a substituent, an organic group containing at least hydrogen (for example, an alkyl group or aromatic hydrocarbon) is used. For the substituent, a fluoro group can also be used. Alternatively, both the organic group containing at least hydrogen and the fluoro group can be used for the substituent.

Also, the insulating layer 430 may be formed by forming an insulating layer by a CVD method or a sputtering method, and then subjecting the insulating layer to a high density plasma treatment. In this case, the high density plasma treatment is performed under an oxygen atmosphere or a nitrogen atmosphere, using a plasma that is excited by a high frequency wave and which has an electron density of more than or equal to $1\times10^{11}$ cm$^{-3}$ and an electron temperature of less than or equal to 1.5 eV. Specifically, it is preferable to use plasma with an electron density of $1\times10^{11}$ cm$^{-3}$ to $1\times10^{13}$ cm$^{-3}$ inclusive, and an electron temperature of 0.5 eV to 1.5 eV inclusive. Also, in the case of performing the high density plasma treatment under the oxygen atmosphere, at least oxygen is used for the supply gas, and a rare gas (includes at least one of He, Ne, Ar, Kr, and Xe), hydrogen, or the like may be used in addition. Here, for an oxygen supply source, ozone ($O_3$), nitrous oxide ($N_2O$), nitric oxide (NO), or nitrogen dioxide ($NO_2$) can be used besides oxygen. For a hydrogen supply source, water ($H_2O$) or hydrogen peroxide ($H_2O_2$) can be used besides hydrogen. In the case of performing the high density plasma treatment under the nitrogen atmosphere, at least nitrogen or ammonia is used for the supply gas, and a rare gas (includes at least one of He, Ne, Ar, Kr, and Xe), or the like may be used in addition.

Each of the conductive layers 432 and 434 can be formed to have a single layer structure or a stacked-layer structure by a CVD method, a sputtering method, or the like, using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material or compound material mainly containing the element. For example, an alloy material mainly containing aluminum corresponds to, for example, a material mainly containing aluminum that also contains nickel, or an alloy material mainly containing aluminum that also contains nickel and one or both of carbon and silicon. For the conductive layers 432 and 434, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer, may be employed. Note that the barrier layer corresponds to a thin film made of titanium, a nitride of titanium, molybdenum, or a nitride of molybdenum. Since aluminum and aluminum-silicon have low resistance values and are inexpensive, they are most suitable for materials for forming the conductive layers 432 and 434. Also, by providing a barrier layer in each of an upper layer and a lower layer, generation of hillock of aluminum or aluminum-silicon can be prevented. Note that the conductive layers 432 and 434 each serve as a source wiring or drain wiring of a transistor.

By the foregoing process, a semiconductor device provided with an p-channel transistor formed in the region 404 and an n-channel transistor formed in the region 406 of the substrate 400, can be obtained.

Note that the structure of a transistor shown in this embodiment mode is one example, and the structure is not limited to the structure in the figures. For example, the structure of the transistor may be a double-gate structure, a FinFET structure, or the like. Also, an LDD region may be formed. A FinFET structure is favorable since a short channel effect that comes with miniaturization of transistor size can be suppressed.

By forming an insulating layer serving as a gate insulating layer using the present invention, a gate insulating layer with favorable withstand voltage can be realized. In particular, a gate insulating layer having withstand voltage that has little defect in initial withstand voltage in the A mode and the B mode can be realized. Accordingly, a defect in withstand voltage of the gate insulating layer can be prevented, and a highly reliable semiconductor device can be manufactured. Also, yield of the semiconductor device can be improved.

This embodiment mode can be appropriately combined with other embodiment modes described in this specification.

Embodiment Mode 4

In this embodiment mode, an example of a method of manufacturing a semiconductor device using the present invention is described. Here, an example of manufacturing a MOS transistor by a different manufacturing method from that of Embodiment Mode 3 is described, with reference to FIGS. 6A to 8B.

First, an insulating layer is formed over a substrate 600. Here, a monocrystalline Si substrate having n-type conductivity is used as the substrate 600, and an insulating layer 602 and an insulating layer 604 are formed over the substrate 600 (see FIG. 6A). For example, silicon oxide (SiOx) is formed for the insulating layer 602 by subjecting the substrate 600 to a heat treatment, and silicon nitride (SiNx) is formed over the insulating layer 602 using a CVD method. Note that the insulating layer provided over the substrate 600 is provided as a single layer or so as to have a stacked-layer structure of three or more layers.

For the substrate 600, a substrate that can be used is not particularly limited as long as it is a semiconductor substrate. For example, a monocrystalline Si substrate having n-type or p-type conductivity; a compound semiconductor substrate (such as a GaAs substrate, an InP substrate, or a SiC substrate); an SOI (silicon on insulator) substrate manufactured using a bonding method or a SIMOX (separation by implanted oxygen) method; or the like can be used.

Figure 6A:
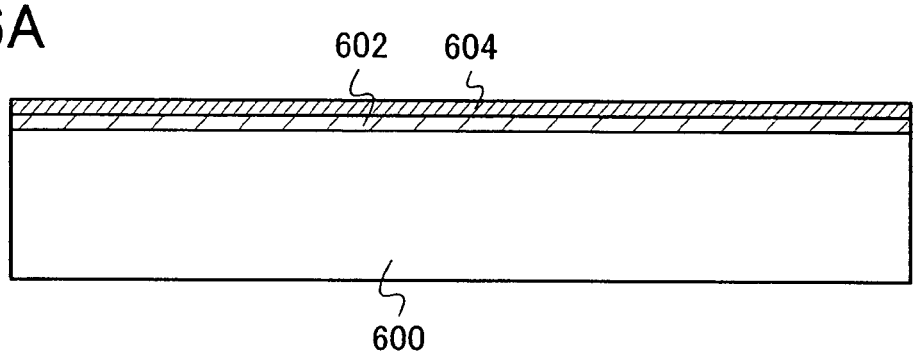
FIGS. 6A to 6D show an example of a manufacturing method of a semiconductor device of the present invention.
Figure 6B:
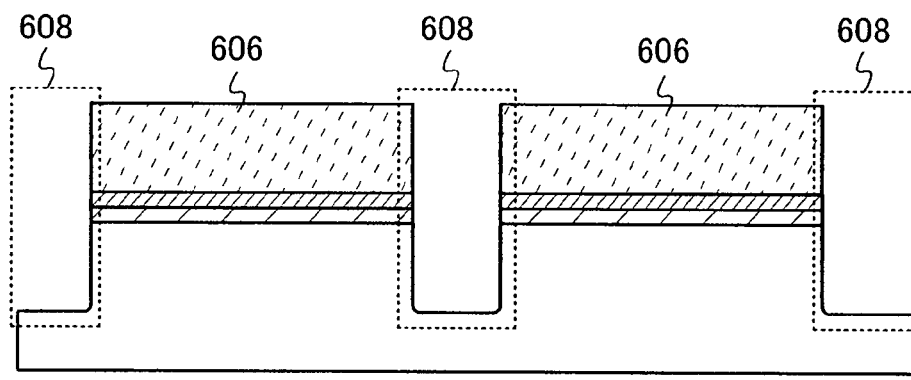

Next, by selectively forming a pattern of a resist mask 606 over the insulating layer 604 and then performing selective etching using the resist mask 606 as a mask, depressed portions 608 is selectively formed in the substrate 600 (see FIG. 6B). Etching of the substrate 600 and the insulating layers 602 and 604 can be done by dry etching using plasma.

Figure 6C:
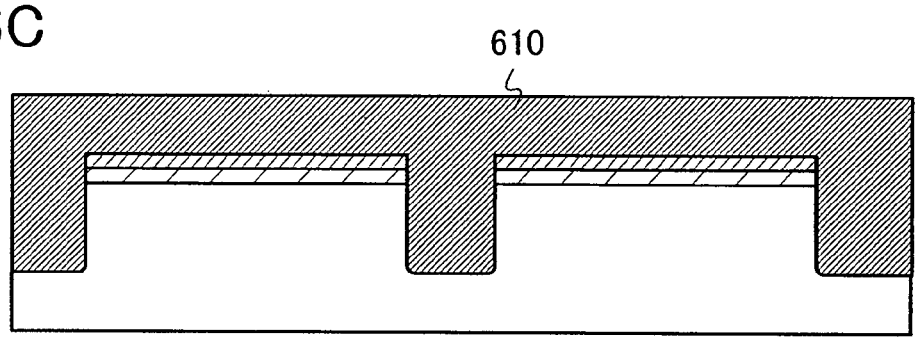
Figure 6D:
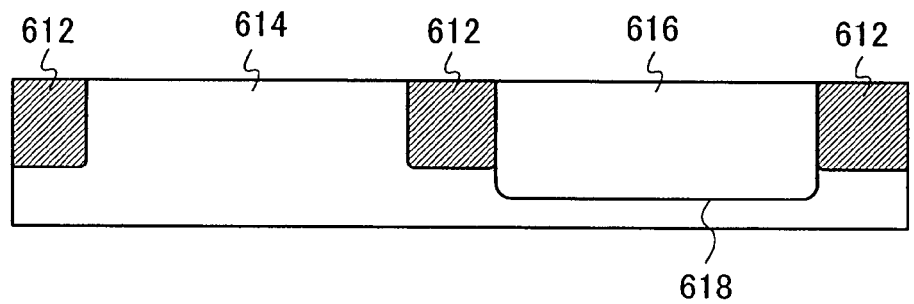

Then, after removing the pattern of the resist mask 606, an insulating layer 610 is formed so as to fill in the depressed portions 608 formed in the substrate 600 (see FIG. 6C).

The insulating layer 610 is formed by a CVD method or a sputtering method, using an insulating material such as silicon oxide ($SiO_x$), silicon nitride ($SiN_x$), silicon oxynitride ($SiO_xN_y$) (x>y), silicon nitride oxide ($SiN_xO_y$) (x>y>0). Here, a silicon oxide layer is formed by a normal pressure CVD method or a reduced pressure CVD method, using TEOS (tetraethyl orthosilicate) gas.

Next, by performing a grinding treatment, a polishing treatment, or a CMP (chemical mechanical polishing) treatment, a surface of the substrate 600 is exposed. Here, by exposing the surface of the substrate 600, a region 614 and a region 616 are provided between insulating layers 612 formed in the depressed portions 608. Note that the insulating layers 612 are obtained by removing the insulating layer 610 formed over the surface of the substrate 600, by a grinding treatment, a polishing treatment, or a CMP treatment. Then, by selectively adding an impurity element imparting p-type conductivity, a p-well 618 is formed in the region 616 of the substrate 600 (see FIG. 6D).

For the impurity element imparting p-type, boron (B), aluminum (Al), gallium (Ga), or the like can be used. Here, boron (B) is added to the region 616 as the impurity element.

Note that in this embodiment mode, although an impurity element is not added to the region 614 since a semiconductor substrate having n-type conductivity is used as the substrate 600, an n-well may be formed in the region 614 by adding an impurity element imparting n-type conductivity. For the impurity element imparting n-type conductivity, phosphorus (P), arsenic (As), or the like can be used.

On the other hand, in a case of using a semiconductor substrate having p-type conductivity, an n-well is formed in the region 614 by adding an impurity element imparting n-type conductivity, and an impurity element is not added to the region 616.

Figure 7A:
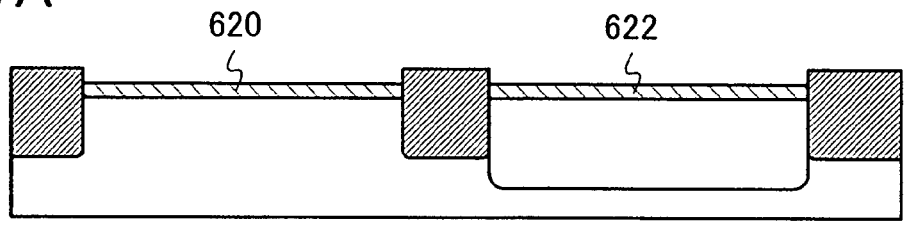
FIGS. 7A to 7D show an example of a manufacturing method of a semiconductor device of the present invention.

Next, an insulating layer 620 is formed on a surface of the region 614 of the substrate 600, and an insulating layer 622 is formed on a surface of the region 616 of the substrate 600 (see FIG. 7A).

The insulating layers 620 and 622 are formed by subjecting the regions 614 and 616 provided in the substrate to a high density plasma treatment. The high density plasma treatment is performed by using the first supply gas containing a rare gas, oxygen, and hydrogen, and then switching the supply gas to the second supply gas containing a rare gas and oxygen. The first supply gas is preferably supplied with a flow rate of rare gas:oxygen:hydrogen that is in a range of 100:1:1 to 200:1:1 inclusive. Also, by the high density plasma treatment, using the first supply gas, an insulating layer with a film thickness of more than or equal to 8 nm is preferably formed. The second supply gas is preferably supplied with a flow rate of rare gas:oxygen that is in a range of 100:1 to 200:1 inclusive. Further, the second supply gas may contain hydrogen as long as it is in an amount that is less than or equal to $\frac{1}{5}$ of an amount of oxygen. In this case, the amount of hydrogen of the second supply gas is less than that of the first supply gas. Also, the high density plasma treatment using the second supply gas is preferably performed for 60 seconds or longer.

In the high density plasma treatment, plasma that is excited by a high frequency wave such as a microwave (typically, 2.54 GHz) and which has an electron density of more than or equal to $1 \times 10^{11}$ $cm^{-3}$ and an electron temperature of lower than or equal to 1.5 eV is used. Specifically, it is preferable to use plasma with an electron density of $1 \times 10^{11}$ $cm^{-3}$ to $1 \times 10^{13}$ $cm^{-3}$ inclusive, and an electron temperature of 0.5 eV to 1.5 eV inclusive.

For a rare gas supply source used for the supply gas, at least one of helium (He), neon (Ne), argon (Ar), krypton (Kr), and xenon (Xe) can be used. For an oxygen supply source, oxygen ($O_2$), ozone ($O_3$), nitrous oxide ($N_2O$), nitric oxide (NO), or nitrogen dioxide ($NO_2$) can be used. For a hydrogen supply source, hydrogen ($H_2$), water ($H_2O$), or hydrogen peroxide ($H_2O_2$) can be used. Note that when a rare gas is used for the supply gas, there is a case where an insulating layer that is formed contains the rare gas.

In this embodiment mode, the high density plasma treatment is performed by supplying Ar gas in a range of 500 sccm to 1000 sccm inclusive, 5 sccm of $O_2$ gas, and 5 sccm of $H_2$ gas as the first supply gas, so that an insulating layer with a film thickness of 8 nm is formed. Then, the high density plasma treatment is performed for 60 seconds or longer by supplying Ar gas in a range of 500 sccm to 1000 sccm inclusive and 5 sccm of $O_2$ gas as the second supply gas. Accordingly, the insulating layers 620 and 622 containing silicon oxide is formed with a film thickness of 8 nm to 20 nm inclusive.

Note that each of the insulating layers 620 and 622 formed in the regions 614 and 616 provided in the substrate 600 serves as a gate insulating layer in a transistor to be completed later.

Figure 7B:
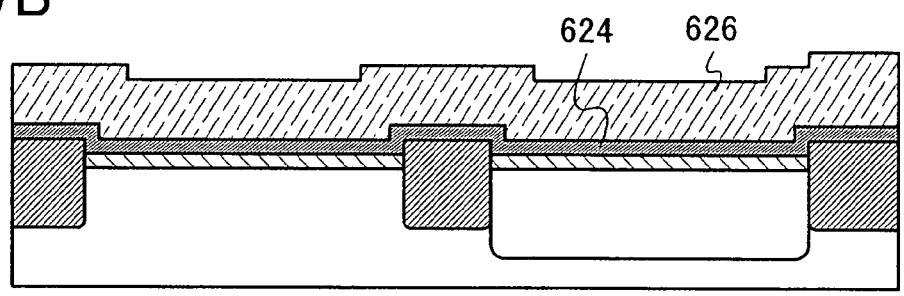

Next, a conductive layer is formed so as to cover the insulating layers 620 and 622 formed on the regions 614 and 616 provided in the substrate 600 (see FIG. 7B). Here, an example in which a conductive layer 624 and a conductive layer 626 are stacked in this order as the conductive layer is shown. Naturally, the conductive layer may be formed to have a single layer structure or a stacked-layer structure of three or more layers.

For each of the conductive layers 624 and 626, an element selected from tantalum (Ta), tungsten (W), titanium (Ti), molybdenum (Mo), aluminum (Al), copper (Cu), chromium (Cr), niobium (Nb), and the like; or an alloy material or compound material mainly containing the element can be used. Alternatively, a metal nitride that is a nitride of the element can also be used. In addition, a semiconductor material typified by polycrystalline silicon doped with an impurity element such as phosphorus can also be used.

Here, the conductive layer 624 is formed using tantalum nitride, and the conductive layer 626 is formed thereover using tungsten to form a stacked-layer structure. Alternatively, a single layer film of tungsten nitride, molybdenum nitride, or titanium nitride or stacked layer films thereof can be used as the conductive layer 624, and a single layer film of tungsten, tantalum, molybdenum, or titanium or stacked layer films thereof can be used as the conductive layer 626.

Figure 7C:
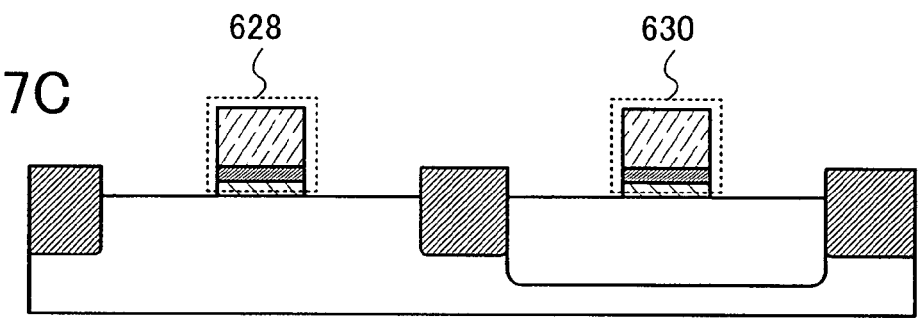

Next, by selectively etching the conductive layers 624 and 626 that are stacked, the conductive layers 624 and 626 are left over the regions 614 and 616 of the substrate 600, and a gate electrode 628 and a gate electrode 630 are formed (see FIG. 7C). Here, in the substrate 600, it is made so that surfaces of the regions 614 and 616 that do not overlap with the gate electrodes 628 and 630 are exposed.

Specifically, in the region 614 of the substrate 600, a portion of the insulating layer 620 formed under the gate electrode 628 that does not overlap with the gate electrode 628 is selectively removed, and end portions of the gate electrode 628 and the insulating layer 620 are made so that they are roughly aligned with each other. Also, in the region 616 of the substrate 600, a portion of the insulating layer 622 formed under the gate electrode 630 that does not overlap with the gate electrode 630 is selectively removed, and end portions of the gate electrode 630 and the insulating layer 622 are made so that they are roughly aligned with each other.

In this case, the insulating layers 620 and 622 and the like in portions that do not overlap may be removed at the same time as forming the electrodes 628 and 630. Alternatively, after forming the gate electrodes 628 and 630, a resist mask that is left or the gate electrodes 628 and 630 may be used as a mask to remove the insulating layers 620 and 622 and the like in the portions that do not overlap.

Figure 7D:
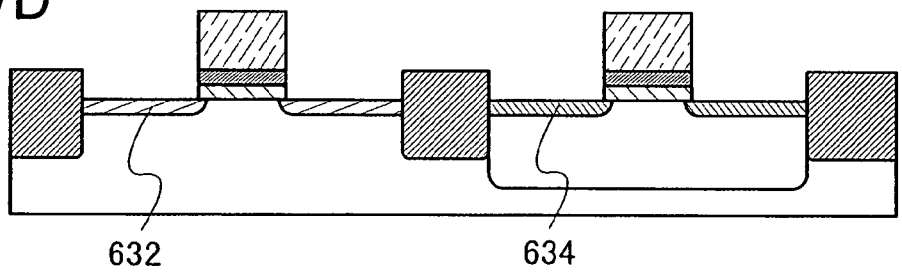

Next, using the gate electrodes 628 and 630 as masks, a low concentration impurity element is added to each of the regions 614 and 616 of the substrate 600, and an impurity region 632 and an impurity region 634 are formed (see FIG. 7D). Here, a low concentration impurity element imparting n-type conductivity is selectively added to the region 616 using the gate electrode 630 as a mask to form the impurity region 634, and a low concentration impurity element imparting p-type conductivity is selectively added to the region 614 using the gate electrode 628 as a mask to form the impurity region 632. For the impurity element imparting n-type conductivity, phosphorus (P), arsenic (As), or the like can be used. For the impurity element imparting p-type conductivity, boron (B), aluminum (Al), gallium (Ga), or the like can be used. A portion of each of the impurity regions 632 and 634 form an LDD region that is formed later.

Then, an insulating layer 636 and an insulating layer 638 in contact with a side surface of the gate electrodes 628 and 630, respectively, are formed. The insulating layers 636 and 638 are also called "sidewalls". The insulating layers 636 and 638 are each formed by forming an insulating layer by a CVD method or a sputtering method so as to have a single layer structure or a stacked-layer structure using an inorganic material such as silicon oxide ($SiO_x$), silicon nitride ($SiN_x$), silicon oxynitride ($SiO_xN_y$) ($x>y>0$), or silicon nitride oxide ($SiN_xO_y$) ($x>y>0$), or an organic material such as an organic resin, and selectively etching the insulating layer by anisotropic etching mainly in a perpendicular direction, so as to be in contact with side surfaces of the gate electrodes 628 and 630. Note that the insulating layers 636 and 638 are used as masks for doping when forming an LDD region. Also, here, the insulating layers 636 and 638 are formed to be in contact with side surfaces of the insulating layers 620 and 622 that are formed under the gate electrodes 628 and 630.

Next, using the gate electrode 628 and the insulating layer 636, and the gate electrode 630 and the insulating layer 638 as masks, a high concentration impurity element is selectively added to each of the regions 614 and 616 of the substrate 600. Accordingly, an impurity region 640 serving as a source region or drain region, a low-concentration impurity region 642 serving as an LDD region, and a channel forming region 644 are formed in the region 614. Further, an impurity region 646 serving as a source region or drain region, an impurity region 648 serving as an LDD region, and a channel forming region 650 are formed in the region 616 (see FIG. 8A). Here, a high concentration impurity element imparting n-type conductivity is added to the region 616 of the substrate 600, and a high concentration impurity element imparting p-type conductivity is added to the region 614. For the impurity element imparting n-type conductivity, phosphorus (P), arsenic (As), or the like can be used. For the impurity element imparting p-type conductivity, boron (B), aluminum (Al), gallium (Ga), or the like can be used. An impurity element with a higher concentration than which is added to the impurity region serving as an LDD region is added to the impurity region serving as a source region or drain region.

Note that in this embodiment mode, addition of the impurity element is performed with the regions 614 and 616 of the substrate 600 that do not overlap with the gate electrodes 628 and 630 exposed. Therefore, the channel forming region 644 and the channel forming region 650 formed in the region 614 and the region 616 of the substrate 600, respectively, can be formed in a self-aligning manner with the gate electrodes 628 and 630, respectively.

Figure 8A:
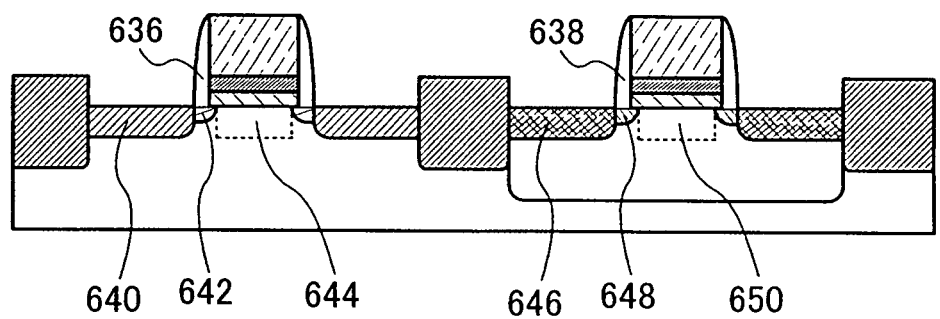
FIGS. 8A and 8B show an example of a manufacturing method of a semiconductor device of the present invention.
Figure 8B:
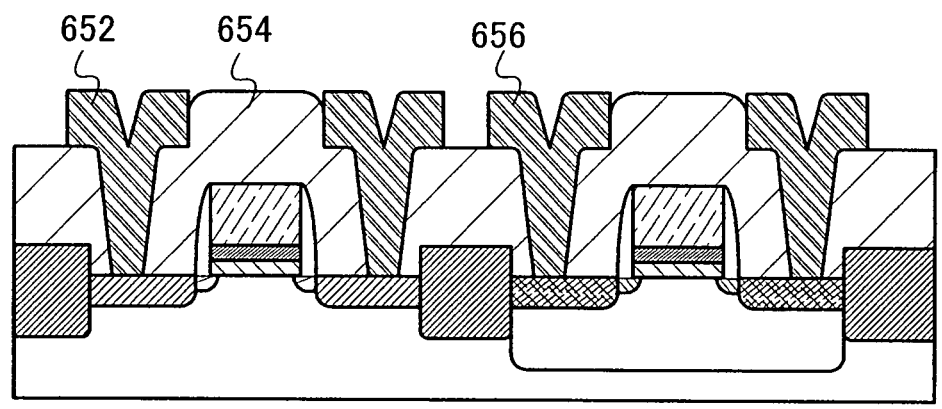

Next, an insulating layer 654 is formed so as to cover the gate electrodes 628 and 630, the insulating layers 636 and 638, and the like provided over the regions 614 and 616 of the substrate 600. Then, over the insulating layer 654, a conductive layer 652 that is electrically connected to the impurity region 640 formed in the region 614, and a conductive layer 656 that is electrically connected to the impurity region 646 formed in the region 616, are formed (FIG. 8B).

The insulating layer 654 can be provided to have a single layer structure or a stacked-layer structure by a CVD method, a sputtering method, or the like, using an inorganic material such as silicon oxide ($SiO_x$), silicon nitride ($SiN_x$), silicon oxynitride ($SiO_xN_y$) ($x>y>0$), or silicon nitride oxide ($SiN_xO_y$) ($x>y>0$); a material containing carbon such as DLC (diamond-like carbon); an organic material such as epoxy, polyimide, polyamide, polyvinylphenol, benzocyclobutene, or acrylic; or a siloxane material such as a siloxane resin. Note that the siloxane material corresponds to a material containing a Si—O—Si bond. A skeletal structure of siloxane is composed of a bond between silicon (Si) and oxygen (O). For a substituent, an organic group containing at least hydrogen (for example, an alkyl group or aromatic hydrocarbon) is used. For the substituent, a fluoro group can also be used. Alternatively, both the organic group containing at least hydrogen and the fluoro group can be used for the substituent.

Also, the insulating layer 654 may be formed by forming an insulating layer by a CVD method or a sputtering method, and then subjecting the insulating layer to a high density plasma treatment. In this case, the high density plasma treatment is performed under an oxygen atmosphere or a nitrogen atmosphere using plasma that is exited by a high frequency wave and which has an electron density of more than or equal to $1 \times 10^{11}$ cm$^{-3}$ and an electron temperature of less than or equal to 1.5 eV. Specifically, it is preferable to use plasma with an electron density of $1 \times 10^{11}$ cm$^{-3}$ to $1 \times 10^{13}$ cm$^{-3}$ inclusive, and an electron temperature of 0.5 eV to 1.5 eV inclusive. Also, in the case of performing the high density plasma treatment under the oxygen atmosphere, at least oxygen is used for the supply gas, and a rare gas (includes at least one of He, Ne, Ar, Kr, and Xe), hydrogen, or the like may be used in addition. Here, for an oxygen supply source, ozone ($O_3$), nitrous oxide ($N_2O$), nitric oxide (NO), or nitrogen dioxide ($NO_2$) can be used besides oxygen. For a hydrogen supply source, water ($H_2O$) or hydrogen peroxide ($H_2O_2$) can be used besides hydrogen. In the case of performing the high density plasma treatment under the nitrogen atmosphere, at least nitrogen or ammonia is used for the supply gas, and a rare gas (includes at least one of He, Ne, Ar, Kr, and Xe), or the like may be used in addition.

Each of the conductive layers 652 and 656 can be formed to have a single layer structure or a stacked-layer structure, using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material or compound material mainly containing the element. An alloy material mainly containing aluminum corresponds to, for example, a material mainly containing aluminum that also contains nickel, or an alloy material mainly containing aluminum that also contains nickel and one or both of carbon and silicon. For the conductive layers 652 and 656, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer, may be employed. Note that the barrier layer corresponds to a thin film made of titanium, a nitride of titanium, molybdenum, or a nitride of molybdenum. Since aluminum and aluminum-silicon have low resistance values and are inexpensive, they are most suitable for materials for forming a conductive layer. Also, by providing a barrier layer in each of an upper layer and a lower layer, generation of hillock of aluminum or aluminum-silicon can be prevented. Here, the conductive layers 652 and 656 can be formed by selectively growing tungsten (W) by a CVD method.

By the foregoing process, a semiconductor device provided with a p-channel transistor formed in the region 614 of the substrate 600 and an n-channel transistor formed in the region 616 can be obtained.

Note that the structure of a transistor shown in this embodiment mode is one example, and the structure is not limited to the structure in the figures. For example, the structure of the transistor may be a double-gate structure, a FinFET structure, or the like. Also, the structure may be that in which an LDD region is not formed. A FinFET structure is favorable since a short channel effect that comes with miniaturization of transistor size can be suppressed.

By forming an insulating layer serving as a gate insulating layer using the present invention, a gate insulating layer with favorable withstand voltage can be realized. In particular, a gate insulating layer having withstand voltage that has little defect in initial withstand voltage in the A mode and the B mode can be realized. Accordingly, a defect in withstand voltage of the gate insulating layer can be prevented, and a highly reliable semiconductor device can be manufactured. Also, yield of the semiconductor device can be improved.

Also in this embodiment mode, element division is realized by providing a plurality of grooves in the semiconductor substrate and providing the grooves with an insulating layer. With such a structure, a defect of a division region resembling a shape of beak or head of a bird (also called a "bird's beak" or "bird's head") being formed in a rim portion of an insulating layer for dividing an element, which is a problem in a selective oxidation method, can be prevented.

Note that this embodiment mode can be appropriately combined with other embodiment modes described in this specification.

Embodiment Mode 5

In this embodiment mode, an example of a nonvolatile semiconductor storage device is described. Here, a case is described in which a nonvolatile memory element composing a memory portion, and an element such as a thin film transistor (TFT) composing a logic portion that performs control or the like of a memory portion that is provided over the same substrate with the memory portion, are formed at the same time.

A nonvolatile memory element has similar structure to that of a MOSFET (metal oxide semiconductor field effect transistor), and a characteristic is that a region in which charge can be accumulated for a long period of time is provided over a channel forming region. This charge accumulation region is formed over an insulating layer, and is also called a "floating gate electrode" because it is insulated and isolated from the periphery. Alternatively, the floating gate electrode is also called a "charge accumulation layer" because it has a function of accumulating charge. In this specification, this charge accumulation region including mainly the floating gate electrode is also called the "charge accumulation layer". A control gate electrode is also provided over the floating gate electrode with an insulating layer therebetween.

In a so-called floating gate type nonvolatile semiconductor storage device having such a structure, an operation in which charge is accumulated in the charge accumulation layer or released is performed by voltage applied to a control gate electrode. That is, when the charge which is to be retained in the charge accumulation layer is taken in and out, data is stored. Specifically, the charge is injected into or extracted from the charge accumulation layer by application of high voltage between a semiconductor layer or a semiconductor substrate in which a channel forming region is formed and the control gate electrode. It is said that, at this time, Fowler-Nordheim (F-N) type tunnel current (NAND type) or a thermoelectron (NOR type) flows through an insulating layer formed over the channel forming region. Accordingly, there is a case where the insulating layer over the channel forming region is referred to as a tunnel insulating layer.

FIGS. 9A to 12C show an example of a manufacturing method of a nonvolatile semiconductor storage device of the present invention. Note that in each of FIGS. 9A to 12C, a transistor provided in a logic portion is shown between each of A and B and C and D, a nonvolatile memory element provided in a memory portion is shown between E and F, and a transistor provided in the memory portion is shown between G and H. Also, in this embodiment mode, although a case is described in which the transistor provided between A and B is a p-channel transistor, the transistors provided between C and D and G and H are n-channel transistors, and movement of a carrier of the nonvolatile memory element provided between E and F is carried out by electrons, the nonvolatile semiconductor storage device of the present invention is not limited thereto.

Note that since a transistor for control that is provided in the memory portion has higher driving voltage compared to a transistor that is provided in the logic portion, it is preferable that a gate insulating layer or the like of the transistor provided in the memory portion and that of the transistor provided in the logic portion are formed with different thicknesses. For example, when driving voltage is low and variation in threshold voltage is desired to be small, a transistor with a thin gate insulating layer is preferably provided, and when driving voltage is high and withstand voltage of the gate insulating layer is desired, a transistor with a thick gate insulating layer is preferably provided.

Accordingly in this embodiment mode, a case is described below with reference to drawings, in which a gate insulating layer with thin film thickness is formed for the thin film transistor of the logic portion, with a low driving voltage and of which variation in threshold voltage is desirably small; and a gate insulating layer with a thick film thickness is formed for the thin film transistor of the memory portion, with a high driving voltage and of which withstand voltage is desired.

First, island-shaped semiconductor layers 104, 106, 108, and 110 are formed over a substrate 100 with base insulating layer therebetween, and first insulating layers 112, 114, 116, 118 are formed so as to cover the island-shaped semiconductor layers 104, 106, 108, and 110, respectively. Then, a charge accumulation layer 120 is formed so as to cover the first insulating layers 112, 114, 116, and 118 (see FIG. 9A). The island-shaped semiconductor layers 104, 106, 108, and 110 can be provided by forming an amorphous semiconductor layer over the base insulating layer 102, which is formed in advance over the substrate 100, by a CVD method or a sputtering method using a material mainly containing silicon (Si) (for example, Si, $Si_xGe_{(1-x)}$, or the like), or the like, and then selectively etching after the amorphous semiconductor layer is crystallized. Alternatively, the amorphous semiconductor layer may be selectively etched without being crystallized, and the island-shaped semiconductor layers 104, 106, 108, and 110 made of the amorphous semiconductor layer may be formed.

Crystallization of the amorphous semiconductor layer can be performed by a laser crystallization method, a thermal crystallization method using RTA or an annealing furnace, a thermal crystallization method using a metal element that promotes crystallization, a method combining these methods, or the like.

When the semiconductor layer is crystallized or recrystallized by laser light irradiation, a second harmonic (wavelength of 532 nm) of an LD pumped continuous wave (CW) laser ($YVO_4$) can be used as a light source of the laser light. It is not necessary to limit to the second harmonic in particular; however, the second harmonic is superior to other higher harmonics in terms of energy efficiency. When a semiconductor layer is irradiated with a CW laser, the semiconductor layer can receive energy continuously. Therefore, once the semiconductor layer is in a melted state, the melted state can be continued. Moreover, a solid-liquid interface of the semiconductor layer can be moved by scanning the CW laser, and a crystal grain which is long in one direction along this moving direction can be formed. In addition, a solid-state laser is used because highly stable output and stable processing are expected as compared with a gas laser or the like. It is to be noted that not only a CW laser but also a pulsed laser with a repetition rate of more than or equal to 10 MHz can be used. With a pulsed laser having a high repetition rate, when the pulse interval of the laser is shorter than a period for the melted semiconductor layer to solidify, the semiconductor layer can constantly be in the melted state, which enables the semiconductor layer to have a crystal grain that is long in one direction by the movement of the solid-liquid interface. Other CW lasers and pulsed lasers with repetition rates of more than or equal to 10 MHz can be used. For example, an Ar laser, a Kr laser, a $CO_2$ laser, or the like can be used as a gas laser. Moreover, a metal vapor laser such as a helium-cadmium laser is given as a gas laser. A YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like can be used as a solid-state laser. Moreover, among the solid-state lasers, a YAG laser, a $Y_2O_3$ laser, a $GdVO_4$ laser, a $YVO_4$ laser, or the like can also be used as a ceramic laser. It is preferable to emit laser light with $TEM_{00}$ (single transverse mode) from a laser oscillator because a linear beam spot on a surface to be irradiated can have more homogeneous energy. Besides those above, a pulsed excimer laser may be used.

As the substrate 100, a glass substrate, a quartz substrate, a sapphire substrate, a ceramic substrate, a metal substrate, or the like can be used. Alternatively, as a plastic substrate, a substrate of polyethylene terephthalate (PET), polyethylene naphthalate (PNT), polyethersulfone (PES), acrylic, or the like can be selected, and a substrate can be used as long as the substrate can at least withstand heat that is generated in a process. Here, a glass substrate is used as the substrate 100.

The base insulating layer 102 is formed by a CVD method or a sputtering method, using an inorganic material such as silicon oxide ($SiO_x$), silicon nitride ($SiN_x$), silicon oxynitride ($SiO_xN_y$) (x>y), silicon nitride oxide ($SiN_xO_y$) (x>y>0). For example, when the base insulating layer 102 is to have a stacked-layer structure, a silicon nitride oxide layer may be formed as an insulating layer of a first layer, and a silicon oxynitride layer may be formed as an insulating layer of a second layer. Alternatively, a silicon nitride layer may be formed as the insulating layer of the first layer and a silicon oxide layer may be formed as the insulating layer of the second layer. In this manner, by forming the base insulating layer 102 which serves as a blocking layer, an alkali metal such as Na or an alkaline earth metal from the substrate 100 having an adverse effect on an element to be formed over the substrate can be prevented. Note that when quartz is used for the substrate 100, the base insulating layer 102 is not necessary to be formed.

The first insulating layers 112, 114, 116, and 118 are formed by subjecting the semiconductor layers 104, 106, 108, and 110 to a high density plasma treatment. The high density plasma treatment is performed by first using the first supply gas containing a rare gas, oxygen, and hydrogen, and then switching the supply gas to the second supply gas containing a rare gas and oxygen. The first supply gas is preferably supplied with a flow rate of rare gas:oxygen:hydrogen that is in a range of 100:1 to 200:1 inclusive. Also, by the high density plasma treatment, using the first supply gas, an insulating layer with a film thickness of more than or equal to 8 nm is preferably formed. The second supply gas is preferably supplied with a flow rate of rare gas:oxygen that is in a range of 100:1 to 200:1 inclusive. Further, the second supply gas may contain hydrogen as long as it is in an amount that is less than or equal to ⅕ of an amount of oxygen. In this case, the amount of hydrogen of the second supply gas is less than that of the first supply gas. Also, the high density plasma treatment using the second supply gas is preferably performed for 60 seconds or longer.

Also, in the high density plasma treatment, plasma that is excited by a high frequency wave such as a microwave (typically, 2.54 GHz) and which has an electron density of more than or equal to $1 \times 10^{11}$ $cm^{-3}$ and an electron temperature of lower than or equal to 1.5 eV is used. Specifically, it is preferable to use plasma with an electron density of $1 \times 10^{11}$ $cm^{-3}$ to $1 \times 10^{13}$ $cm^{-3}$ inclusive, and an electron temperature of 0.5 eV to 1.5 eV inclusive.

For a rare gas supply source used for the supply gas, at least one of helium (He), neon (Ne), argon (Ar), krypton (Kr), and xenon (Xe) can be used. For an oxygen supply source, oxygen ($O_2$), ozone ($O_3$), nitrous oxide ($N_2O$), nitric oxide (NO), or nitrogen dioxide ($NO_2$) can be used. For a hydrogen supply source, hydrogen ($H_2$), water ($H_2O$), or hydrogen peroxide ($H_2O_2$) can be used. Note that when a rare gas is used for the supply gas, there is a case where an insulating layer that is formed contains the rare gas.

Here, the high density plasma treatment is performed by supplying Ar gas in a range of 500 sccm to 1000 sccm inclusive, 5 sccm of $O_2$ gas, and 5 sccm of $H_2$ gas as the first supply gas and forming a silicon oxide layer with a film thickness of more than or equal to 8 nm. Also, the high density plasma treatment is performed by supplying Ar gas in a range of 500 sccm to 1000 sccm inclusive and 5 sccm of $O_2$ gas as the second supply gas, for 60 seconds or longer. Then, by oxidizing a surface of a semiconductor layer by the high density plasma treatment, a silicon oxide layer with a film thickness of 8 nm to 20 nm inclusive is ultimately formed as the first insulating layers 112, 114, 116, and 118.

Further, the first insulating layers 112, 114, 116, and 118 may be formed by a CVD method or a sputtering method using a material such as silicon oxide ($SiO_x$), silicon nitride ($SiN_x$), silicon oxynitride ($SiO_xN_y$) (x>y>0), silicon nitride oxide ($SiN_xO_y$) (x>y>0), aluminum oxide ($Al_xO_y$), tantalum oxide ($Ta_xO_y$), or hafnium oxide ($HfO_x$). Also, the insulating layer may be subjected to a high density plasma treatment. In this case, the high density plasma treatment is performed under an oxygen atmosphere or a nitrogen atmosphere using plasma that is excited by a high frequency wave and which has an electron density of more than or equal to $1 \times 10^{11}$ cm$^{-3}$ and an electron temperature of less than or equal to 1.5 eV. Specifically, it is preferable to use plasma with an electron density of $1 \times 10^{11}$ cm$^{-3}$ to $1 \times 10^{13}$ cm$^{-3}$ inclusive, and an electron temperature of 0.5 eV to 1.5 eV inclusive. Also, in the case of performing the high density plasma treatment under the oxygen atmosphere, at least oxygen is used for the supply gas, and a rare gas (includes at least one of He, Ne, Ar, Kr, and Xe), hydrogen, or the like may be used in addition. At this time, for an oxygen supply source used for the supply gas, ozone, nitrous oxide, nitric oxide, or nitrogen dioxide can be used besides oxygen. Furthermore, for a hydrogen supply source, water ($H_2O$) or hydrogen peroxide ($H_2O_2$) can be used besides hydrogen. In the case of performing the high density plasma treatment under the nitrogen atmosphere, at least nitrogen or ammonia is used for the supply gas, and a rare gas (includes at least one of He, Ne, Ar, Kr, and Xe), or the like may be used in addition. The first insulating layers 112, 114, 116, and 118 are desirably formed with a thickness of 8 nm to 10 nm inclusive.

Since the high density plasma treatment performed in the present invention has high electron density of plasma as in more than or equal to $1 \times 10^{11}$ cm$^{-3}$ and an electron temperature around the semiconductor layer which is a treatment object, is low, damage to the semiconductor by the plasma can be prevented.

In this embodiment mode, the first insulating layer 116 formed over the semiconductor layer 108 provided in the memory portion serves as a tunnel insulating layer in a nonvolatile memory element that is completed later. Accordingly, the thinner the film thickness of the first insulating layer 116, the easier it is for a tunnel current to flow, and high speed operation as a memory becomes possible. Also, the thinner the film thickness of the first insulating layer 116, the more possible it is to accumulate charge in a floating gate electrode that is formed later at low voltage; therefore, power consumption of the nonvolatile semiconductor storage device can be reduced. Accordingly, film thicknesses of the first insulating layers 112, 114, 116, and 118 are preferably thin.

In general, although there is a thermal oxidation method as a method of forming an insulating layer thinly over a semiconductor layer, when a substrate without a melting point that is not sufficiently high, such as a glass substrate, is used as the substrate 100, it is extremely difficult to form the first insulating layers 112, 114, 116, and 118 by a thermal oxidation method. Further, film quality of an insulating layer formed by a CVD method or a sputtering method is not sufficient because a defect is contained inside the film, and when the insulating film is formed with thin film thickness, there is a problem that a defect such as a pinhole occurs. Also, when an insulating layer is formed by a CVD method or a sputtering method, coverage of an end portion of a semiconductor layer is particularly insufficient, and there is a case where a charge accumulation layer or the like formed later over the first insulating layer 116 and the semiconductor layer are short-circuited. Accordingly, by forming the first insulating layer 116 by subjecting the semiconductor layer to the high density plasma treatment, an insulating layer that is more dense than the insulating layer formed by a CVD method or a sputtering method can be formed. Further, in the high density plasma treatment, by switching the supply gas in the middle of the treatment from a gas containing hydrogen to a gas not containing hydrogen, an insulating layer with favorable withstand voltage can be formed. Furthermore, by directly subjecting the semiconductor layer 108 to the high density plasma treatment, an end portion of the semiconductor layer 108 can be sufficiently covered by the first insulating layer 116. As a result, high speed operation and a charge retention characteristic can be improved.

The charge accumulation layer 120 can be formed as a single layer or to have a stacked-layer structure of two or more layers. Specifically, the charge accumulation layer 120 can be formed using an element selected from silicon (Si), germanium (Ge), tungsten (W), titanium (Ti), tantalum (Ta), molybdenum (Mo), and the like; an alloy material mainly containing the element; or a compound material mainly containing the element (for example, a nitride, an oxide, or the like). As the compound of the element, silicon nitride, silicon nitride oxide, silicon carbide, silicon germanium containing germanium at a concentration of lower than 10 atomic %, tantalum nitride, tantalum oxide, tungsten nitride, titanium nitride, titanium oxide, tin oxide, or the like can be used. Alternatively, a silicide of the element (for example, tungsten silicide, titanium silicide, or nickel silicide) can be used. Also, when silicon is used, an impurity element such as phosphorus or boron may be used. Here, as the charge accumulation layer 120, a film mainly containing germanium is formed with a thickness of 1 nm to 20 nm inclusive, preferably 5 nm to 10 nm inclusive, by a plasma CVD method in an atmosphere containing a germanium element (for example $GeH_4$). The charge accumulation layer 120 formed over the semiconductor layer 108 which is provided in a memory portion serves as a floating gate electrode in a nonvolatile semiconductor storage device that is completed later. For example, in a case where a semiconductor layer is formed using a material mainly containing Si, and then a conductive layer, which contains germanium with a smaller energy gap than that of Si which serves as a floating gate electrode, is provided over the semiconductor layer with a first insulating layer serving as a tunnel insulating layer therebetween, a second barrier formed by an insulating layer against a charge of the floating electrode is energetically higher than a first barrier formed by an insulating layer against a charge of the semiconductor layer. As a result, a charge can easily be injected to the floating gate electrode from the semiconductor layer, and disappearance of the charge from the floating gate electrode can be prevented. In other words, when operating as a memory, writing can be done highly efficiently with low voltage, as well as improve the charge retention characteristic.

Next, the first insulating layers 112, 114, and 118 formed over the semiconductor layers 104, 106, and 110, respectively, and the charge accumulation layer 120 are selectively removed, and the first insulating layer 116 and the charge accumulation layer 120 formed over the semiconductor layer 108 are left. Here, the semiconductor layer 108, the first insulating layer 116, and the charge accumulation layer 120 provided in the memory portion are selectively covered by a resist mask, and the first insulating layers 112, 114, and 118 formed over the semiconductor layers 104, 106, and 110, respectively, are selectively removed by etching (see FIG. 9B).

Figure 9A:
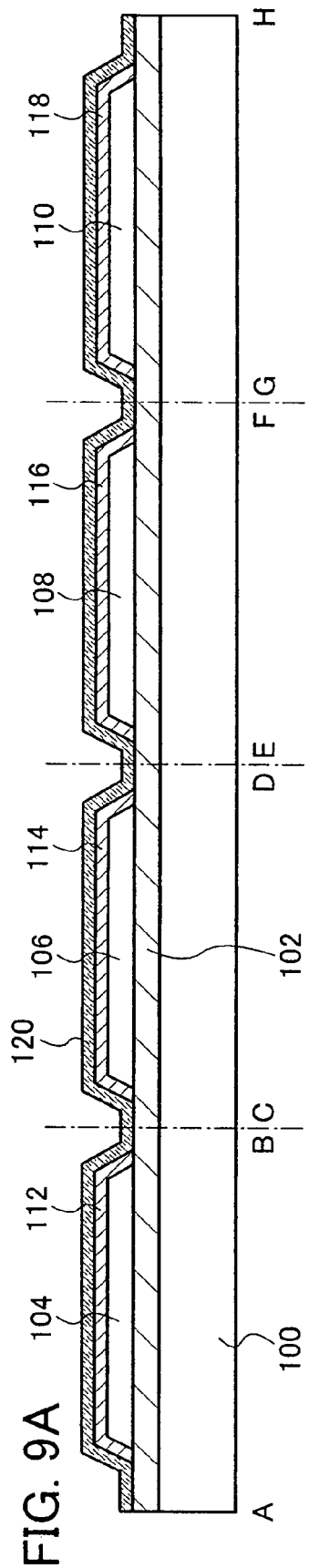
FIGS. 9A to 9C show an example of a manufacturing method of a nonvolatile semiconductor storage device of the present invention.
Figure 9B:
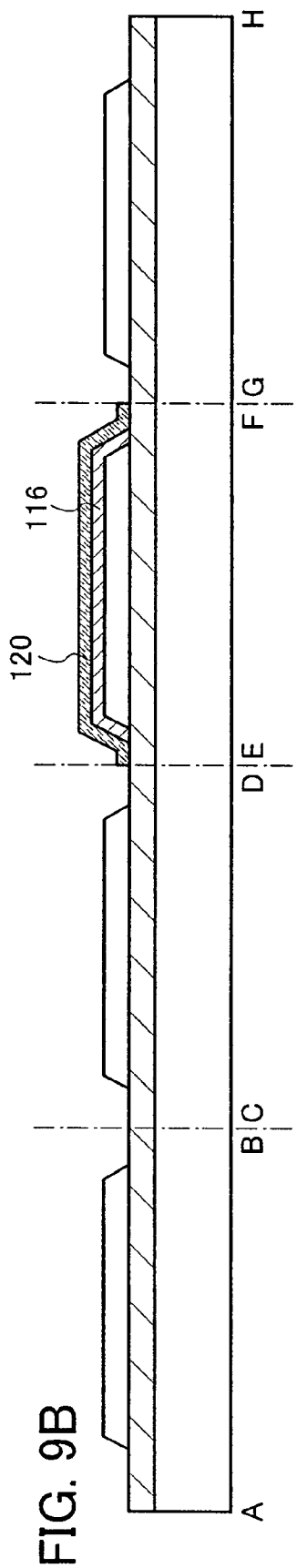
Figure 9C:
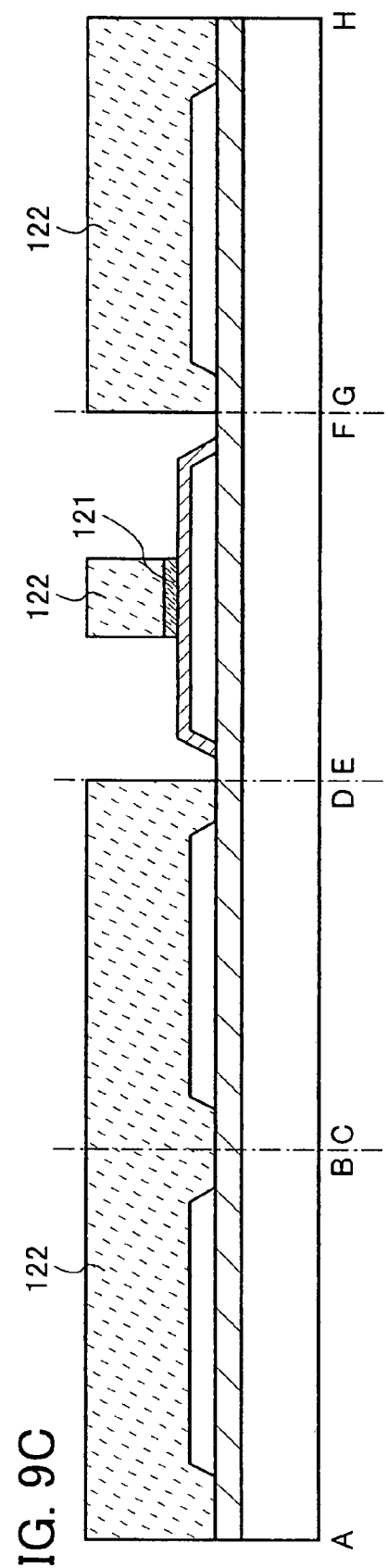

Then, a resist mask 122 is formed so as to selectively cover the semiconductor layers 104, 106, and 110 and a portion of the charge accumulation layer 120 formed over the semiconductor layer 108, and by selectively removing the charge accumulation layer 120 that is not covered by the resist mask 122 by etching, a portion of the charge accumulation layer 120 is left, and a charge accumulation layer 121 is formed (see FIG. 9C).

Next, an impurity region is formed in a specific region of the semiconductor layer 110. Here, after removing the resist mask 122, by forming a resist mask 124 so as to cover the semiconductor layers 104, 106, and 108 and a portion of the semiconductor layer 110 and then adding a low concentration impurity element to the semiconductor layer 110 that is not covered by the resist mask 124, an impurity region 126 is formed (see FIG. 10A). For the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga) or the like can be used. Here, as the impurity element, phosphorus (P) is introduced into the semiconductor layer 110. Note that a portion of the impurity region 126 forms an LDD region that is formed later.

Then, a second insulating layer 128 is formed so as to cover the semiconductor layers 104, 106, and 110, and the first insulating layer 116 and the charge accumulation layer 121 formed over the semiconductor layer 108 (see FIG. 10B).

The second insulating layer 128 is formed to have a single layer structure or a stacked-layer structure, by a CVD method or a sputtering method using a material such as silicon oxide ($SiO_x$), silicon oxynitride ($SiO_xN_y$) (x>y>0), silicon nitride oxide ($SiN_xO_y$) (x>y>0), aluminum oxide ($Al_xO_y$), tantalum oxide ($Ta_xO_y$), or hafnium oxide ($HfO_x$). For example, when the second insulating layer 128 is formed as a single layer film, a silicon oxynitride layer or a silicon nitride oxide layer with a film thickness of 5 nm to 50 nm inclusive is formed by a CVD method. Also, when the second insulating layer 128 is formed as a stacked layer films with three layers, a silicon oxynitride layer is formed as an insulating layer of a first layer, a silicon nitride layer is formed as an insulating layer of a second layer, and a silicon oxynitride layer is formed as an insulating layer of a third layer. Alternatively, for the second insulating layer 128, a material such as an oxide or nitride of germanium may be used. The second insulating layer 128 is desirably formed with a film thickness of 1 nm to 100 nm inclusive, and preferably 20 nm to 60 nm inclusive.

Also, the second insulating layer 128 may be formed by forming an insulating layer by a CVD method or a sputtering method, and then subjecting the insulating layer to a high density plasma treatment. In this case, the high density plasma treatment is performed under an oxygen atmosphere or a nitrogen atmosphere using plasma that is excited by a high frequency wave and which has an electron density of more than or equal to $1 \times 10^{11}$ cm$^{-3}$ and an electron temperature of less than or equal to 1.5 eV. Specifically, it is preferable to use plasma with an electron density of $1 \times 10^{11}$ cm$^{-3}$ to $1 \times 10^{13}$ cm$^{-3}$ inclusive, and an electron temperature of 0.5 eV to 1.5 eV inclusive. Also, in the case of performing the high density plasma treatment under the oxygen atmosphere, at least oxygen is used for the supply gas, and a rare gas (includes at least one of He, Ne, Ar, Kr, and Xe), hydrogen, or the like may be used in addition. At this time, for an oxygen supply source, ozone ($O_3$), nitrous oxide ($N_2O$), nitric oxide (NO), or nitrogen dioxide ($NO_2$) can be used besides oxygen. For a hydrogen supply source, water ($H_2O$) or hydrogen peroxide ($H_2O_2$) can be used besides hydrogen. In the case of performing the high density plasma treatment under the nitrogen atmosphere, at least nitrogen or ammonia is used for the supply gas, and a rare gas (includes at least one of He, Ne, Ar, Kr, and Xe), or the like may be used in addition.

Further, the second insulating layer 128 can be made to have a desirable thickness by forming an insulating layer using the high density plasma treatment and then forming an insulating layer over the insulating layer using a CVD method or a sputtering method. In this case, the charge accumulation layer formed over the semiconductor layer 108 is formed of silicon. For the high density plasma treatment, a method described in the formation method of the foregoing first insulating layer 116 may be used.

Note that the second insulating layer 128 formed over the semiconductor layer 108 serves as a control insulating layer in a nonvolatile memory element to be completed later. The second insulating layer 128 formed over the semiconductor layer 110 serves as a gate insulating layer in a transistor to be completed later. Note that a "control insulating layer" in this specification refers to an insulating layer provided between an electrode serving as a floating gate electrode and an electrode serving as a control gate electrode.

Next, a resist mask 130 is selectively formed so as to cover the second insulating layer 128 formed over the semiconductor layers 108 and 110, and the second insulating layer 128 formed over the semiconductor layers 104 and 106 are selectively removed (see FIG. 10C).

Then, third insulating layers 132 and 134 are formed so as to cover the semiconductor layers 104 and 106, respectively (see FIG. 11A).

The third insulating layers 132 and 134 are formed using any method described in the formation methods of the foregoing first insulating layers 112, 114, 116, and 118. For example, by subjecting the semiconductor layers 104 and 106 to the high density plasma treatment, a layer containing silicon oxide can be formed for each of the third insulating layers 132 and 134. Alternatively, each of the third insulating layers 132 and 134 may be formed by a CVD method or a sputtering method, using a material such as silicon oxide ($SiO_x$), silicon oxynitride ($SiO_xN_y$) (x>y>0), or silicon nitride oxide ($SiN_xO_y$) (x>y>0). The third insulating layers are desirably formed with a film thickness of 1 nm to 20 nm inclusive, preferably, 8 nm to 10 nm inclusive. The third insulating layers 132 and 134 formed over the semiconductor layers 104 and 106, respectively, serve as gate insulating layers in a transistor to be completed later.

Next, a conductive layer is formed so as to cover the third insulating layers 132 and 134 formed over the semiconductor layers 104 and 106 and the second insulating layer 128 formed over the semiconductor layers 108 and 110 (see FIG. 11B). Here, an example in which a conductive layer 136 and a conductive layer 138 are stacked in this order as the conductive layer is shown. Naturally, the conductive layer may be formed as a single layer film or a stacked-layer film with three or more layers.

Each of the conductive layers 136 and 138 can be formed of an element selected from tantalum (Ta), tungsten (W), titanium (Ti), molybdenum (Mo), aluminum (Al), copper (Cu), chromium (Cr), niobium (Nb) and the like; an alloy material mainly containing the element; or a compound material mainly containing the element. Alternatively, a metal nitride film that is a nitride of the element can also be used. In addition, a semiconductor material typified by polycrystalline silicon doped with an impurity element such as phosphorus can also be used.

Here, tantalum nitride is used to form the conductive layer 136, and the conductive layer 138 is formed thereover using tungsten. Alternatively, a single layer film or stacked layer films formed using tungsten nitride, molybdenum nitride, or titanium nitride can be used for the conductive layer 136, and a single layer film or stacked layer films formed using tantalum, molybdenum, or titanium can be used for the conductive layer 138.

Next, by selectively etching the conductive layers 136 and 138 provided as stacked layers, the conductive layers 136 and 138 are left in a portion over each of the semiconductor layers 104, 106, 108, and 110, forming a gate electrode 140, a gate electrode 142, a gate electrode 144, and a gate electrode 146, respectively (see FIG. 11C). Note that the gate electrode 144 formed over the semiconductor layer 108 provided in the memory portion serves as a control gate electrode in a non-volatile memory element that is formed later. Also, the gate electrodes 140, 142, and 146 serve as gate electrodes of a transistor to be completed later.

Note that although in this embodiment mode, when the gate electrodes 140, 142, 144, and 146 are formed, the conductive layer 136 and the conductive layer 138 are etched so that end portions of the conductive layer 136 and the conductive layer 138 that are left are roughly aligned with each other, the present invention is not limited thereto. For example, in a case where each gate electrode has a stacked-layer structure of two layers, it may be that a width of the conductive layer of a lower layer is wider than that of the conductive layer of an upper layer. Also, after forming the gate electrodes, an insulating layer called a "sidewall" may be formed over a side surface of each of the gate electrodes.

Next, a resist mask 148 is selectively formed so as to cover the semiconductor layer 104, and an impurity region is formed by adding a high concentration impurity element to the semiconductor layers 106, 108, and 110, using the resist mask 148, the gate electrodes 142, 144, and 146 as masks (see FIG. 12A). For the impurity element, an impurity element imparting n-type conductivity or an impurity element imparting p-type conductivity is used. As an impurity element imparting n-type conductivity, phosphorus (P), arsenic (As), or the like can be used. As the impurity element imparting p-type conductivity, boron (B), aluminum (Al), gallium (Ga), or the like can be used. Here, phosphorus (P) is added as the impurity element.

In FIG. 12A, by adding an impurity element, a high concentration impurity region 152 forming a source region or drain region, and a channel forming region 150 are formed in the semiconductor layer 106. Also, in the semiconductor layer 108, a high concentration impurity region 156 forming a source region or drain region, a low concentration impurity region 158 forming an LDD region, and a channel forming region 154 are formed. Further, in the semiconductor layer 110, a high concentration impurity region 162 forming a source region or drain region, a low concentration impurity region 164 forming an LDD region, and a channel forming region 160 are formed. An impurity element is added to the high concentration impurity region serving as a source region or drain region at a higher concentration than the low concentration impurity region forming an LDD region.

Also, the low concentration impurity region 158 formed in the semiconductor layer 108 is formed by the impurity element added in FIG. 12A penetrating through the charge accumulation layer 121 serving as a floating gate electrode. Therefore, in the semiconductor layer 108, the channel forming region 154 is formed in a region that overlaps with the gate electrode 144 and the charge accumulation layer 121, the low concentration impurity region 158 is formed in a region that overlaps with the charge accumulation layer 121 but not with the gate electrode 144, and the high concentration impurity region 156 is formed in a region that does not overlap with either the charge accumulation layer 121 or the gate electrode 144.

Next, a resist mask 166 is selectively formed so as to cover the semiconductor layers 106, 108, and 110, and an impurity region is formed by adding a high concentration impurity element to the semiconductor layer 104 using the resist mask 166 and the gate electrode 140 as masks (see FIG. 12B). For the impurity element, an impurity element imparting n-type conductivity or an impurity element imparting p-type conductivity is used. As an impurity element imparting n-type conductivity, phosphorus (P), arsenic (As), or the like can be used. As the impurity element imparting p-type conductivity, boron (B), aluminum (Al), gallium (Ga), or the like can be used. Here, an impurity element imparting a different conductivity from that of the impurity element introduced to the semiconductor layers 106, 108, and 110 in FIG. 12A is introduced (for example, boron (B)). As a result, a high concentration impurity region 170 forming a source region or drain region, and a channel forming region 168 are formed in the semiconductor layer 104.

Then, an insulating layer 172 is formed so as to cover the second insulating layer 128, the third insulating layers 132 and 134, and the gate electrodes 140, 142, 144, and 146, and then a conductive layer 174 that is electrically connected to the impurity regions 152, 156, 162, and 170 formed in the semiconductor layers 104, 106, 108, and 110, respectively, is formed over the insulating layer 172 (see FIG. 12C).

For the insulating layer 172, a single layer film or stacked layer films are formed by a CVD method, a sputtering method, or the like, using a material containing oxygen or nitrogen such as silicon oxide ($SiO_x$), silicon nitride ($SiN_x$), silicon oxynitride ($SiO_xN_y$) (x>y>0), or silicon nitride oxide ($SiN_xO_y$) (x>y>0); a material containing carbon such as DLC (diamond-like carbon); an organic material such as epoxy, polyimide, polyamide, polyvinylphenol, benzocyclobutene, or acrylic; or a siloxane material such as a siloxane resin. Note that the siloxane material corresponds to a material containing a Si—O—Si bond. A skeletal structure of siloxane is composed of a bond between silicon (Si) and oxygen (O). For a substituent, an organic group containing at least hydrogen (for example, an alkyl group or aromatic hydrocarbon) is used. For the substituent, a fluoro group can also be used. Alternatively, both the organic group containing at least hydrogen and the fluoro group can be used for the substituent. Also, the insulating layer 172 may be formed by forming an insulating layer using a CVD method or a sputtering method and then subjecting the insulating layer to a high density plasma treatment under an oxygen atmosphere or a nitrogen atmosphere.

The conductive layer 174 is formed as a single layer film or stacked layer films, using an element selected from aluminum (Al), tungsten (W), titanium (Ti), tantalum (Ta), molybdenum (Mo), nickel (Ni), platinum (Pt), copper (Cu), gold (Au), manganese (Mn), neodymium (Nd), carbon (C), and silicon (Si); an alloy material mainly containing the element; or a compound material mainly containing the element, by a CVD method, a sputtering method, or the like. An alloy material mainly containing aluminum corresponds to, for example, a material mainly containing aluminum that also contains nickel, or an alloy material mainly containing aluminum that also contains nickel and one or both of carbon and silicon. For the conductive layer 174, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer, may be employed. Note that the barrier layer corresponds to a thin film made of titanium, a nitride of titanium, molybdenum, or a nitride of molybdenum. Since aluminum and aluminum-silicon have low resistance values and are inexpensive, they are most suitable for materials for forming the conductive layer 174. Also, by providing a barrier layer in each of an upper layer and a lower layer, generation of hillock of aluminum or aluminum-silicon can be prevented. Further, by forming a barrier layer made of titanium which is a highly reducible, even if a thin, natural oxide film is formed over a crystalline semiconductor layer, this natural oxide film can be reduced, and favorable contact can be made with the crystalline semiconductor layer.

By the foregoing process, a nonvolatile semiconductor storage device provided with a p-channel thin film transistor formed using the semiconductor layer 104, an n-channel thin film transistor formed using the semiconductor layer 106, a nonvolatile memory element formed using the semiconductor layer 108, and an n-channel thin film transistor formed using the semiconductor layer 110 can be obtained. Note that a structure of a TFT shown in this embodiment mode is one example, and the structure is not limited to that shown in the figures. For example, a TFT structure may be an inversely-staggered structure, a double-gate structure, or the like. A structure of the nonvolatile memory element is one example, and it goes without saying that a variety of known structures can be applied.

By forming an insulating layer serving as a gate insulating layer of a transistor using the present invention, a gate insulating layer with favorable withstand voltage can be realized. In particular, a gate insulating layer having withstand voltage that has little defect in initial withstand voltage in the A mode and the B mode can be realized. Further, a gate insulating layer with a favorable film characteristic can be realized without a high temperature heating treatment. Further, insufficient coverage of an end portion of a semiconductor layer can also be prevented. Accordingly, a defect in withstand voltage of the gate insulating layer can be prevented, and a nonvolatile semiconductor storage device with high reliability can be manufactured. Also, yield of the nonvolatile semiconductor storage device can be improved.

Using the present invention, by forming an insulating layer serving as a tunnel insulating layer of a nonvolatile memory element, a tunnel insulating layer with favorable withstand voltage can be realized. In particular, a tunnel insulating layer having withstand voltage that has little defect in initial withstand voltage in the A mode and the B mode can be realized. Further, a tunnel insulating layer with a favorable film characteristic can be realized without a high temperature heating treatment. Further, insufficient coverage of an end portion of a semiconductor layer by an insulating layer can also be prevented. Accordingly, a defect such as a short circuit between a floating gate electrode and a channel forming region or a leak current, due to a defect in withstand voltage of the tunnel insulating layer or insufficient coverage by the tunnel insulating layer, can be prevented. As a result, as a nonvolatile memory element, a high speed operation and a charge retention characteristic can be improved, and a highly reliable nonvolatile semiconductor storage device can be manufactured. Also, yield of the nonvolatile semiconductor storage device can be improved.

Note that this embodiment mode can be carried out by appropriately combining it with other embodiment modes described in this specification.

Embodiment Mode 6

In this embodiment mode, an example of a nonvolatile semiconductor storage device that is different from that of Embodiment Mode 5 is described. Here, a case of forming a nonvolatile memory element composing a memory portion over a semiconductor substrate, a transistor composing a logic portion in which control or the like of the memory portion is carried out, and the like, at the same time in a nonvolatile semiconductor storage device is described. Note that in each of FIGS. 13A to 16B, a transistor provided in a logic portion is shown between each of A and B and C and D, a nonvolatile memory element provided in a memory portion is shown between E and F, and a transistor provided in a memory portion is shown between G and H. In this embodiment mode, although a case is described in which the transistor provided between A and B is a p-channel transistor, the transistor provided between each of C and D and G and H is an n-channel transistor, and movement of a carrier of the nonvolatile memory element provide between E and F is carried out by electrons, the nonvolatile semiconductor storage device of the present invention is not limited thereto.

First, regions 204, 206, 208, and 210 that divide an element are formed in a substrate 200, and first insulating layers 212, 214, 216, and 218 are formed over a surface of the regions 204, 206, 208, and 210. Then, a charge accumulation layer is formed so as to cover the first insulating layers 212, 214, 216, and 218 (see FIG. 13A). Here, the charge accumulation layer has a stacked-layer structure of a charge accumulation layer 220 and a charge accumulation layer 223. Also, the stacked-layer structure of the charge accumulation layer 220 and the charge accumulation layer 223 serve as a floating gate electrode. The regions 204, 206, 208, and 210 provided in the substrate 200 are separated from each other by insulating layers 202 (also called a "field oxide film"). Also, here, an example in which a monocrystalline Si substrate having n-type conductivity is used as the substrate 200, and a p-well 207 is provided in the region 206, and the regions 208 and 210 of the substrate 200, is shown.

Also, a substrate used as the substrate 200 is not particularly limited as long as it is a semiconductor substrate. For example, a monocrystalline Si substrate having n-type or p-type conductivity; a compound semiconductor substrate (such as a GaAs substrate, an InP substrate, or a SiC substrate); an SOI (silicon on insulator) substrate manufactured using a bonding method or a SIMOX (separation by implanted oxygen) method; or the like can be used.

For the regions 204, 206, 208, and 210 that divide an element, a local-oxidation-of-silicon (LOCOS) method, a trench isolation method, or the like can be appropriately used.

Also, the p-wells formed in the region 206 and the regions 208 and 210 of the substrate 200 can be formed by selectively adding an impurity element imparting p-type conductivity to the substrate 200. For the impurity element imparting p-type conductivity, boron (B), aluminum (Al), gallium (Ga) or the like can be used.

Note that in this embodiment mode, since a semiconductor substrate imparting n-type conductivity is used as the substrate 200, an impurity element is not added to the region 204; however, an n-well may be formed in the region 204 by adding an impurity element imparting n-type conductivity. For the impurity element imparting n-type conductivity, phosphorus (P), arsenic (As), or the like can be used. On the other hand, in a case of using a semiconductor substrate imparting p-type conductivity, it may be that an n-well is formed in the region 204 by adding an impurity element imparting n-type conductivity, and not adding an impurity element to the regions 206, 208, and 210.

The first insulating layers 212, 214, 216, and 218 can be formed of a silicon oxide layer by oxidizing surfaces of the regions 204, 206, 208, and 210 provided in the substrate using a high density plasma treatment. The first insulating layers 212, 214, 216, and 218 are desirably formed with a film thickness of 1 nm to 20 nm inclusive, preferably 8 nm to 10 nm inclusive. The high density plasma treatment here is performed by first using the first supply gas containing a rare gas, oxygen, and hydrogen, and then switching to the second supply gas containing a rare gas and oxygen. The first supply gas is preferably supplied with a flow rate of rare gas:oxygen: hydrogen that is in a range of 100:1:1 to 200:1:1 inclusive. Also, by the high density plasma treatment, using the first supply gas, an insulating layer with a film thickness of more than or equal to 8 nm is preferably formed. The second supply gas is preferably supplied with a flow rate of rare gas:oxygen that is in a range of 100:1 to 200:1 inclusive. Further, the second supply gas may contain hydrogen as long as it is in an amount that is less than or equal to ⅕ of an amount of oxygen. In this case, the amount of hydrogen of the second supply gas is less than that of the first supply gas. Also, the high density plasma treatment using the second supply gas is preferably performed for 60 seconds or longer.

Also, in the high density plasma treatment, plasma that is excited by a high frequency wave such as a microwave (typically, 2.54 GHz), and which has an electron density of more than or equal to $1 \times 10^{11}$ cm$^{-3}$ and an electron temperature of lower than or equal to 1.5 eV is used. Specifically, it is preferable to use plasma with an electron density of $1 \times 10^{11}$ cm$^{-3}$ to $1 \times 10^{13}$ cm$^{-3}$ inclusive, and an electron temperature of 0.5 eV to 1.5 eV inclusive.

For a rare gas supply source used for the supply gas, at least one of helium (He), neon (Ne), argon (Ar), krypton (Kr), and xenon (Xe) can be used. For an oxygen supply source, oxygen ($O_2$), ozone ($O_3$), nitrous oxide ($N_2O$), nitric oxide (NO), or nitrogen dioxide ($NO_2$) can be used. For a hydrogen supply source, hydrogen ($H_2$), water ($H_2O$), or hydrogen peroxide ($H_2O_2$) can be used. Note that when a rare gas is used for the supply gas, there is a case where an insulating layer that is formed contains the rare gas.

Here, the high density plasma treatment is performed by supplying Ar gas in a range of 500 sccm to 1000 sccm inclusive, 5 sccm of $O_2$ gas, and 5 sccm of $H_2$ gas as the first supply gas, so that an insulating layer with a film thickness of 8 nm is formed. Also, the high density plasma treatment is performed by supplying Ar gas in a range of 500 sccm to 1000 sccm inclusive and 5 sccm of $O_2$ gas as the second supply gas, for 60 seconds or longer. Then, by oxidizing surfaces of the regions 204, 206, 208, and 210 provided in the substrate 200 by the high density plasma treatment, silicon oxide layers each with a film thickness of 8 nm to 20 nm inclusive are ultimately formed.

Also, the first insulating layers 212, 214, 216, and 218 can be formed of silicon oxide layers by oxidizing surfaces of the regions 204, 206, 208, and 210 provided in the substrate 200 using a thermal oxidation method.

In this embodiment mode, the first insulating layer 216 formed over the region 208 provided in the memory portion in the substrate 200 serves as a tunnel insulating layer in a nonvolatile memory element that is completed later. Accordingly, the thinner the film thickness of the first insulating layer 216, the easier it is for a tunnel current to flow, and high speed operation as a memory becomes possible. Also, the thinner the film thickness of the first insulating layer 216, the more possible it is to accumulate charge in a floating gate electrode that is formed later at low voltage; therefore, power consumption of the nonvolatile semiconductor storage device can be reduced. Accordingly, film thicknesses of the first insulating layers 212, 214, 216, and 218 are preferably thin.

Also, the nonvolatile semiconductor storage device that is completed later is formed over the region 208 provided in the memory portion, and stores information by injecting electrons via the first insulating layer 216 serving as a tunnel insulating layer.

The charge accumulation layer formed over the first insulating layers 212, 214, 216, and 218 can be formed as a single layer or by stacked layer films of two or more layers. Specifically, the charge accumulation layer 120 can be formed using an element selected from silicon (Si), germanium (Ge), tungsten (W), titanium (Ti), tantalum (Ta), molybdenum (Mo), and the like; an alloy material mainly containing the element; or a compound material mainly containing the element (for example, a nitride, an oxide, or the like). As the compound of the element, silicon nitride, silicon nitride oxide, silicon carbide, silicon germanium containing germanium at a concentration of lower than 10 atomic %, tantalum nitride, tantalum oxide, tungsten nitride, titanium nitride, titanium oxide, tin oxide, or the like can be used. Alternatively, a silicide of the element (for example, tungsten silicide, titanium silicide, or nickel silicide) can be used. Also, when silicon is used, an impurity such as phosphorus or boron may be used. In this embodiment mode, each of the charge accumulation layers 220 and 223 is formed to have a stacked-layer structure of a film containing germanium (Ge) and a film containing silicon (Si). As the film containing germanium, a germanium film, a film containing a silicon-germanium alloy, or the like can be given. Here, as the charge accumulation layer 220, a film mainly containing germanium is formed with a thickness of 1 nm to 20 nm inclusive, preferably 5 nm to 10 nm inclusive, by a plasma CVD method in an atmosphere containing a germanium element (for example $GeH_4$). Thereafter, a film mainly containing silicon is formed as the charge accumulation layer 223 with a thickness of 1 nm to 50 nm inclusive, preferably 1 nm to 20 nm inclusive, by a plasma CVD method in an atmosphere containing a silicon element (for example, $SiH_4$), and the stacked-layer structure of germanium and silicon is provided. For example, in a case where a monocrystalline Si substrate is used as the substrate 200 and then a conductive layer, which contains germanium with a smaller energy gap than that of Si, is provided over a region of the Si substrate with a first insulating layer serving as a tunnel insulating layer therebetween, a second barrier formed by an insulating layer against a charge of the floating electrode is energetically higher than a first barrier formed by an insulating layer against a charge of the region of the Si substrate. As a result, a charge can easily be injected to the floating gate electrode from the region of the Si substrate, and disappearance of the charge from the floating gate electrode can be prevented. In other words, when operating as a memory, writing can be done highly efficiently with low voltage, as well as improve the charge retention characteristic. Note that in the substrate 200, the stacked-layer structure including the charge accumulation layer 220 and the charge accumulation layer 223 formed over the region 208 serves as a floating gate electrode in a nonvolatile memory element that is completed later. Also, the stacked-layer structure may be provided by sequentially stacking the film containing germanium and the silicon-germanium alloy.

Next, the first insulating layers 212, 214, and 218, and the charge accumulation layers 220 and 223 formed over the regions 204, 206, and 210 in the substrate 200 are selectively removed, and a stacked-layer structure including the first insulating layer 216, the charge accumulation layer 220, and the charge accumulation layer 223 formed over the region 208 are left. Here, the stacked-layer structure including the region 208 provided in the memory portion, the first insulating layer 216, the charge accumulation layer 220, and the charge accumulation layer 223 is selectively covered with a resist mask, and stacked-layer structures including the first insulating layers 212, 214, and 218, the charge accumulation layer 220 and the charge accumulation layer 223 formed over the regions 204, 206, and 210 are selectively removed by etching (see FIG. 13B).

Then, a second insulating layer 228 is formed so as to cover the regions 204, 206, and 210 in the substrate 200, and the stacked-layer structure including the first insulating layer 216, and the charge accumulation layers 220 and 223 formed over the region 208 (see FIG. 13C).

The second insulating layer 228 is formed by a CVD method, a sputtering method, or the like using a material such as silicon oxide ($SiO_x$), silicon oxynitride ($SiO_xN_y$) (x>y>0), silicon nitride oxide ($SiN_xO_y$) (x>y>0), aluminum oxide ($Al_xO_y$), tantalum oxide ($Ta_xO_y$), or hafnium oxide ($HfO_x$). Also, the insulating layer may be subjected to a high density plasma treatment under an oxygen atmosphere or a nitrogen atmosphere. The second insulating layer 228 is desirably formed with a film thickness of 1 nm to 100 nm inclusive, preferably 20 nm to 60 nm inclusive.

Further, the second insulating layer 228 can be obtained by forming an insulating layer using a high density plasma treatment, and then forming an insulating layer using a CVD method or a sputtering method over the insulating layer and making it into a desirable thickness. In this case, the charge accumulation layer formed over the region 208 is formed of silicon. For the high density plasma treatment, the method shown in the formation method of the foregoing first insulating layer 216 may be used.

Note that the second insulating layer 228 formed over the region 208 serves as a control insulating layer in a nonvolatile memory element that is completed later. The second insulating layer 228 formed over the region 210 serves as a gate insulating layer in a transistor that is completed later.

Figure 14A:
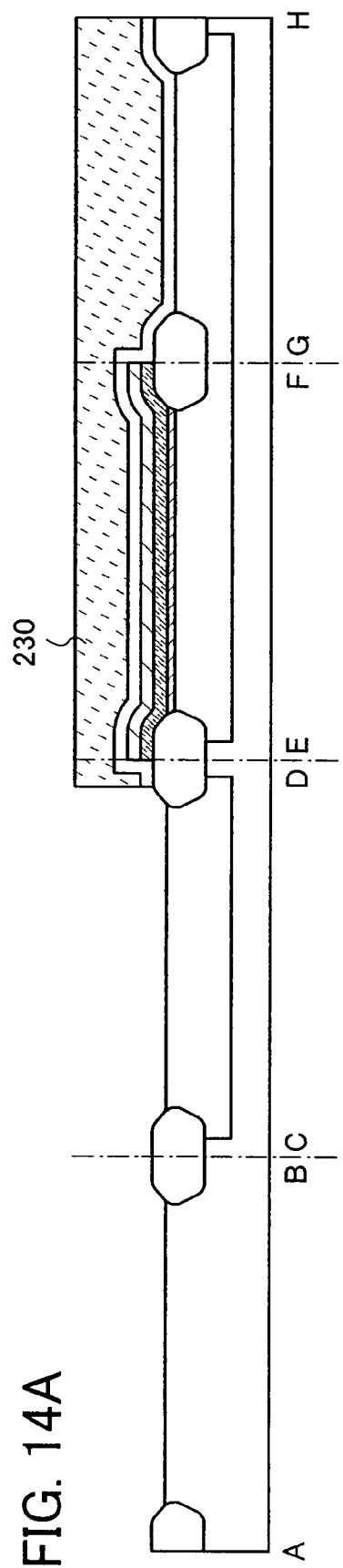
FIGS. 14A to 14C show an example of a manufacturing method of a nonvolatile semiconductor storage device of the present invention.

Next, a resist mask 230 is selectively formed so as to cover the second insulating layer 228 formed over the regions 208 and 210, and the second insulating layer 228 formed over the regions 204 and 206 are selectively removed (see FIG. 14A).

Figure 14B:
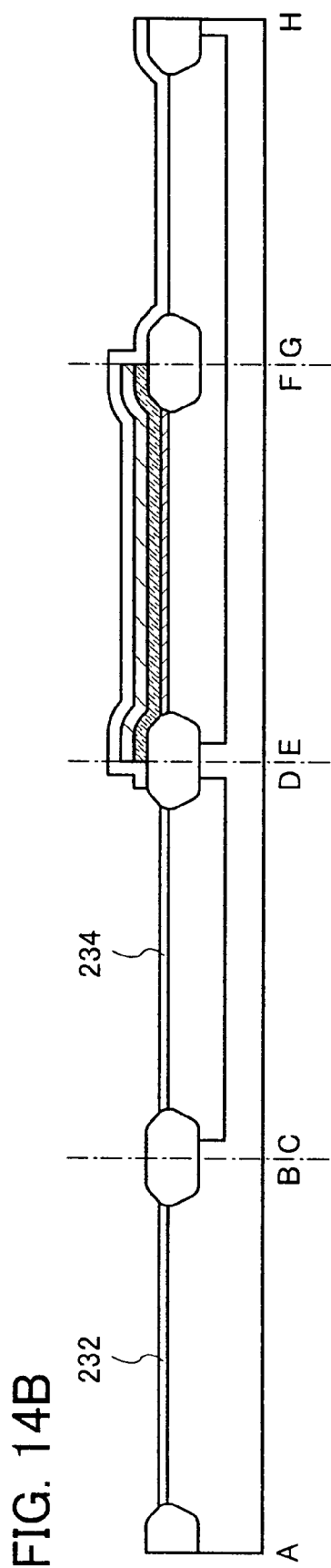

Then, third insulating layers 232 and 234 are formed so as to cover the regions 204 and 206, respectively (see FIG. 14B).

The third insulating layers 232 and 234 are formed using any method described in the formation methods of the foregoing first insulating layers 212 and 214 and the second insulating layer 228. For example, the third insulating layers 232 and 234 can be formed using a high density plasma treatment, a thermal oxidation method, a CVD method, or a sputtering method. The third insulating layers 232 and 234 are formed with a film thickness of 1 nm to 20 nm inclusive, preferably 8 nm to 10 nm inclusive. The third insulating layers 232 and 234 formed over the regions 204 and 206 of the substrate 200, respectively, each serves as a gate insulating layer in a transistor to be completed later.

Figure 14C:
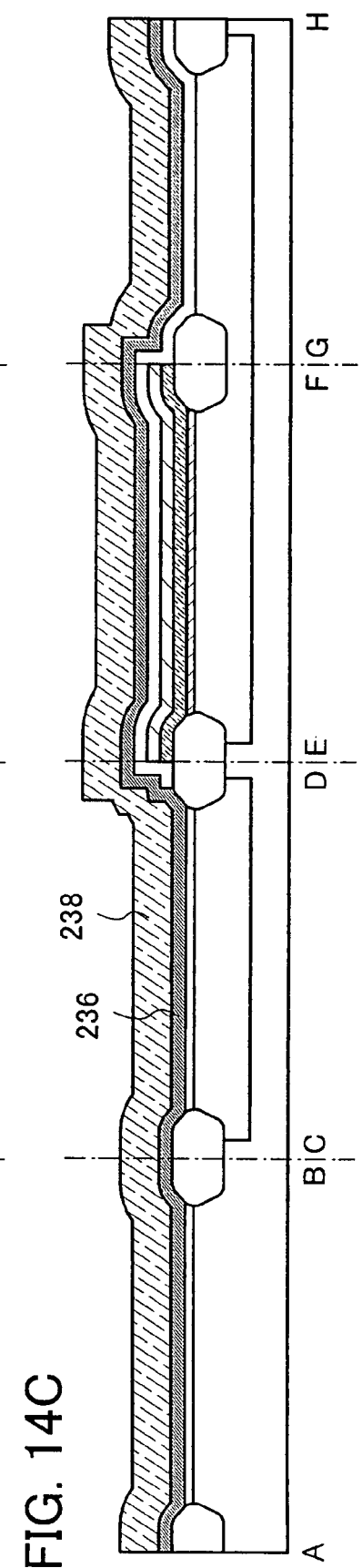

Next, a conductive layer is formed so as to cover the third insulating layers 232 and 234 formed over the regions 204 and 206, and the second insulating layer 228 formed over the regions 208 and 210 (see FIG. 14C). Here, an example in which a conductive layer 236 and a conductive layer 238 are stacked in this order and formed as the conductive layer is described. Naturally, the conductive layer may be formed as a single layer or to have a stacked-layer structure of three or more layers.

Each of the conductive layers 236 and 238 can be formed of an element selected from tantalum (Ta), tungsten (W), titanium (Ti), molybdenum (Mo), aluminum (Al), copper (Cu), chromium (Cr), niobium (Nb) and the like; an alloy material mainly containing the element; or a compound material mainly containing the element. Alternatively, a metal nitride that is a nitride of the element can also be used. In addition, a semiconductor material typified by polycrystalline silicon to which an impurity element such as phosphorus is added can also be used.

Here, tantalum nitride is used to form the conductive layer 236, and tungsten is used to form the conductive layer 238 thereover. Alternatively, a single layer selected from tungsten nitride, molybdenum nitride, and titanium nitride or stacked layer films thereof can be used for the conductive layer 236, and a single layer selected from tantalum, molybdenum, and titanium or stacked layer films thereof can be used for the conductive layer 238.

Next, by selectively etching and removing the conductive layers 236 and 238 that are provided by stacking, the conductive layers 236 and 238 are left in a portion over each of the regions 204, 206, 208, and 210, thereby forming gate electrodes 240, 242, 244, and 246, respectively (see FIG. 15A). Also, in this embodiment mode, surfaces of the regions 204, 206, 208, and 210 that do not overlap with the gate electrodes 240, 242, 244, and 246, respectively, are exposed.

Specifically, in the region 204, a portion of the third insulating layer 232 formed under the gate electrode 240 that does not overlap with the gate electrode 240 is selectively removed, and end portions of the gate electrode 240 and the third insulating layer 232 are made so that they are roughly aligned with each other. Also, in the region 206, a portion of the third insulating layer 234 formed under the gate electrode 242 that does not overlap with the gate electrode 242 is selectively removed, and end portions of the gate electrode 242 and the third insulating layer 234 are made so that they are roughly aligned with each other. Further, in the region 208, portions of the second insulating layer 228, a stacked-layer structure including the charge accumulation layer 220 and the charge accumulation layer 223, and the first insulating layer 216 that are formed under the gate electrode 244 that do not overlap with the gate electrode 244 are selectively removed, and end portions of the gate electrode 244, the second insulating layer 228, the stacked-layer structure including the charge accumulation layer 221 and charge accumulation layer 225, and the first insulating layer 216 are made so that they are roughly aligned with each other. Furthermore, in the region 210, a portion of the second insulating layer 228 formed under the gate electrode 246 that does not overlap with the gate electrode 246 is selectively removed, and end portion of the gate electrode 246 and the second insulating layer 228 are made so that they are roughly aligned with each other.

In this case, an insulating layer and the like in portions that do not overlap may be removed at the same time as forming the gate electrodes 240, 242, 244, and 246. Alternatively, after forming the gate electrodes 240, 242, 244, and 246, a resist mask that is left or the gate electrodes 240, 242, 244, and 246 may be used as a mask to remove the insulating layer and the like in the portions that do not overlap. Note that the gate electrode 244 that is formed over the region 208 provided in a memory portion of the substrate 200 serves as a control gate electrode in a nonvolatile memory element to be completed later. Also, the gate electrodes 240, 242, and 246 serve as gate electrodes of transistors that are completed later.

Next, an impurity element is selectively added to each of the regions 204, 206, and 208 of the substrate 200 (see FIG. 15B). Here, a low concentration impurity element imparting n-type conductivity is selectively added to the regions 206, 208, and 210 using the gate electrodes 242, 244, and 246 as masks, respectively, and a low concentration impurity element imparting p-type conductivity is selectively added to the region 204 using the gate electrode 240 as a mask. For the impurity element imparting n-type conductivity, phosphorus (P), arsenic (As), or the like can be used, and for the impurity element imparting p-type conductivity, boron (B), aluminum (Al), gallium (Ga), or the like can be used.

Next, an insulating layer (also called a "sidewall") 280 that is in contact with a side surface of each of the gate electrodes 240, 242, 244, and 246 is formed (see FIG. 16A). Specifically, an insulating layer of a single layer film or stacked layer films is formed by a CVD method, a sputtering method, or the like, using an inorganic material such as silicon oxide ($SiO_x$), silicon nitride ($SiN_x$), silicon oxynitride ($SiO_xN_y$) (x>y>0), or silicon nitride oxide ($SiN_xO_y$) (x>y>0), or an organic material such as an organic resin. Then, the insulating layer is selectively etched by anisotropic etching mainly in a perpendicular direction to form the insulating layer 280 that is in contact with the side surface of each of the gate electrodes 240, 242, 244, and 246. Note that the insulating layer 280 is used as a mask for doping when an LDD region is formed. Also, here, the insulating layer 280 is formed to be also in contact with side surfaces of the insulating layer and the charge accumulation layer formed under each of the gate electrodes 240, 242, 244, and 246.

Then, by adding an impurity element to each of the regions 204, 206, 208, and 210 of the substrate 200 using the gate electrodes 240, 242, 244, and 246 as masks, respectively, an impurity region serving as a source region or a drain region is formed (see FIG. 16A). Here, a high concentration impurity element imparting n-type conductivity is added to the regions 206, 208, 210 of the substrate 200 using the insulating layers 280 and the gate electrodes 242, 244, and 246 as masks, and a high concentration impurity element imparting p-type conductivity is added to the region 204 using the insulating layers 280 and the gate electrode 240 as masks.

As a result, in the region 204 of the substrate 200, an impurity region 269 forming a source region or drain region, a low concentration impurity region 267 forming an LDD region, and a channel forming region 266 are formed. Also, in the region 206 of the substrate 200, an impurity region 253 forming a source region or drain region, a low concentration impurity region 251 forming an LDD region, and a channel forming region 250 are formed. Further, in the region 208 of the substrate 200, an impurity region 257 forming a source region or drain region, a low concentration impurity region 255 forming an LDD region, and a channel forming region 254 are formed. Furthermore, in the region 210 of the substrate 200, an impurity region 263 forming a source region or drain region, a low concentration impurity region 261 forming an LDD region, and a channel forming region 260 are formed. The impurity element added to the impurity regions forming a source region or drain region is of a higher concentration than that added to the impurity regions forming an LDD region.

Note that in this embodiment mode, introduction of the impurity element is performed with the regions 204, 206, 208, and 210 of the substrate 200 that do not overlap with the gate electrodes 240, 242, 244, and 246 exposed. Therefore, the channel forming regions 266, 250, 254, and 260 formed in the regions 204, 206, 208, and 210 of the substrate 200, respectively, can be formed in a self-aligning manner with the gate electrodes 240, 242, 244, and 246, respectively.

Then, insulating layers 272 are formed so as to cover the insulating layers, charge accumulation layers, and the like provided over the regions 204, 206, 208, and 210 of the substrate 200, and over the insulating layers 272, conductive layers 274 that are electrically connected to the impurity regions 269, 253, 257, and 263 formed in the regions 204, 206, 208, and 210 are formed (see FIG. 16B).

For each of the insulating layers 272, a single layer film or stacked layer films can be provided by a CVD method, a sputtering method, or the like, using a material containing oxygen or nitrogen such as silicon oxide ($SiO_x$), silicon nitride ($SiN_x$), silicon oxynitride ($SiO_xN_y$) (x>y>0), or silicon nitride oxide ($SiN_xO_y$) (x>y>0); a material containing carbon such as DLC (diamond-like carbon); an organic material such as epoxy, polyimide, polyamide, polyvinylphenol, benzocyclobutene, or acrylic; or a siloxane material such as a siloxane resin. Note that the siloxane material corresponds to a material containing a Si—O—Si bond. A skeletal structure of siloxane is composed of a bond between silicon (Si) and oxygen (O). For a substituent, an organic group containing at least hydrogen (for example, an alkyl group or aromatic hydrocarbon) is used. For the substituent, a fluoro group can also be used. Alternatively, both the organic group containing at least hydrogen and the fluoro group can be used for the substituent. Also, the insulating layer 272 may be formed by forming an insulating layer using a CVD method or a sputtering method and then subjecting the insulating layer to a high density plasma treatment under an oxygen atmosphere or a nitrogen atmosphere.

Each of the conductive layers 274 can be formed to have a single layer structure or a stacked-layer structure by a CVD method or a sputtering method, using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material mainly containing the element; or a compound material mainly containing the element. For example, an alloy material mainly containing aluminum corresponds to, for example, a material mainly containing aluminum that also contains nickel, or an alloy material mainly containing aluminum that also contains nickel and one or both of carbon and silicon. For the conductive layers 274, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer, may be employed. Note that the barrier layer corresponds to a thin film made of titanium, a nitride of titanium, molybdenum, or a nitride of molybdenum. Since aluminum and aluminum-silicon have low resistance values and are inexpensive, they are most suitable for materials for forming the conductive layers 274. Also, by providing a barrier layer in each of an upper layer and a lower layer, generation of hillock of aluminum or aluminum-silicon can be prevented.

By the forgoing process, a nonvolatile semiconductor storage device provided with a p-channel transistor, an n-channel transistor, a nonvolatile memory element, and an n-channel transistor that are formed using the regions 204, the region 206, the region 208, and the region 210 of the substrate 200, respectively, can be obtained. Note that the structure of a transistor described in this embodiment mode is one example, and the structure is not limited to that shown in the figures. Also, the structure of the nonvolatile memory element is also one example, and it goes without saying that a variety of known structures can be applied.

By forming an insulating layer serving as a gate insulating layer of a transistor using the present invention, a gate insulating layer with favorable withstand voltage can be realized. In particular, a gate insulating layer having withstand voltage that has little defect in initial withstand voltage in the A mode and the B mode can be realized. Accordingly, a defect in withstand voltage of the gate insulating layer can be prevented, and a nonvolatile semiconductor storage device with high reliability can be manufactured. Also, yield of the nonvolatile semiconductor storage device can be improved.

Further, by forming an insulating layer serving as a tunnel insulating layer of a nonvolatile memory element using the present invention, a tunnel insulating layer with favorable withstand voltage can be realized. In particular, a gate insulating layer having withstand voltage that has little defect in initial withstand voltage in the A mode and the B mode can be realized. Accordingly, a defect such as a leak current between a floating gate electrode and a channel forming region and the like due to a defect in withstand voltage of the tunnel insulating layer can be prevented. As a result, as a nonvolatile memory element, a high speed operation and a charge retention characteristic can be improved, and a highly reliable nonvolatile semiconductor storage device can be manufactured. Also, yield of the nonvolatile semiconductor storage device can be improved.

Note that this embodiment mode can be carried out by appropriately combining it with other embodiment modes described in this specification.

Embodiment Mode 7

Using the present invention, nonvolatile semiconductor storage devices of a variety of modes can be manufactured. An example thereof is described in each of Embodiment Modes 5 and 6. In this embodiment mode, an equivalent circuit and the like of a nonvolatile semiconductor storage device is described. Note that a nonvolatile memory element and a transistor described in this embodiment mode may have a structure of having a semiconductor layer that is provided over an insulating surface and a channel forming region formed in the semiconductor layer, or a structure of forming the channel forming region over a semiconductor substrate.

FIG. 17 shows an example of an equivalent circuit of a nonvolatile memory cell array. A memory cell MC01 that stores one-bit data is formed by a selecting transistor S01 and a nonvolatile memory element M01. The selecting transistor S01 is inserted serially between the bit line BL0 and the nonvolatile memory element M01, and has its gate connected to the word line WL1. In a case of writing data in the nonvolatile memory element M01, when a high voltage is applied to the word line WL11 with the word line WL1 and the bit line BL0 set at an H level and BL1 set at an L level, charge is accumulated in the floating gate electrode. In a case of erasing data, a high voltage of negative polarity may be applied to the word line WL11 with the word line WL1 and the bit line BL0 set at an H level.

In a case of a structure in which each of the selecting transistor and the nonvolatile memory element has a semiconductor layer formed over an insulating surface, and a channel forming region formed in the semiconductor layer in FIG. 17, for example in the memory cell MC01, when each of the selecting transistor S01 and the nonvolatile memory element M01 is formed using a semiconductor layer formed separately to have an island-like shape over an insulating surface, it is possible to prevent interference with another selecting transistor or another nonvolatile memory element without particularly providing an element separation region. In addition, since the selecting transistor S01 and the nonvolatile memory element M01 in the memory cell MC01 are both n-channel type, a wiring for connecting these two elements can be omitted by forming the both elements with the use of one island-like semiconductor layer.

Figure 22:
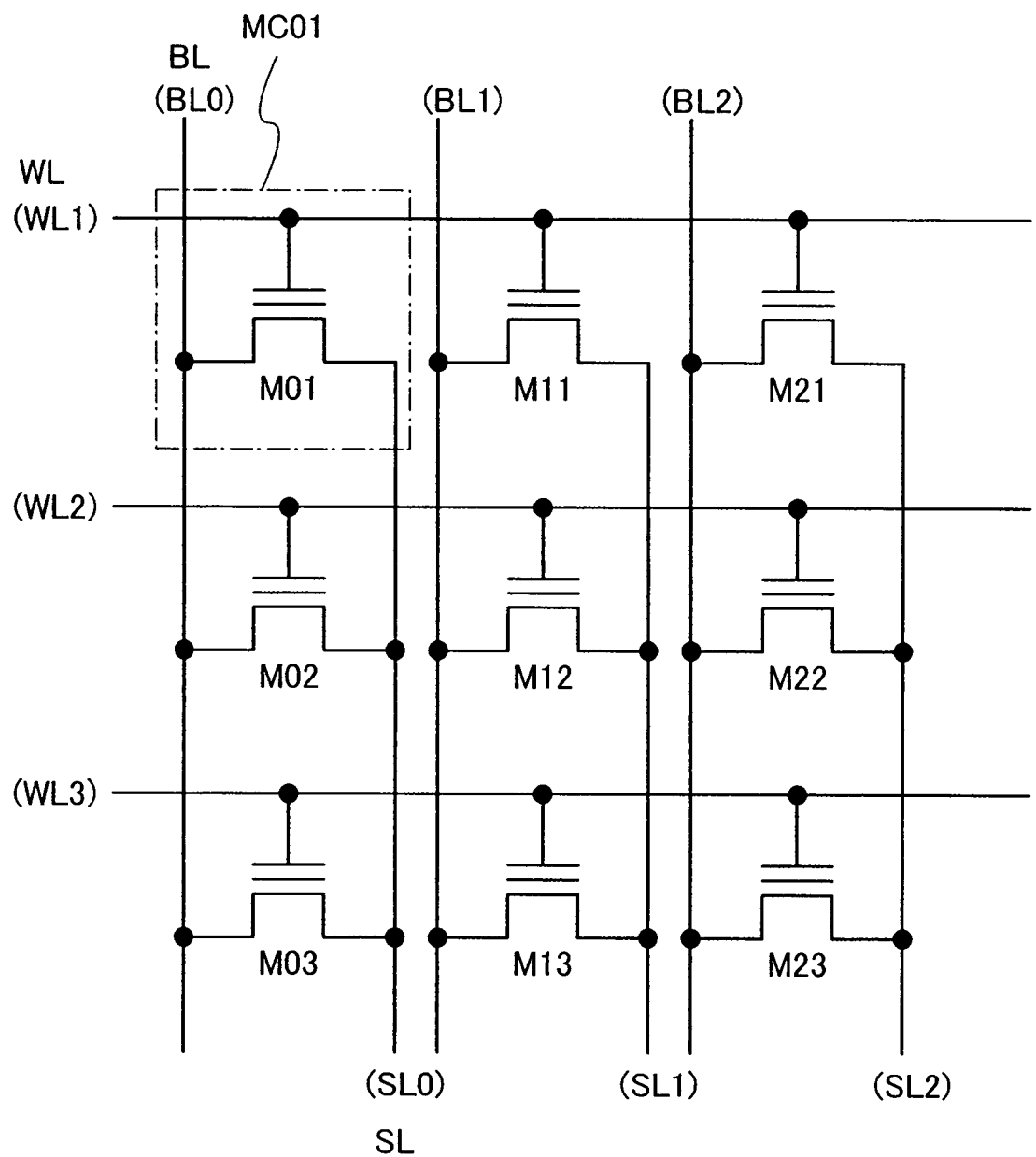
FIG. 22 shows an example of an equivalent circuit of a NOR type nonvolatile memory cell array.

FIG. 22 shows a NOR-type equivalent circuit in which the nonvolatile memory element is directly connected to the bit line. In this memory cell array, a word line WL and a bit line BL intersect with each other and the nonvolatile memory element is provided at each intersection. In the NOR-type, a drain of each nonvolatile memory element is connected to the bit line BL. A source line SL is commonly connected to a source of the nonvolatile memory element.

In a case of a structure in which the nonvolatile memory element has a semiconductor layer formed over an insulating surface and a channel forming region formed in the semiconductor layer in FIG. 22, for example in the memory cell MC01, when the nonvolatile memory element M01 is formed using a semiconductor layer formed separately to have an island-like shape over an insulating surface, it is possible to prevent interference with another nonvolatile memory element without particularly providing an element separation region. In addition, when a plurality of nonvolatile memory elements (for example, M01 to M23 shown in FIG. 17) are treated as one block and these nonvolatile memory elements are formed of one island-like semiconductor layer, an erasure operation can be performed per unit of block.

An operation of the NOR-type is, for example, as follows. The data writing is carried out in such a way that a voltage of 0 V is applied to the source line SL, a high voltage is applied to the word line WL selected for the data writing, and a potential in accordance with data "0" or "1" is given to the bit line BL. For example, potentials of an H level and an L level corresponding to "0" and "1" respectively are applied to the bit lines BL. In the nonvolatile memory element to which the H level is applied, hot electrons are generated near the drain, and the hot electrons are injected to a floating gate electrode. Such electron injection does not occur in a case of data "1".

In the memory cell to which data "0" is given, hot electrons are generated near the drain due to a strong lateral electric field between the drain and the source and injected to a floating gate electrode. The state where the electrons are injected to the floating gate electrode and threshold voltage is increased is "0". In the case of data "1", hot electrons are not generated and electrons are not injected to the floating gate electrode, whereby a state where threshold voltage is low, i.e., an erasing state is held.

In order to erase data, a positive voltage of about 10 V is applied to the source line SL and the bit line BL is made in a floating state. Then, a high voltage of negative polarity is applied to the word line (by applying a high voltage of negative polarity to the control gate) to extract electrons from the floating gate electrode. This produces a state of erasing data "1."

In order to read out data, a voltage of 0 V is applied to the source line SL and a voltage of about 0.8 V is applied to the bit line BL. Then, a readout voltage which is set at an intermediate value between threshold values of the data "0" and "1" is applied to the selected word line WL. Then, whether or not current is led in the nonvolatile memory element is judged by a sense amplifier connected to the bit line BL.

Figure 23:
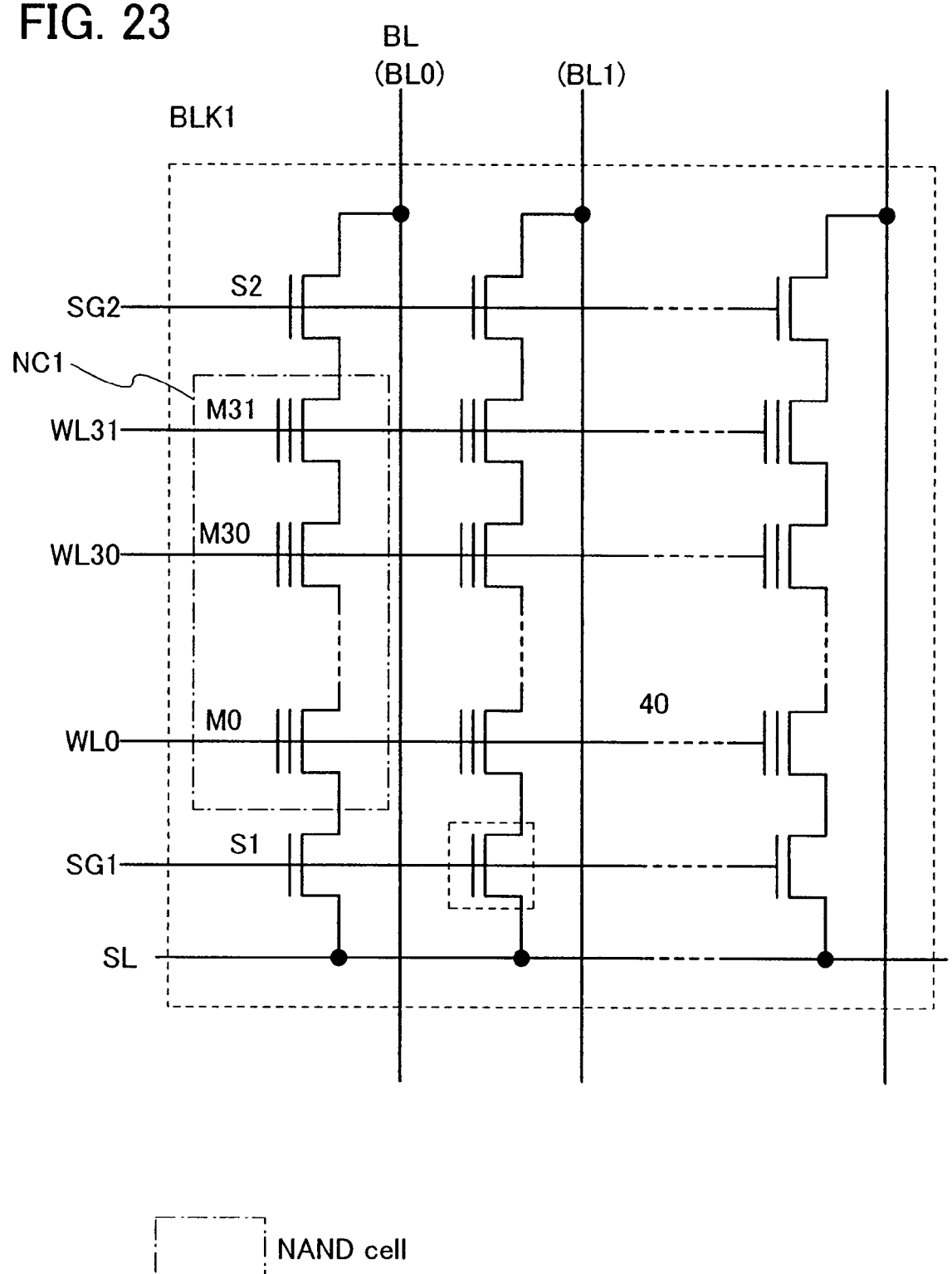
FIG. 23 shows an example of an equivalent circuit of a NAND type nonvolatile memory cell array.

FIG. 23 shows an equivalent circuit of a NAND-type memory cell array. The bit line BL has a NAND cell NC1 connected thereto, the NAND cell NC1 having a plurality of nonvolatile memory elements serially connected to each other. A plurality of the NAND cells gather to form a block BLK. A block BLK1 shown in FIG. 23 has 32 word lines (word lines WL0 to WL31). The nonvolatile memory elements positioned in the same row of the block BLK1 are commonly connected to the word line corresponding to this row.

In a case of a structure in which each of the selecting transistor and the nonvolatile memory element has a semiconductor layer formed over an insulating surface and a channel forming region formed in the semiconductor layer in FIG. 23, since selecting transistors S1 and S2 and nonvolatile memory elements M0 to M31 are serially connected to each other, these may be treated as one group formed of one semiconductor layer. Accordingly, wirings connecting the nonvolatile memory elements to each other can be omitted, which achieves high integration. Moreover, separation between the adjacent NAND cells can be carried out easily. In addition, the semiconductor layer of the selecting transistors S1 and S2 may be formed separately from the semiconductor layer of the NAND cell. In an erasure operation by extracting charges from floating gates of the nonvolatile memory elements M0 to M31, the erasure operation can be performed per unit of NAND cell. The nonvolatile memory elements commonly connected to one word line (for example in the row of M30) may be formed of one semiconductor layer.

A writing operation is carried out after the NAND cell NC1 is in an erasure state, i.e., a state in which the threshold value of each nonvolatile memory element of the NAND cell NC1 is a negative voltage. The writing is carried out in order from the memory element M0 on the source line SL side. Brief description is hereinafter made on an example of the writing to the memory element M0.

Figure 24A:
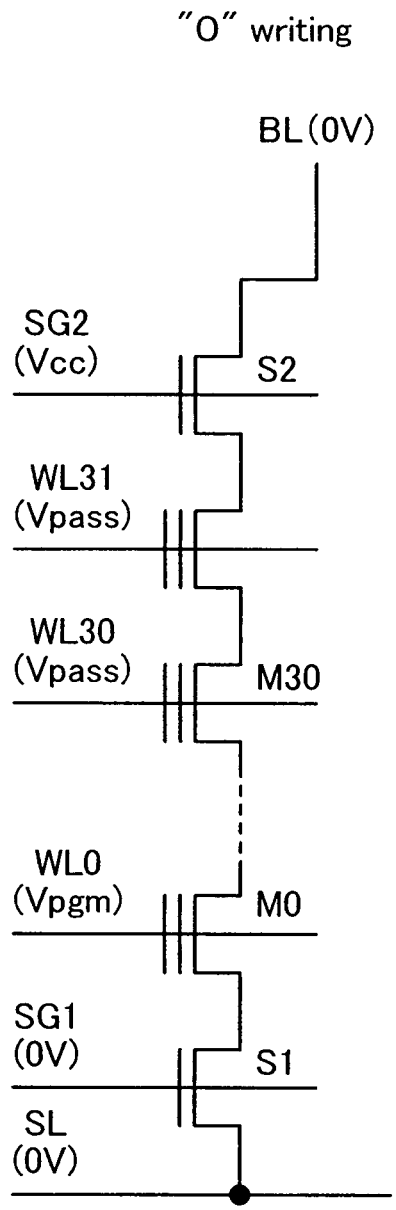
FIGS. 24A and 24B each describe a writing operation of a NAND type nonvolatile memory.

In FIG. 24A, in a case of writing "0", for example, a voltage of Vcc (power source voltage) is applied to a selecting gate line SG2 to turn on the selecting transistor S2 as well as applying a voltage of 0 V (grounding voltage) to the bit line BL0. A voltage of 0 V is applied to a selecting gate line SG1 and the selecting transistor S1 is turned off. Next, a high voltage of Vpgm (about 20 V) is applied to the word line WL0 of a memory cell M0, and an intermediate voltage of Vpass (about 10 V) is applied to the other word lines. Since a voltage of 0 V is applied to the bit line BL, the potential of the channel forming region of the selected memory cell M0 becomes 0 V. Since the potential difference between the word line WL0 and the channel forming region is large, electrons are injected to the floating gate electrode of the memory cell M0 by the F-N tunneling current. Accordingly, the threshold voltage of the memory cell M0 becomes a positive state (a state in which "0" is written).

Figure 24B:
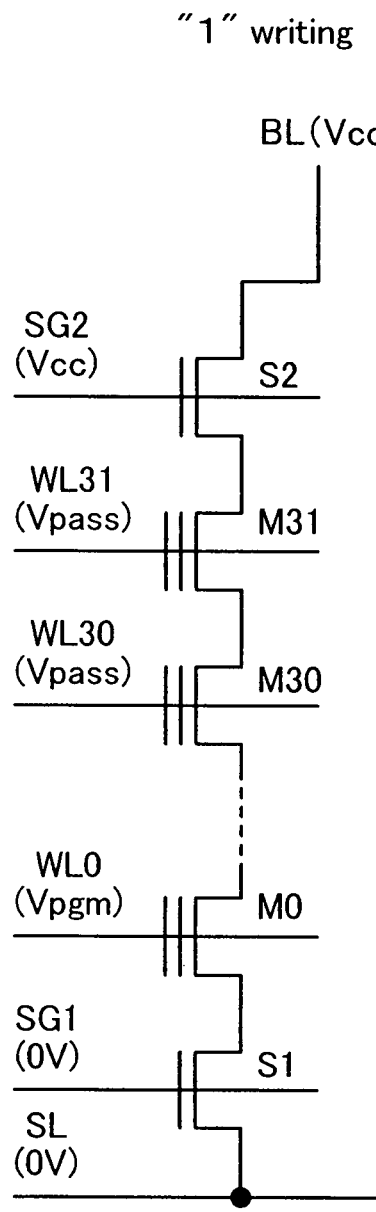

On the other hand, in the case of writing "1", for example, a voltage of Vcc (power source voltage) is applied to the bit line BL as shown in FIG. 24B. Since the selecting gate line SG2 has a voltage of Vcc, the selecting transistor S2 is in a blocked state (cut off). That is to say, the channel forming region of the memory cell M0 becomes a floating state. Next, when a high voltage of Vpgm (20 V) is applied to the word line WL0 and an intermediate voltage of Vpass (10 V) is applied to the other word lines, the voltage of the channel forming region rises from Vcc-Vth to, for example, 8 V due to capacitance coupling between each word line and the channel forming region. Since the voltage of the channel forming region is boosted to be a high voltage, the potential difference between the word line WL0 and the channel forming region is small, unlike the case of writing "0". Therefore, electron injection by the F-N tunneling current does not occur in the floating gate electrode of the memory cell M0. Accordingly, the threshold value of a memory cell MC1 is kept in a negative state (a state in which "1" is written).

Figure 25A:
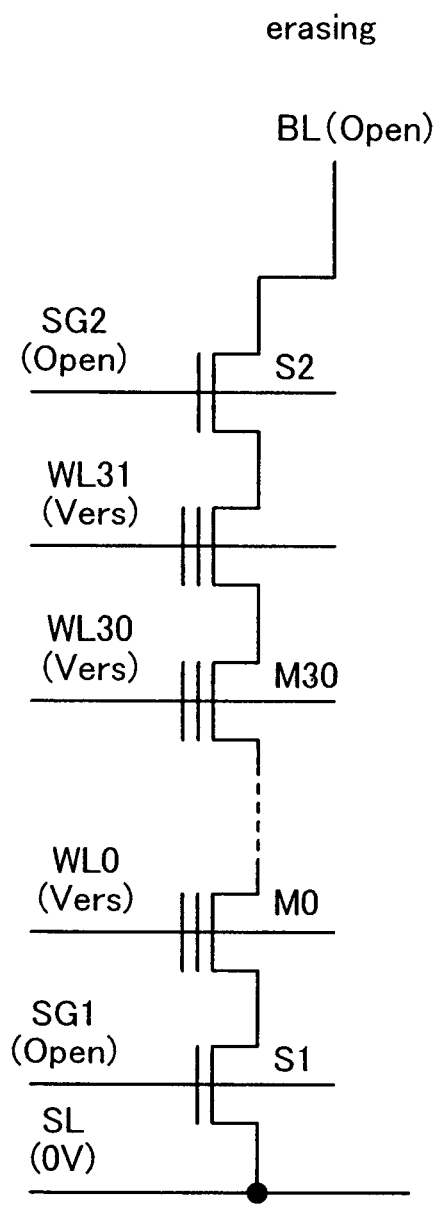
FIGS. 25A and 25B describe an erasing operation and a reading operation of a NAND type nonvolatile memory, respectively.

In the case of the erasing operation, as shown in FIG. 25A, a high voltage of negative polarity (Vers) is applied to all the word lines in the selected block. The bit line BL and the source line SL are made in a floating state. Thus, electrons in the floating gate electrode in all the memory cells in the block are released to the semiconductor film or the semiconductor substrate by the tunneling current. Consequently, the threshold voltage of each of these memory cells is shifted to a negative direction.

Figure 25B:
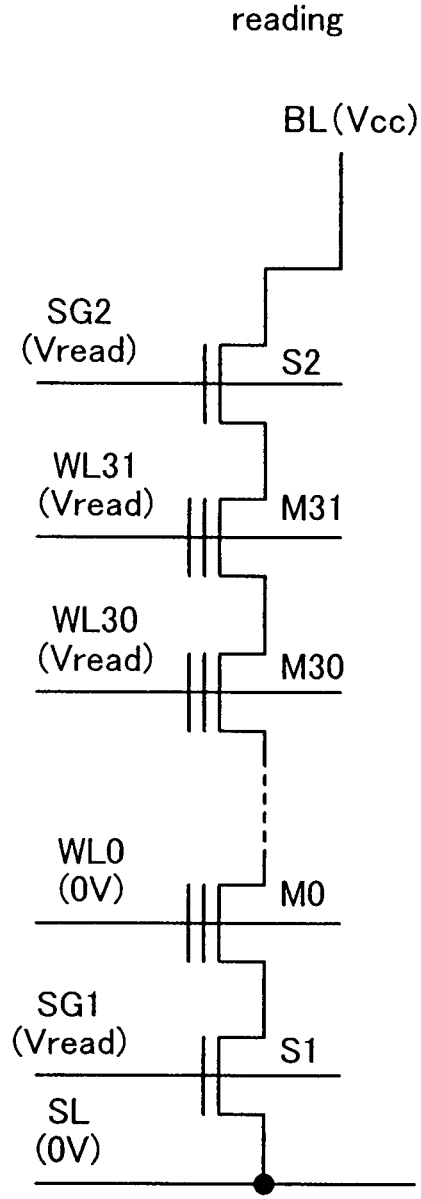
Figure 26:
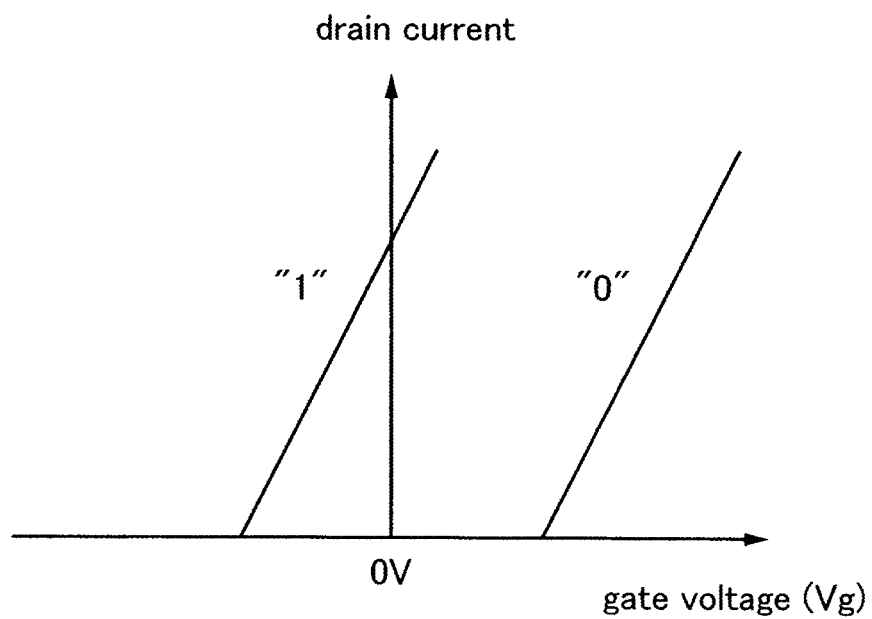
FIG. 26 shows a change in threshold voltage of a nonvolatile memory in a case of "0" when charge is accumulated and in a case of "1" when it is erased.

In the reading operation shown in FIG. 25B, a voltage of Vr (for example, 0 V) is applied to the word line WL0 of the memory cell M0 which is selected to be read, whereas an intermediate voltage of Vread for reading which is slightly higher than power source voltage is applied to the word lines WL1 to WL31 and the selecting gate lines SG1 and SG2 of the memory cells which are not selected. That is, as shown in FIG. 26, the memory elements other than the selected memory element each function as a transfer transistor. Accordingly, it is detected whether current flows in the memory cell M0 which is selected to be read. In other words, when data stored in a memory cell M0 is "0", the memory cell M0 is off and the bit line BL does not discharge electricity. On the other hand, when data stored in the memory cell M0 is "1", the memory cell M0 is on and the bit line BL discharges electricity.

Figure 27:
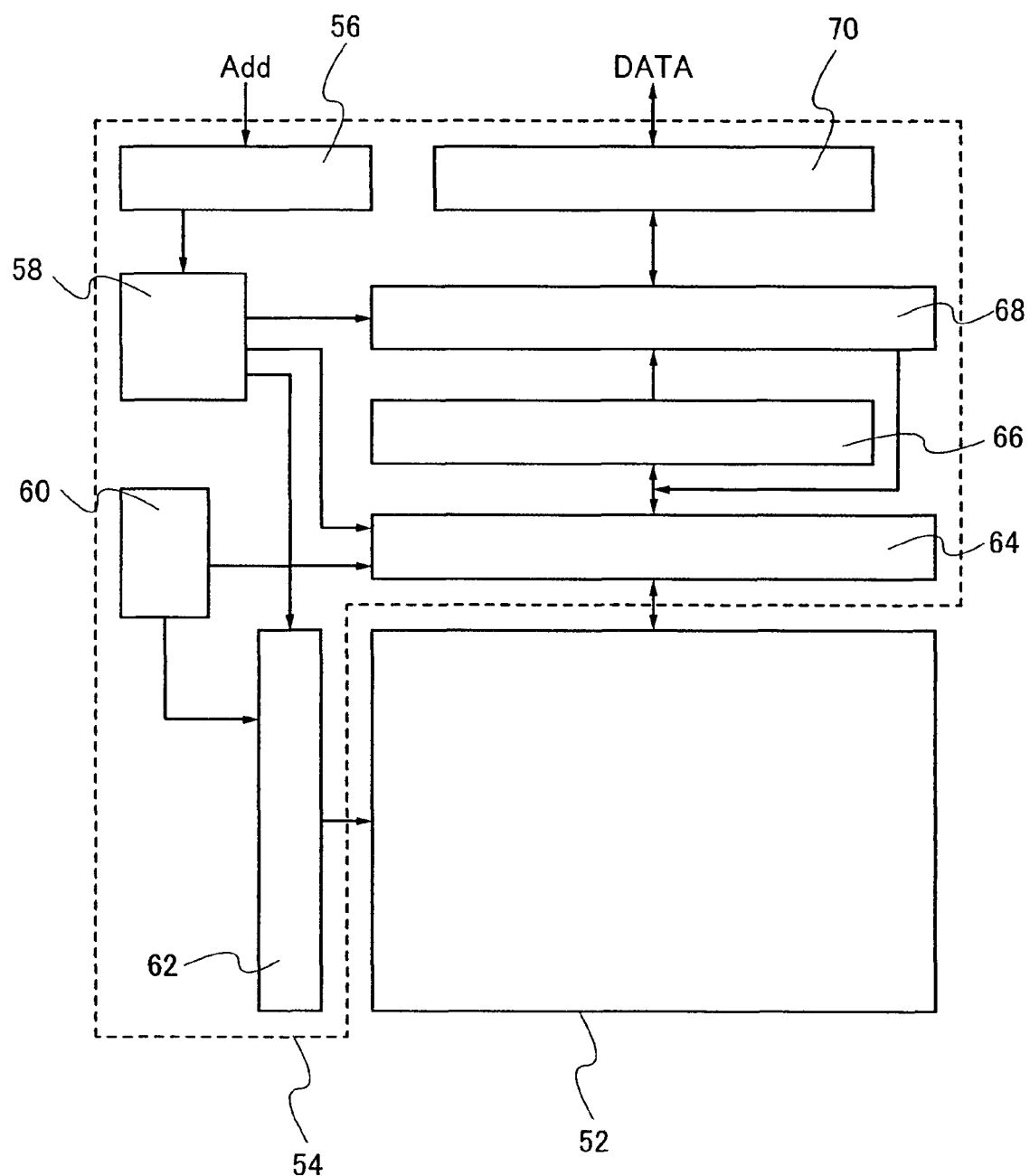
FIG. 27 shows an example of a circuit block diagram of a nonvolatile semiconductor storage device.

FIG. 27 shows an example of a circuit block diagram of a nonvolatile semiconductor memory device. In the nonvolatile semiconductor memory device, a memory cell array 52 and a peripheral circuit 54 are formed over one substrate. The memory cell array 52 has a structure as shown in any of FIGS. 17, 22, and 23. The peripheral circuit 54 has the following structure.

A row decoder 62 for selecting a word line and a column decoder 64 for selecting a bit line are provided in the periphery of the memory cell array 52. An address is transmitted to a controlling circuit 58 through an address buffer 56, and an internal row address signal and an internal column address signal are transferred to the row decoder 62 and the column decoder 64, respectively.

A power source potential is increased to be used for data writing and data erasing. Therefore, a boosting circuit 60, which is controlled by the controlling circuit 58 depending on the operation mode, is provided. The output of the boosting circuit 60 is supplied to the word line WL or the bit line BL through the row decoder 62 or the column decoder 64. Data outputted from the column decoder 64 is inputted to a sense amplifier 66. The data which is read by the sense amplifier 66 is held in a data buffer 68, and the data is accessed randomly by the control of the controlling circuit 58 and outputted through a data input/output buffer 70. Data to be written is once held in the data buffer 68 through the data input/output buffer 70 and transferred to the column decoder 64 by the control of the controlling circuit 58.

In such a nonvolatile semiconductor memory device, data writing and erasing are carried out through the tunnel insulating layer. Therefore, the layer characteristics of the tunnel insulating film are very important in the nonvolatile semiconductor memory device.

Consequently, by using the present invention, a tunnel insulating film with favorable withstand voltage can be realized. Moreover, in a case where a structure of the nonvolatile memory element has a semiconductor layer that is provided over an insulating surface and a channel forming region is formed in the semiconductor layer, the semiconductor layer can be covered sufficiently by the tunnel insulating layer. Therefore, since a defect in withstand voltage of the tunnel insulating layer, a defect in coverage of the tunnel insulating layer, and the like can be prevented, a highly reliable nonvolatile semiconductor memory device can be provided. Also, yield of the nonvolatile semiconductor storage device can be improved.

This embodiment mode can be carried out by appropriately combining it with other embodiment modes described in this specification.

Embodiment Mode 8

This embodiment mode will hereinafter explain an application example of a semiconductor device capable of inputting and outputting data without contact, which is provided with the aforementioned nonvolatile semiconductor memory device of the present invention, with reference to drawings. The semiconductor device capable of inputting and outputting data without contact is also referred to as an RFID tag, an ID tag, an IC tag, an IC chip, an RF tag, a wireless tag, an electronic tag, or a wireless chip depending on its usage.

Figure 20A:
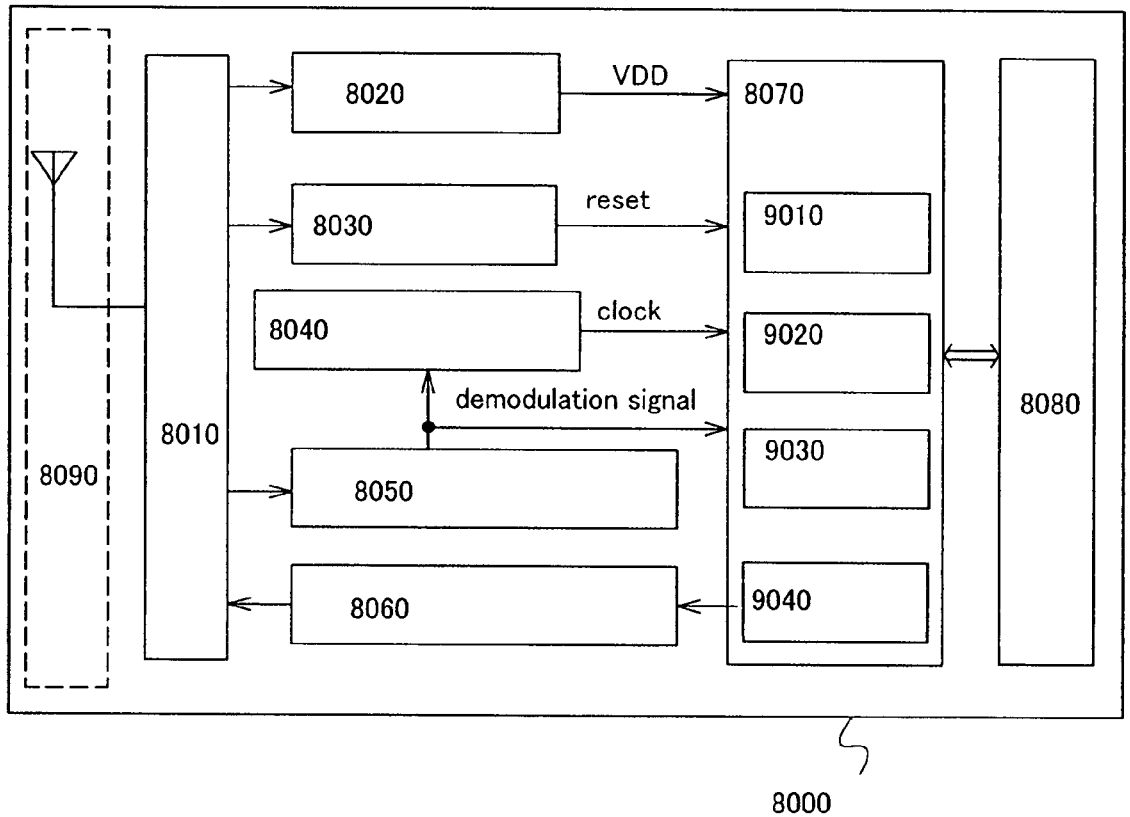
FIGS. 20A to 20C each show an example of a type of usage of a semiconductor device of the present invention.

A semiconductor device 8000 has a function of exchanging data without contact, which includes a high-frequency circuit 8010, a power source circuit 8020, a reset circuit 8030, a clock generating circuit 8040, a data demodulating circuit 8050, a data modulating circuit 8060, a controlling circuit 8070 for controlling another circuit, a memory circuit 8080, and an antenna 8090 (FIG. 20A). The high-frequency circuit 8010 is a circuit which receives a signal with the antenna 8090 and outputs from the antenna 8090, a signal received from the data modulating circuit 8060. The power source circuit 8020 is a circuit for generating a power source potential based on a received signal. The reset circuit 8030 is a circuit for generating a reset signal. The clock generating circuit 8040 is a circuit for generating various clock signals based on a received signal inputted through the antenna 8090. The data demodulating circuit 8050 is a circuit for demodulating a received signal and outputting the demodulated signal to the controlling circuit 8070. The data modulating circuit 8060 is a circuit for modulating a signal received from the controlling circuit 8070. Moreover, as the controlling circuit 8070, for example, a code extracting circuit 9010, a code judging circuit 9020, a CRC judging circuit 9030, and an output unit circuit 9040 are provided. It is to be noted that the code extracting circuit 9010 is a circuit for extracting each of a plurality of codes included in an instruction sent to the controlling circuit 8070. The code judging circuit 9020 is a circuit for judging the content of an instruction based on comparison between the extracted code and a code corresponding to a reference. The CRC judging circuit 9030 is a circuit for detecting whether or not there is a transmission error or the like, based on the judged code.

Next, an example of an operation of the aforementioned semiconductor device 8000 is explained. First, a wireless signal is received with the antenna 8090. The wireless signal is then sent to the power source circuit 8020 through the high-frequency circuit 8010, and a high power source potential (hereinafter referred to as "VDD") is generated. The VDD is supplied to each circuit of the semiconductor device 8000. In addition, the signal sent to the data demodulating circuit 8050 through the high-frequency circuit 8010 is demodulated (hereinafter the signal which has been demodulated is called a "demodulation signal"). Moreover, the signal and the demodulation signal which have passed the reset circuit 8030 and the clock generating circuit 8040 through the high-frequency circuit 8010 are sent to the controlling circuit 8070. The signals sent to the controlling circuit 8070 are analyzed by the code extracting circuit 9010, the code judging circuit 9020, the CRC judging circuit 9030, and the like. Then, information of the semiconductor device 8000 which is stored in the memory circuit 8080 is outputted based on the analyzed signal. The outputted information of the semiconductor device 8000 is encoded through the output unit circuit 9040.

Further, the encoded information of the semiconductor device 8000 is sent by the antenna 8090 as a wireless signal through the data modulating circuit 8060. In the plural circuits of the semiconductor device 8000, a low power source potential (hereinafter referred to as "VSS") is common, and the VSS can be GND (ground). Moreover, the nonvolatile semiconductor memory device of the present invention can be applied to the memory circuit 8080.

In this manner, data of the semiconductor device 8000 can be read by sending the signal from a reader/writer to the semiconductor device 8000 and receiving the signal sent from the semiconductor device 8000 with the reader/writer.

The semiconductor device 8000 may supply power source voltage to each circuit by an electromagnetic wave without mounting a power source (battery) or may supply power source voltage to each circuit by an electromagnetic wave and a power source (battery) by mounting the power source (battery).

Figure 20B:
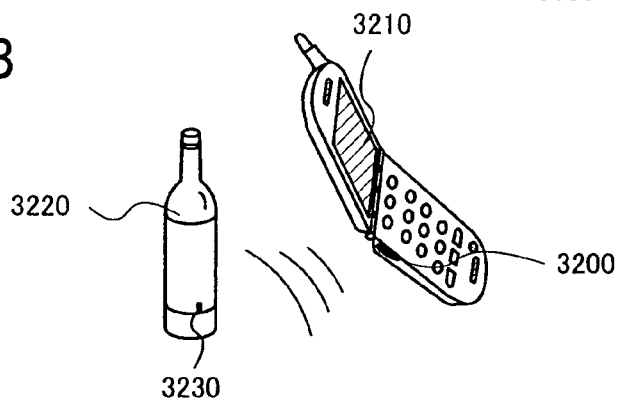
Figure 20C:
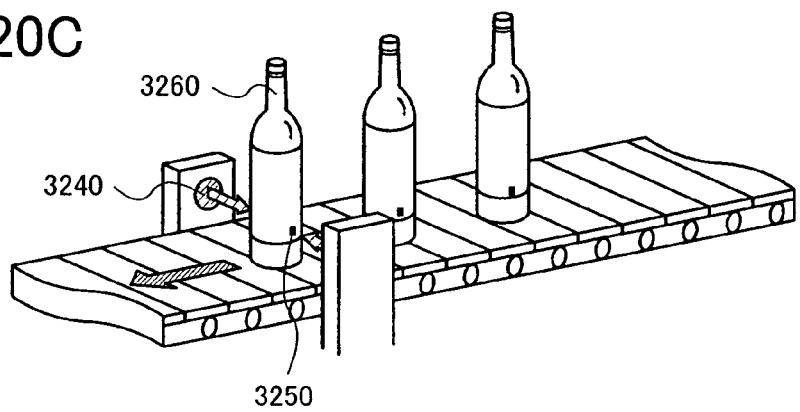

Next, an example of using of a semiconductor device in which data can be input/output without contact, like the semiconductor device 8000 described above, is explained. A side surface of a mobile terminal including a display portion 3210 is provided with a reader/writer 3200. A side surface of a product 3220 is provided with a semiconductor device 3230 (FIG. 20B). When the reader/writer 3200 is held over the semiconductor device 3230 included in the product 3220, the display portion 3210 displays information on the product, such as a material, a production area, an inspection result for each production step, history of circulation process, and description of the product. In addition, when a product 3260 is transferred by a conveyer belt, the product 3260 can be inspected by using a semiconductor device 3250 provided to the product 3260 and a reader/writer 3240 (FIG. 20C). In this manner, by using the semiconductor device in the system, information can be obtained easily and higher performance and higher value addition are achieved.

Moreover, the nonvolatile semiconductor memory device of the present invention can be used for electronic appliances of every field that are provided with memories. For example, the electronic appliance to which the nonvolatile semiconductor memory device of the present invention is applied includes a camera such as a video camera or a digital camera, a goggle type display (head mount display), a navigation system, a sound reproducing device (such as a car audio device or an audio component device), a computer, a game machine, a mobile information terminal (such as a mobile computer, a mobile phone, a mobile game machine, or an electronic book), an image reproducing device provided with a recording medium (specifically, a device which reproduces a recording medium such as a DVD (digital versatile disk) and which has a display for displaying the image), and the like. FIGS. 21A to 21E show specific examples of such electronic appliances.

Figure 21A:
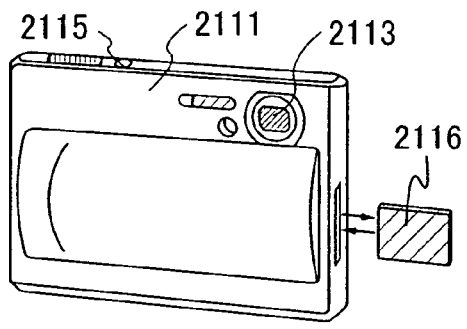
FIGS. 21A to 21E each show an example of a type of usage of a semiconductor device of the present invention.
Figure 21B:
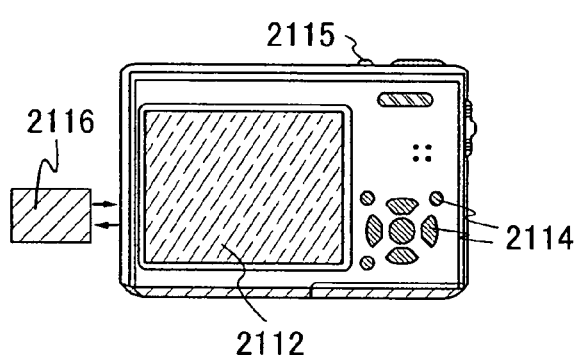

FIGS. 21A and 21B show a digital camera. FIG. 21B shows a back side of the digital camera of FIG. 21A. This digital camera includes a housing 2111, a display portion 2112, a lens 2113, operation keys 2114, a shutter button 2115, and the like and is provided with a removable nonvolatile memory 2116. The memory 2116 stores data of photographs taken with the digital camera. The nonvolatile semiconductor memory device formed by using the present invention can be applied to the memory 2116. The semiconductor device formed by using the present invention can be applied as a switching element that drives the display portion 2112.

Figure 21C:
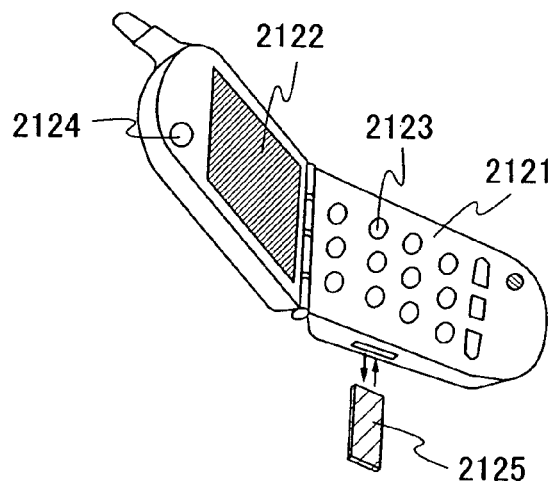

FIG. 21C shows a mobile phone as a typical example of a mobile terminal. This mobile phone includes a housing 2121, a display portion 2122, operation keys 2123, and the like. The mobile phone is provided with a removable nonvolatile memory 2125 and can store and reproduce data of the mobile phone, such as phone numbers, images, and music in the memory 2125. The nonvolatile semiconductor memory device formed by using the present invention can be applied to the memory 2125. The semiconductor device manufactured using the present invention can be applied as a switching element that drives the display portion 2122.

Figure 21D:
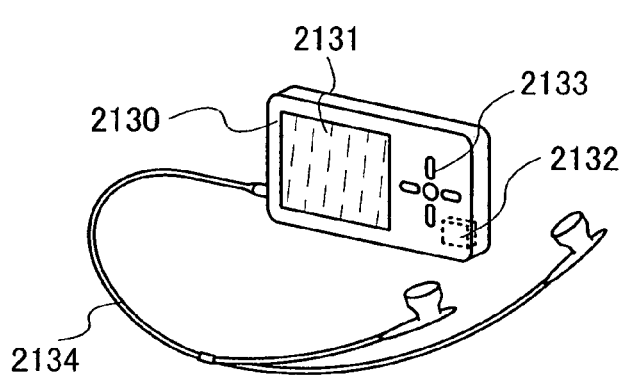

FIG. 21D shows a digital player as a typical example of an audio device. The digital player shown in FIG. 21D includes a main body 2130, a display portion 2131, a memory portion 2132, an operation portion 2133, an earphone 2134, and the like. It is to be noted that the earphone 2134 can be replaced by a headphone or a wireless earphone. For the memory portion 2132, the nonvolatile semiconductor memory device formed by using the present invention can be used. Moreover, the semiconductor device manufactured using the present invention can be applied as a switching element that drives the display portion 2131. For example, images and voices (music) can be recorded and reproduced by operating the operation portion 2133 with the use of a NAND-type nonvolatile memory with a recording capacity of 20 to 200 gigabytes (GB). It is to be noted that the power consumption of the display portion 2131 can be suppressed by displaying white letters on a black background. This is particularly effective in a mobile audio device. The nonvolatile semiconductor memory device provided in the memory portion 2132 may be a removable one.

Figure 21E:
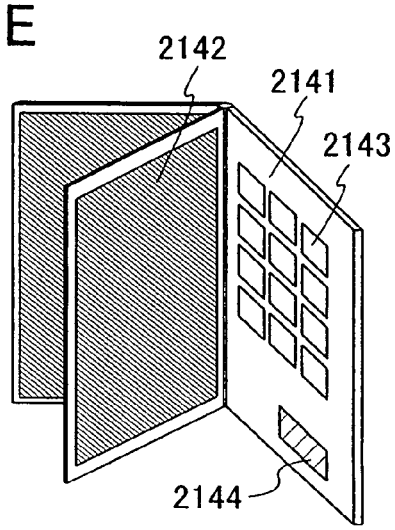

FIG. 21E shows an electronic book (also called electronic paper), which includes a main body 2141, a display portion 2142, operation keys 2143, and a memory portion 2144. The main body 2141 may incorporate a modem so that information can be transmitted and received wirelessly. The memory portion 2144 can use the nonvolatile semiconductor memory device formed by using the present invention. The semiconductor device manufactured using the present invention can be applied as a switching element that drives the display portion 2142. For example, images and voices (music) can be recorded and reproduced by operating the operation keys 2143 with the use of a NAND-type nonvolatile memory with a recording capacity of 20 to 200 gigabytes (GB). The nonvolatile semiconductor memory device provided in the memory portion 2144 may be a removable one.

As thus described, the nonvolatile semiconductor memory device and the semiconductor device of the present invention can be applied in quite a wide range and can be used for electronic appliances of every field that have memories.

Embodiment 1

In this embodiment, characteristics of an insulating layer manufactured using the present invention is described.

A sample A and a sample B that were used for a measurement each had a structure of sequentially stacking over a Si substrate a silicon oxide layer and an electrode made of aluminum-titanium. For the sample A, the silicon oxide layer is formed by switching the supply gas when the high density plasma treatment of the present invention as described above is performed. The sample B is a comparative example, and the silicon oxide layer is formed by performing the high density plasma treatment with a constant supply gas. Manufacturing methods of Sample A and Sample B are specifically described below.

For the sample A, a Si substrate with a length of 12.7 cm on a side (5 inches) was prepared. By subjecting the Si substrate to a high density plasma treatment, a silicon oxide layer with a film thickness of 8 nm was formed on a surface of the Si substrate. The silicon oxide layer was formed using the high density plasma treatment of the present invention. First, the silicon oxide layer was formed to a film thickness of 6 nm using argon (Ar), oxygen ($O_2$), and hydrogen ($H_2$) for the supply gas, and then supply of $H_2$ was stopped and the supply gas was switched to Ar and $O_2$ so that the silicon oxide layer was ultimately formed to a film thickness of 8 nm. Conditions for film formation of the silicon oxide layer are described below:

To a film thickness of 6 nm; gas flow rate of Ar:$O_2$:$H_2$=900:5:5 (sccm), pressure in the chamber: 106.67 Pa, high-frequency electric power: 3800 W, and film formation temperature (substrate temperature): 400° C.

To a film thickness of 8 nm; gas flow rate of Ar:$O_2$=900:5 (sccm), pressure in the chamber: 106.67 Pa, high-frequency electric power: 3800 W, and film formation temperature (substrate temperature): 400° C.

Next, an aluminum-titanium (Al—Ti) layer which is an alloy of aluminum and titanium was formed with a film thickness of 400 nm over the silicon oxide layer using a sputtering method. The aluminum-titanium layer was selectively etched to form an electrode with an area of $1.96 \times 10^{-3}$ cm$^2$. By the foregoing steps, the sample A was manufactured.

For the sample B, a Si substrate with a length of 12.7 cm on a side (5 inches) was prepared. By subjecting the Si substrate to a high density plasma treatment, a silicon oxide layer with a film thickness of 8 nm was formed on a surface of the Si substrate. The silicon oxide layer was formed using the high density plasma treatment. The silicon oxide layer was formed to a film thickness of 8 nm using argon (Ar), oxygen ($O_2$), and hydrogen ($H_2$) for the supply gas. Conditions for film formation of the silicon oxide layer are described below:

Gas flow rate of Ar:$O_2$:$H_2$=900:5:5 (sccm), pressure in the chamber: 106.67 Pa, high-frequency electric power: 3800 W, and film formation temperature (substrate temperature): 400° C.

Next, an aluminum-titanium (Al—Ti) layer which is an alloy of aluminum and titanium was formed with a film thickness of 400 nm over the silicon oxide layer using a sputtering method. The aluminum-titanium layer was selectively etched to form an electrode with an area of $1.96 \times 10^{-3}$ cm$^2$. By the foregoing steps, the sample B was manufactured.

Figure 18:
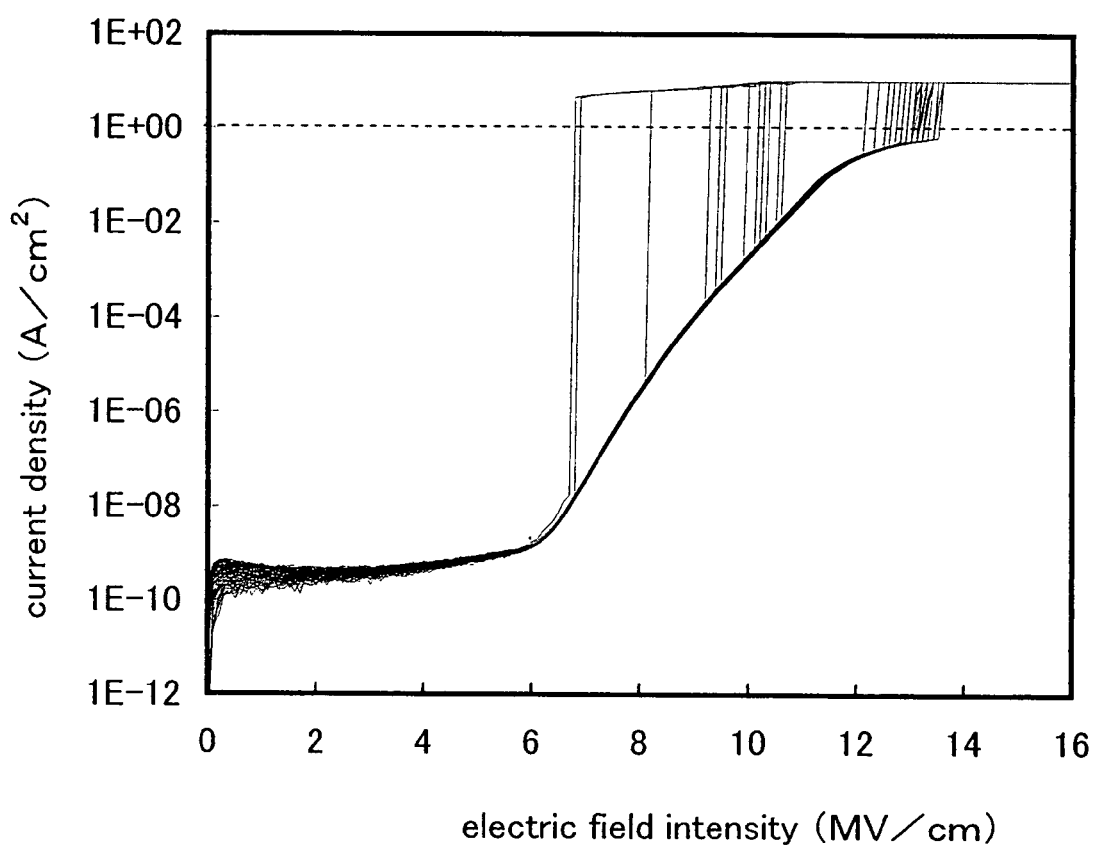
FIG. 18 shows a characteristic of an insulating layer of the present invention.
Figure 19:
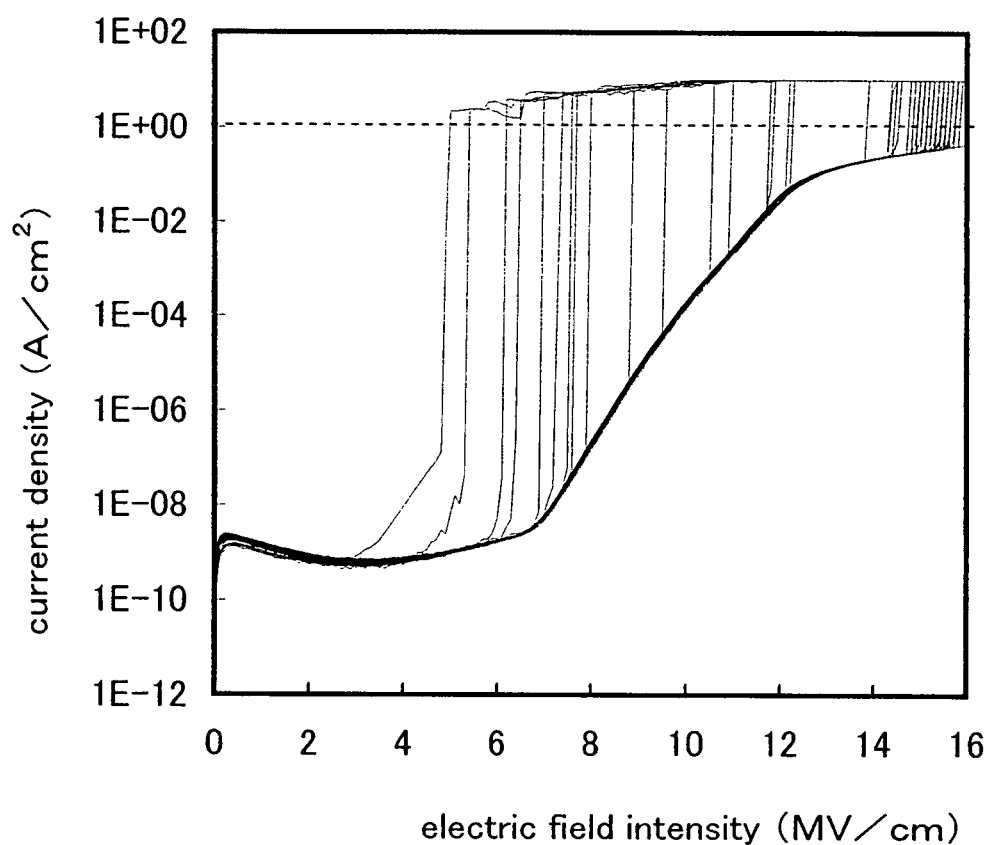
FIG. 19 shows a characteristic of an insulating layer of a comparative example.

Results of measuring current density–electric field intensity (J–E) characteristics of the sample A and sample B are shown in FIGS. 18 and 19, respectively. In each of FIGS. 18 and 19, a horizontal axis represents the electric field intensity (MV/cm) and a vertical axis represents the current density (A/cm$^2$). Also, in each of FIGS. 18 and 19, a scale at a current density of 1 A/cm$^2$ is shown by a dotted line. Note that the measurement was conducted at 112 points on a substrate surface.

In each of FIGS. 18 and 19, a point at which the current density jumps at or over 1 A/cm$^2$ indicates a defect in withstand voltage. As a result, it was found from FIG. 18 that a probability of dielectric breakdown occurring in the sample A at or under a dielectric breakdown electric field of 8 MV/cm was a little less than 3%. Also, from FIG. 19, it was found that a probability of dielectric breakdown occurring in the sample B at or under a dielectric breakdown electric field of 8 MV/cm was about 8%. From the above results, it was found that compared to the sample B, the sample A manufactured using the present invention had less defect in the A mode and the B mode. Accordingly, it was found that the sample A subjected to the high density plasma treatment using the present invention was an insulating layer having withstand voltage with little defect in initial withstand voltage in the A mode and the B mode, compared to the sample B.

This application is based on Japanese Patent Application serial no. 2006-199740 filed in Japan Patent Office on Jul. 21, 2006, the entire contents of which are hereby incorporated by reference.

What is claimed is:

1. A method of manufacturing a semiconductor device comprising the steps of:
    forming a semiconductor layer over a substrate; and
    subjecting the semiconductor layer to a plasma treatment by supplying a first gas containing a rare gas, an oxygen gas, and a hydrogen gas, and supplying a second gas consisting of a rare gas and an oxygen gas,
    wherein the supply of the second gas is performed after the supply of the first gas, and whereby an insulating layer is formed on a surface of the semiconductor layer, and
    wherein a silicon oxide layer is formed as the insulating layer.

2. A method of manufacturing a semiconductor device comprising the step of:
    subjecting a top surface of a semiconductor substrate to a plasma treatment by supplying a first gas containing a rare gas, an oxygen gas, and a hydrogen gas, and supplying a second gas consisting of a rare gas and an oxygen gas,
    wherein the supply of the second gas is performed after the supply of the first gas, and whereby an insulating layer is formed on the top surface of the semiconductor substrate, and
    wherein a silicon oxide layer is formed as the insulating layer.

3. A method of manufacturing a semiconductor device comprising the steps of:
    providing a plurality of grooves in a semiconductor substrate and forming a first insulating layer over the plurality of grooves and the semiconductor substrate;
    grinding the first insulating layer until a top surface of the semiconductor substrate is exposed and forming a second insulating layer for element division; and
    subjecting the top surface of the semiconductor substrate to a plasma treatment by supplying a first gas containing a rare gas, an oxygen gas, and a hydrogen gas, and supplying a second gas consisting of a rare gas and an oxygen gas,
    wherein the supply of the second gas is performed after the supply of the first gas, and whereby a third insulating layer is formed on the top surface of the semiconductor substrate, and
    wherein a silicon oxide layer is formed as the third insulating layer.

4. The method of manufacturing a semiconductor device according to claim 1, wherein the plasma treatment is performed using plasma that is excited by a high frequency wave and which has an electron density of more than or equal to $1 \times 10^{11}$ cm$^{-3}$ and an electron temperature of lower than or equal to 1.5 eV.

5. The method of manufacturing a semiconductor device according to claim 2, wherein the plasma treatment is performed using plasma that is excited by a high frequency wave and which has an electron density of more than or equal to $1 \times 10^{11}$ cm$^{-3}$ and an electron temperature of lower than or equal to 1.5 eV.

6. The method of manufacturing a semiconductor device according to claim 3, wherein the plasma treatment is performed using plasma that is excited by a high frequency wave and which has an electron density of more than or equal to $1 \times 10^{11}$ cm$^{-3}$ and an electron temperature of lower than or equal to 1.5 eV.

7. The method of manufacturing a semiconductor device according to claim 1, wherein when the supply of the first gas is switched to the supply of the second gas the plasma treatment is continuously performed without exposure to the atmosphere.

8. The method of manufacturing a semiconductor device according to claim 2, wherein when the supply of the first gas is switched to the supply of the second gas the plasma treatment is continuously performed without exposure to the atmosphere.

9. The method of manufacturing a semiconductor device according to claim 3, wherein when the supply of the first gas is switched to the supply of the second gas the plasma treatment is continuously performed without exposure to the atmosphere.

10. A method of manufacturing a nonvolatile semiconductor storage device comprising the steps of:
    forming a semiconductor layer over a substrate;
    subjecting the semiconductor layer to a plasma treatment by supplying a first gas containing a rare gas, an oxygen gas, and a hydrogen gas, and supplying a second gas consisting of a rare gas and an oxygen gas, wherein the supply of the second gas is performed after the supply of the first gas, and whereby a first insulating layer is formed on a surface of the semiconductor layer;
    forming a first gate electrode over the semiconductor layer with the first insulating layer therebetween;
    forming a second insulating layer over the first gate electrode;
    forming a second gate electrode over the first gate electrode with the second insulating layer therebetween; and
    forming an impurity region in the semiconductor layer by adding an impurity element using the second gate electrode as a mask,
    wherein a silicon oxide layer is formed as the first insulating layer.

11. A method of manufacturing a nonvolatile semiconductor storage device comprising the steps of:
    subjecting a top surface of a semiconductor substrate to a plasma treatment by supplying a first gas containing a rare gas, an oxygen gas, and a hydrogen gas, and supplying a second gas consisting of a rare gas and an oxygen gas, wherein the supply of the second gas is performed after the supply of the first gas, and whereby a first insulating layer is formed on the top surface of the semiconductor substrate;
    forming a first gate electrode over the semiconductor substrate with the first insulating layer therebetween;
    forming a second insulating layer over the first gate electrode;
    forming a second gate electrode over the first gate electrode with the second insulating layer therebetween; and
    forming an impurity region in the semiconductor substrate by adding an impurity element using the second gate electrode as a mask,
    wherein a silicon oxide layer is formed as the first insulating layer.

12. A method of manufacturing a nonvolatile semiconductor storage device comprising the steps of:
    providing a plurality of grooves in a semiconductor substrate and forming a first insulating layer in the plurality of grooves and over the semiconductor substrate;
    grinding the first insulating layer until a top surface of the semiconductor substrate is exposed and forming a second insulating layer for element division;
    subjecting the top surface of the semiconductor substrate to a plasma treatment by supplying a first gas containing a rare gas, an oxygen gas, and a hydrogen gas, and supplying a second gas consisting of a rare gas and an oxygen gas, wherein the supply of the second gas is performed after the supply of the first gas, and whereby a third insulating layer is formed on the top surface of the semiconductor substrate;

forming a first gate electrode over the semiconductor substrate with the third insulating layer therebetween;

forming a fourth insulating layer over the first gate electrode;

forming a second gate electrode over the first gate electrode with the fourth insulating layer therebetween; and forming an impurity region in the semiconductor substrate by adding an impurity element using the second gate electrode as a mask, wherein a silicon oxide layer is formed as the third insulating layer.

13. The method of manufacturing a nonvolatile semiconductor storage device according to claim 10, wherein the plasma treatment is performed using plasma that is excited by a high frequency wave and which has an electron density of more than or equal to $1 \times 10^{11}$ cm$^{-3}$ and an electron temperature of lower than or equal to 1.5 eV.

14. The method of manufacturing a nonvolatile semiconductor storage device according to claim 11, wherein the plasma treatment is performed using plasma that is excited by a high frequency wave and which has an electron density of more than or equal to $1 \times 10^{11}$ cm$^{-3}$ and an electron temperature of lower than or equal to 1.5 eV.

15. The method of manufacturing a nonvolatile semiconductor storage device according to claim 12, wherein the plasma treatment is performed using plasma that is excited by a high frequency wave and which has an electron density of more than or equal to $1 \times 10^{11}$ cm$^{-3}$ and an electron temperature of lower than or equal to 1.5 eV.

16. The method of manufacturing a nonvolatile semiconductor storage device according to claim 10, wherein when the supply of the first gas is switched to the supply of the second gas the plasma treatment is continuously performed without exposure to the atmosphere.

17. The method of manufacturing a nonvolatile semiconductor storage device according to claim 11, wherein when the supply of the first gas is switched to the supply of the second gas the plasma treatment is continuously performed without exposure to the atmosphere.

18. The method of manufacturing a nonvolatile semiconductor storage device according to claim 12, wherein when the supply of the first gas is switched to the supply of the second gas the plasma treatment is continuously performed without exposure to the atmosphere.

19. The method of manufacturing a nonvolatile semiconductor storage device according to claim 10, wherein the first gate electrode serves as a floating gate electrode and the second gate electrode serves as a control gate electrode.

20. The method of manufacturing a nonvolatile semiconductor storage device according to claim 11, wherein the first gate electrode serves as a floating gate electrode and the second gate electrode serves as a control gate electrode.

21. The method of manufacturing a nonvolatile semiconductor storage device according to claim 12, wherein the first gate electrode serves as a floating gate electrode and the second gate electrode serves as a control gate electrode.

22. A method of manufacturing a semiconductor device comprising the steps of:

forming a semiconductor layer over a substrate; and subjecting a plasma treatment to the semiconductor layer by supplying a first gas containing a rare gas, a hydrogen gas, and an oxygen gas and supplying a second gas containing a rare gas, a hydrogen gas, and an oxygen gas, wherein the supply of the second gas is performed after the supply of the first gas, wherein an amount of the hydrogen gas of the second gas is less than an amount of the hydrogen gas of the first gas, whereby an insulating layer is formed on a surface of the semiconductor layer, and wherein a silicon oxide layer is formed as the insulating layer.

23. A method of manufacturing a semiconductor device comprising the step of:

subjecting a top surface of a semiconductor substrate to a plasma treatment by supplying a first gas containing a rare gas, a hydrogen gas, and an oxygen gas, and supplying a second gas containing of a rare gas, a hydrogen gas, and an oxygen gas, wherein the supply of the second gas is performed after the supply of the first gas, wherein an amount of the hydrogen gas of the second gas is less than an amount of the hydrogen gas of the first gas, and whereby an insulating layer is formed on the top surface of the semiconductor substrate, and wherein a silicon oxide layer is formed as the insulating layer.

24. A method of manufacturing a semiconductor device comprising the steps of:

providing a plurality of grooves in a semiconductor substrate and forming a first insulating layer over the plurality of grooves and the semiconductor substrate;

grinding the first insulating layer until a top surface of the semiconductor substrate is exposed and forming a second insulating layer for element division; and subjecting the top surface of the semiconductor substrate to a plasma treatment by supplying a first gas containing a rare gas, a hydrogen gas, and an oxygen gas, and supplying a second gas containing a rare gas, a hydrogen gas, and an oxygen gas, wherein the supply of the second gas is performed after the supply of the first gas, wherein an amount of the hydrogen gas of the second gas is less than an amount of the hydrogen gas of the first gas, whereby a third insulating layer is formed on the top surface of the semiconductor substrate, and wherein a silicon oxide layer is formed as the third insulating layer.

25. The method of manufacturing a semiconductor device according to claim 1, wherein the semiconductor layer mainly contains silicon.

26. The method of manufacturing a semiconductor device according to claim 2, wherein the semiconductor substrate mainly contains silicon.

27. The method of manufacturing a semiconductor device according to claim 3, wherein the semiconductor substrate mainly contains silicon.

28. The method of manufacturing a nonvolatile semiconductor storage device according to claim 10, wherein the semiconductor layer mainly contains silicon.

29. The method of manufacturing a nonvolatile semiconductor storage device according to claim 11, wherein the semiconductor substrate mainly contains silicon.

30. The method of manufacturing a nonvolatile semiconductor storage device according to claim 12, wherein the semiconductor substrate mainly contains silicon.

* * * * *